US012614005B2

(12) United States Patent
Everard et al.

(10) Patent No.: US 12,614,005 B2
(45) Date of Patent: Apr. 28, 2026

(54) SYSTEM AND METHOD FOR BUILDING A GRAPHICAL DEPICTION OF AN ACCESSIBILITY SYSTEM

(71) Applicant: Homecare Products Inc., Auburn, WA (US)

(72) Inventors: Colby Everard, Gallatin, TN (US); Michael Damien Quandt, Waikoloa, HI (US)

(73) Assignee: Homecare Products Inc., Auburn, WA (US)

( * ) Notice: Subject to any disclaimer, the term of this patent is extended or adjusted under 35 U.S.C. 154(b) by 1056 days.

(21) Appl. No.: 17/495,684

(22) Filed: Oct. 6, 2021

(65) Prior Publication Data

US 2023/0108787 A1 Apr. 6, 2023

(51) Int. Cl.
*G06F 30/13* (2020.01)
*G06F 30/27* (2020.01)

(52) U.S. Cl.
CPC .............. *G06F 30/13* (2020.01); *G06F 30/27* (2020.01)

(58) Field of Classification Search
CPC .......... G06F 30/00; G06F 30/13; G06F 30/27; G06F 30/12; G06F 30/10; G06F 2111/16

USPC .............................................. 703/1
See application file for complete search history.

(56) References Cited

U.S. PATENT DOCUMENTS

| | | | | |
|---|---|---|---|---|
| 5,341,533 | A | * 8/1994 | Seitz ..................... | E01C 11/222 |
| | | | | 254/88 |
| 2019/0383022 | A1* | 12/2019 | Winter .................. | E04F 19/061 |
| 2021/0220197 | A1* | 7/2021 | McFarland, Jr. .... | G05D 1/0248 |

OTHER PUBLICATIONS

Brisco, Leigha R. "Designing and Evaluating Playground Equipment for Compliance with the Americans with Disabilities Act", Apr. 2014, Honors Theses, University of Dayton. (Year: 2014).*

* cited by examiner

*Primary Examiner* — Cedric Johnson
(74) *Attorney, Agent, or Firm* — Polsinelli PC

(57) ABSTRACT

A method for building a graphical depiction of an accessibility system includes receiving an input to build a run having a desired ratio of an accessibility system; receiving a selection of one or more components of the accessibility system; and generating feedback data indicating whether the one or more components of the accessibility system create the run having the desired ratio. The method may be performed by one or more processors configured to interact with non-transitory memory configured to perform operations of the method.

18 Claims, 64 Drawing Sheets

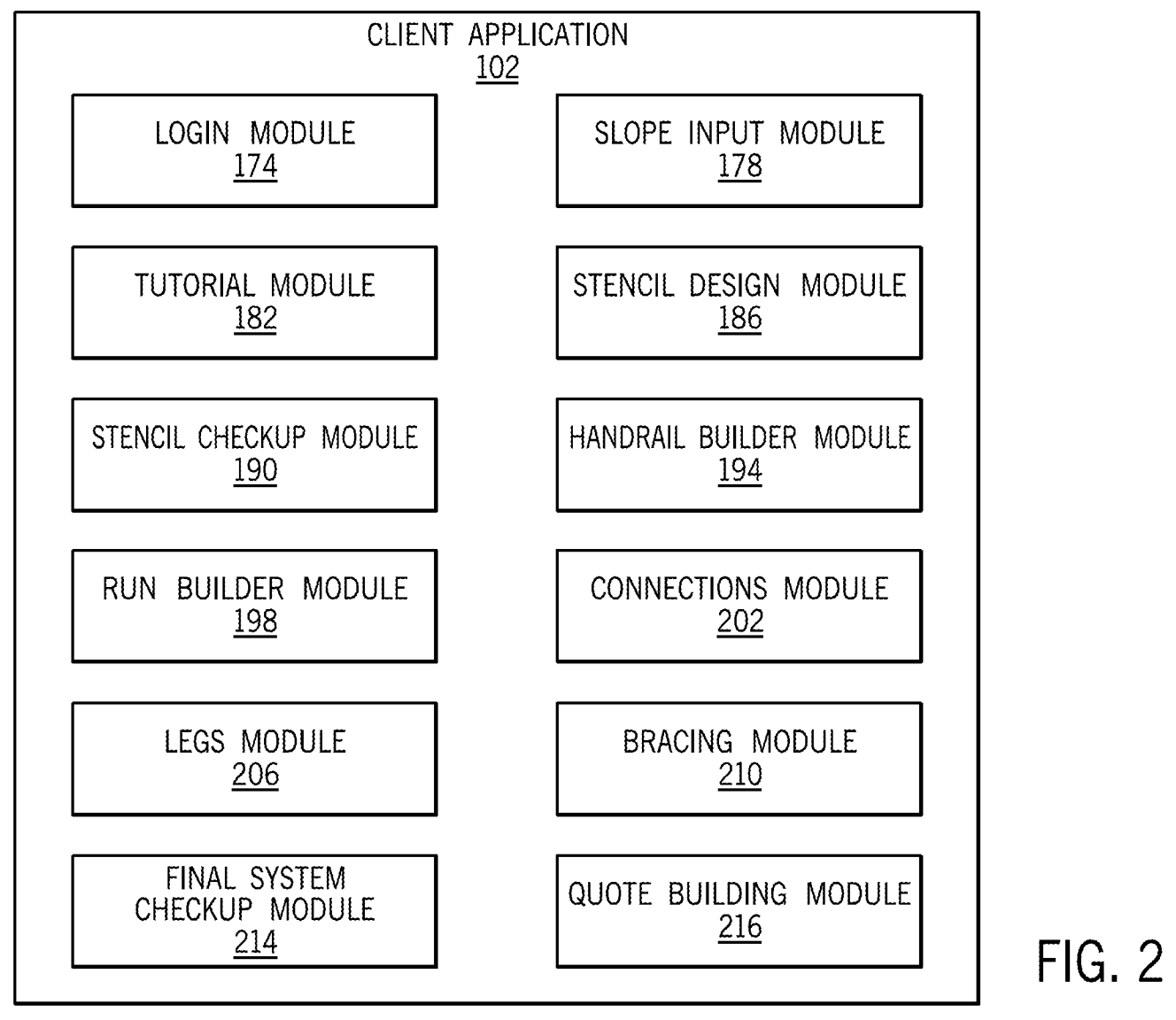

CLIENT APPLICATION
102

LOGIN MODULE
174

SLOPE INPUT MODULE
178

TUTORIAL MODULE
182

STENCIL DESIGN MODULE
186

STENCIL CHECKUP MODULE
190

HANDRAIL BUILDER MODULE
194

RUN BUILDER MODULE
198

CONNECTIONS MODULE
202

LEGS MODULE
206

BRACING MODULE
210

FINAL SYSTEM CHECKUP MODULE
214

QUOTE BUILDING MODULE
216

FIG. 2

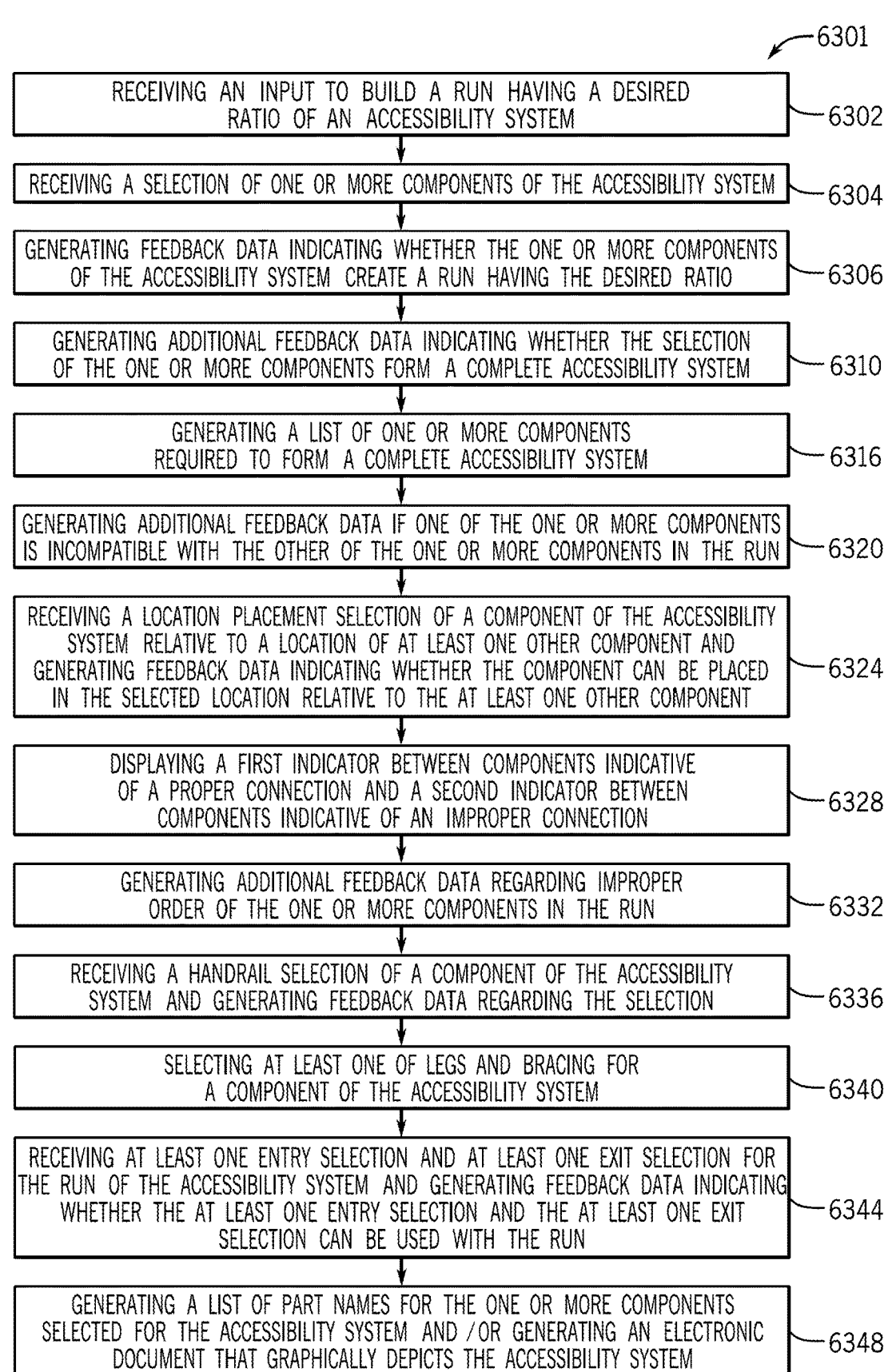

6301

RECEIVING AN INPUT TO BUILD A RUN HAVING A DESIRED
RATIO OF AN ACCESSIBILITY SYSTEM —6302

RECEIVING A SELECTION OF ONE OR MORE COMPONENTS OF THE ACCESSIBILITY SYSTEM —6304

GENERATING FEEDBACK DATA INDICATING WHETHER THE ONE OR MORE COMPONENTS
OF THE ACCESSIBILITY SYSTEM CREATE A RUN HAVING THE DESIRED RATIO —6306

GENERATING ADDITIONAL FEEDBACK DATA INDICATING WHETHER THE SELECTION
OF THE ONE OR MORE COMPONENTS FORM A COMPLETE ACCESSIBILITY SYSTEM —6310

GENERATING A LIST OF ONE OR MORE COMPONENTS
REQUIRED TO FORM A COMPLETE ACCESSIBILITY SYSTEM —6316

GENERATING ADDITIONAL FEEDBACK DATA IF ONE OF THE ONE OR MORE COMPONENTS
IS INCOMPATIBLE WITH THE OTHER OF THE ONE OR MORE COMPONENTS IN THE RUN —6320

RECEIVING A LOCATION PLACEMENT SELECTION OF A COMPONENT OF THE ACCESSIBILITY
SYSTEM RELATIVE TO A LOCATION OF AT LEAST ONE OTHER COMPONENT AND
GENERATING FEEDBACK DATA INDICATING WHETHER THE COMPONENT CAN BE PLACED
IN THE SELECTED LOCATION RELATIVE TO THE AT LEAST ONE OTHER COMPONENT —6324

DISPLAYING A FIRST INDICATOR BETWEEN COMPONENTS INDICATIVE
OF A PROPER CONNECTION AND A SECOND INDICATOR BETWEEN
COMPONENTS INDICATIVE OF AN IMPROPER CONNECTION —6328

GENERATING ADDITIONAL FEEDBACK DATA REGARDING IMPROPER
ORDER OF THE ONE OR MORE COMPONENTS IN THE RUN —6332

RECEIVING A HANDRAIL SELECTION OF A COMPONENT OF THE ACCESSIBILITY
SYSTEM AND GENERATING FEEDBACK DATA REGARDING THE SELECTION —6336

SELECTING AT LEAST ONE OF LEGS AND BRACING FOR
A COMPONENT OF THE ACCESSIBILITY SYSTEM —6340

RECEIVING AT LEAST ONE ENTRY SELECTION AND AT LEAST ONE EXIT SELECTION FOR
THE RUN OF THE ACCESSIBILITY SYSTEM AND GENERATING FEEDBACK DATA INDICATING
WHETHER THE AT LEAST ONE ENTRY SELECTION AND THE AT LEAST ONE EXIT
SELECTION CAN BE USED WITH THE RUN —6344

GENERATING A LIST OF PART NAMES FOR THE ONE OR MORE COMPONENTS
SELECTED FOR THE ACCESSIBILITY SYSTEM AND/OR GENERATING AN ELECTRONIC
DOCUMENT THAT GRAPHICALLY DEPICTS THE ACCESSIBILITY SYSTEM —6348

FIG. 63

SYSTEM AND METHOD FOR BUILDING A GRAPHICAL DEPICTION OF AN ACCESSIBILITY SYSTEM

DESCRIPTION OF THE RELATED TECHNOLOGY

Wheelchair ramps are often used to allow wheelchair access to elevated structures that would otherwise require steps, stairs, an elevator, or a lift to access. Examples of such structures include decks, platforms, houses, modular buildings, trailer-style buildings, or any other elevated structure. Most of these structures are raised from ground level such that there is a first "lower" or "ground access" level and a second "upper" or "destination" level, with the levels being of different elevations such that steps or a ramp are needed to advance from the first level to the second level.

In public places in the United States, a wheelchair ramp must meet American with Disability Act (ADA) standards. For instance, the ramp must have a certain rise or vertical dimension compared to the run or horizontal dimension of the ramp (the "rise-over-run ratio"). According to ADA requirements, if the slope of a ramp is between 1:12 and 1:16, the maximum rise shall be 30 inches (760 mm) and the maximum horizontal run shall be 30 feet (9 m). Ramps in other countries may have other required rise-over-run ratios. For instance, the ramp must have a slope of 1:8 to meet International Residential Code (IRC) requirements. Moreover, residential ramps may need to meet other rise-over-run ratios, for instance, depending on the intended use of the resident or the physical constraints of the location.

Components of a ramp run typically include a level landing (the second surface) at the top of the ramp, the surface of the ramp, and a level landing (the first surface) at the bottom of the ramp, among other components. When assembled, the components of the ramp run must typically meet the necessary or desired rise-over-run ratio, among other requirements.

Aspects of the present disclosure are directed to improved systems and methods for building a graphical depiction of an accessibility system, such as a wheelchair ramp.

SUMMARY

Disclosed are systems, apparatuses, methods, computer readable medium, and circuits for processing instructions to build an accessibility system. According to at least one example, a method includes: receiving an input to build a run having a desired ratio of an accessibility system; receiving a selection of one or more components of the accessibility system; and generating feedback data indicating whether the one or more components of the accessibility system create the run having the desired ratio. For example, the computing device receives an input to build a run having a desired ratio of the accessibility system; receives a selection of one or more components of an accessibility system; and generates feedback data indicating whether the one or more components of the accessibility system create the run having the desired ratio.

In another example, a computing device for processing instructions to build an accessibility system is provided that includes a storage (e.g., a memory configured to store data, such as virtual content data, one or more images, etc.) and one or more processors (e.g., implemented in circuitry) coupled to the memory and configured to execute instructions and, in conjunction with various components (e.g., a network interface, a display, an output device, etc.), cause the computing device to: receive an input to build a run having a desired ratio of an accessibility system; receive a selection of one or more components of the accessibility system; and generate feedback data indicating whether the one or more components of the accessibility system create the run having the desired ratio.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 2 shows a block diagram of an exemplary client application for use with the systems and methods described herein.

FIG. 63 is a flowchart of a method for building a graphical depiction of an accessibility system with a client application, according to an example of the instant disclosure.

DETAILED DESCRIPTION

The present disclosure provides exemplary embodiments of a system and method for building a graphical depiction of an accessibility system, such as a wheelchair ramp. For instance, the systems and methods described herein may be used to create a computer-aided drawing (CAD) and/or model of a layout of an accessibility system, which may graphically display all the components necessary to quote and build a complete accessibility system. In that regard, the system and method for building a graphical depiction of an accessibility system may include a software platform on a computing device that allows a user to select components for the desired accessibility system and generate feedback data regarding whether the selected components can be used to effectively and/or safely build the desired accessibility system.

Although exemplary embodiments of a system and method for building a graphical depiction of an accessibility system will be hereinafter described with reference to building a wheelchair ramp or similar, it should be appreciated that the systems and methods described herein may be adapted for use with other types of applications, such as building stage setups, transport systems, etc.

Figure 1:
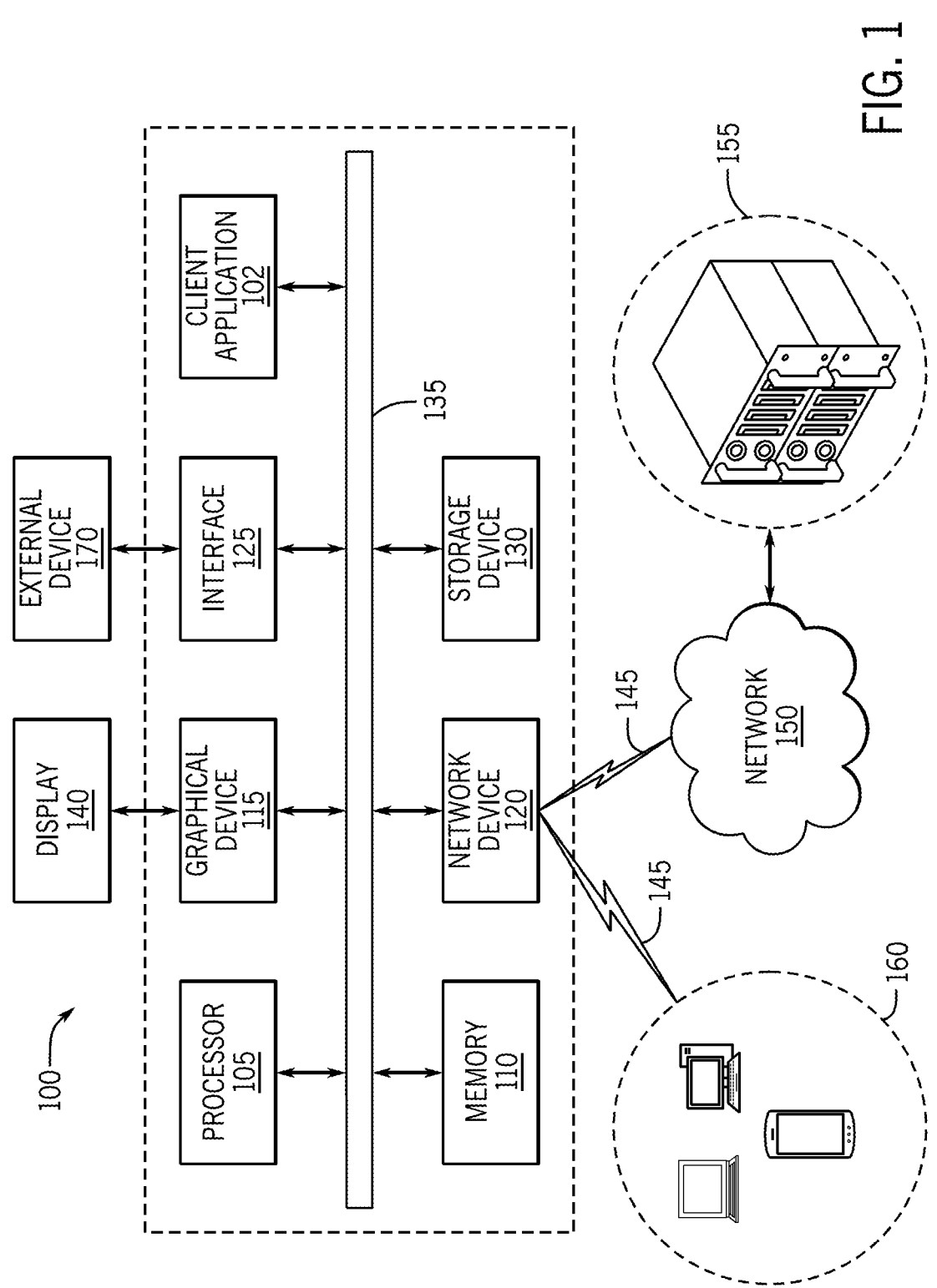
FIG. 1 illustrates a block diagram of an example computer system for executing a client application according to an example of the instant disclosure.

FIG. 1 illustrates an example computer system 100 for implementing a part of a system and method of the instant disclosure. For example, the example computer system 100 may execute a client application 102 configured for building a graphical depiction of an accessibility system.

The example computer system 100 includes a processor 105, a memory 110, a graphical device 115, a network device 120, an interface 125, and a storage device 130 that are connected to operate via a bus 135. The processor 105 causes machine instructions (e.g., reduced instruction set (RISC), complex instruction set (CISC), etc.) that are loaded into the memory 110 via a bootstrapping process and executes an operating system (OS) for executing application within frameworks provided by the OS. For example, the processor 105 may execute the client application 102 provided by a graphical framework such as Winforms, Windows Presentation Foundation (WPF), Windows User Interface (WinUI), or a cross platform user interface such as Xamarin or QT. In other examples, the processor 105 may execute an application that is written for a sandbox environment such as a web browser.

The processor 105 controls the memory 110 to store instructions, user data, OS content, and other content that cannot be stored within the processor 105 internally (e.g., within the various caches). The processor 105 may also control a graphical device 115 (e.g., a graphical processor) that outputs graphical content to a display 140. In some example, the graphical device 115 may be integral within the processor 105. In yet another example, the display 140 may be integral with the computer system 100 (e.g., a laptop, a tablet, a phone, etc.).

The graphical device 115 may be optimized to perform floating point operations such as graphical computations, and it may be configured to execute other operations in place of the processor 105. For example, it may be controlled by instructions to perform mathematical operations optimized for floating point math. For example, the processor 105 may allocate instructions to the graphical device 115 for operations that are optimized for the graphical device 115. For instance, the graphical device 115 may execute operations related to artificial intelligence (AI), natural language processing (NLP), vector math, etc. The results may be returned to the processor 105. In another example, the application executing in the processor 105 may provide instructions to cause the processor 105 to request the graphical device 115 to perform the operations. In other examples, the graphical device 115 may return the processing results to another computer system (i.e., distributed computing).

The processor 105 may also control a network device 120 that transmits and receives data using a plurality of wireless channels 145 and at least one communication standard (e.g., Wi-Fi (i.e., 802.11ax, 802.11e, etc.), Bluetooth®, various standards provided by the 3rd Generation Partnership Project (e.g., 3G, 4G, 5G), or a satellite communication network (e.g., Starlink). The network device 120 may wirelessly connect to a network 150 to connect to servers 155 or other service providers. The network device 120 may also be connected to the network 150 via a physical (i.e., circuit) connection. The network device 120 may also directly connect to local electronic device 160 using a point-to-point (P2P) or a short-range radio connection.

The processor 105 may also control an interface 125 that connects with an external device 170 for bidirectional or unidirectional communication. The interface 125 is any suitable interface that forms a circuit connection and can be implemented by any suitable interface (e.g., universal serial bus (USB), Thunderbolt, and so forth). The external device 170 can receive data from the interface 125 to process the data or perform functions for different applications executing in the processor 105. For example, the external device 170 may be another display device, a computer interface device (e.g., a keyboard, a mouse, etc.), an audio device (e.g., an analog-to-digital converter (ADC), a digital-to-analog converter (DAC)), a storage device for storing content, an authentication device, an external network interface (e.g., a 5G hotspot), a printer, and so forth.

As noted above, the example computer system 100 may execute a client application 102 configured for building a graphical depiction of an accessibility system. The client application 102 may be accessed by a user of the computer system 100 or by a user of another computing device in communication with the computer system 100 over the network 150. In that regard, the client application 102 of the example computer system 100 may be a Web-based platform (for example, a cloud platform) capable of being accessed over the network 150. In other example embodiments, a remote plug-in that uses cloud-based APIs (Application Program Interfaces) may be utilized to connect and extract the information from the example computer system 100. The client application 102 may be individualized to a specific group of users, such as accessibility system dealers. Moreover, reference to the "computer system 100" may instead or additionally include any other computing device in communication with the network 150.

Although the client application 102 is herein described as a single client application, it should be appreciated that in some instances the functionality of the client application 102 may be carried out across multiple platforms, such as multiple Web-based platforms. Accordingly, the description and illustrations provided herein should not be seen as limiting.

In general, the client application 102 may receive inputs from a user regarding a selection of components for a desired accessibility system. Upon processing those inputs, the client application 102 graphically depicts the components in a 2-D computer aided drawing, a 3-D model, etc. Moreover, the client application 102 may generate feedback data regarding whether the selected components can be used to effectively and/or safely build the desired accessibility system. After building a graphical depiction of the accessibility system, the client application 102 may generate an electronic document or file used to facilitate a quote building process for the accessibility system that can be used by a dealer, distributor, manufacturer, customer, etc. (the "user"), to quote a cost, parts, etc., for the desired accessibility system. Further, the electronic document or file may be used to facilitate building of the accessibility system (e.g., it may act as a blueprint, design plan, technical drawing, etc. for assembly and installation).

FIG. 2 shows an exemplary block diagram of the client application 102 for use with the systems and methods described herein. The client application 102 may include various modules configured to facilitate building a graphical depiction of the accessibility system. The various modules of the client application 102 will be described with reference to exemplary screen shots shown in FIGS. 3-54. For ease of reference and simplicity, similar images, windows, etc., in each of the screen shots are labeled with similar reference numerals except in the '100 or '1000 series corresponding to the screen shot reference numeral used for that FIG. As such, some reference numerals will not be specifically discussed in this description.

In a first aspect, the client application 102 may include a login module 174 configured to facilitate secure login and access to the client application 102. The login module 174 may facilitate login and access into the client application 102 in any suitable manner now know or later developed.

Once the client application 102 is accessed by the user through, for example, the login module 174, the client application 102 may run a slope input module 178 configured to enable selection of a desired slope or rise-over-run ratio for the accessibility system (hereinafter simply "slope" or "ratio"). As described above, a ramp slope of an accessibility system must often meet certain slope requirements for commercial or residential use. For instance, the ADA recommends a 1:12 slope for a commercial ramp system, which means that for every 1 inch of vertical rise, at least 1 foot (12 inches) of ramp length (5 degrees of incline) is required. The IRC may have other required slope requirements. In residential applications, the residential user may have yet other accessibility system slope needs. Using the slope input module 178, the user may select the desired slope for the accessibility system, either from, for instance, a dropdown menu with different options (e.g., ADA (1:12) or IRC (1:8), etc.). In addition or in the alternative, the user may input a custom slope for the system through, for instance, a text box.

Figure 3:
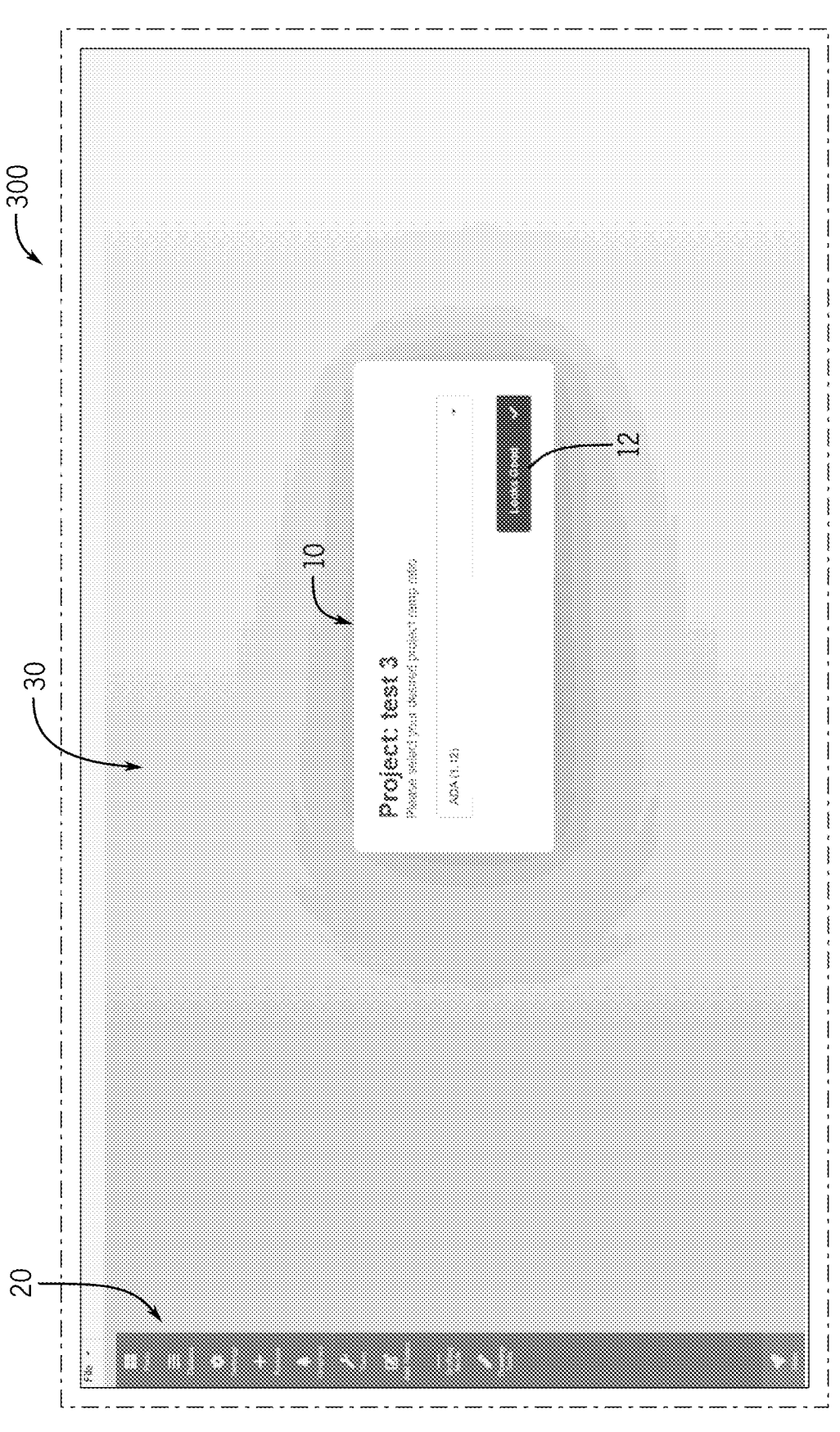
FIGS. 3-62 show screen shots of exemplary GUI displays of an exemplary client application for use with the systems and methods described herein.

For instance, FIG. 3 illustrates a screen shot 300 of an exemplary GUI display showing a dropdown menu 10 located inside a main container window 30. The dropdown menu 10 may provide a user with the ability to select a slope for the accessibility system. More specifically, the user can click on the dropdown menu 10 to select a desired slope for the accessibility system. Once a slope is selected, the user can click on a "Looks Good" button 12 (or similar) to proceed with building the accessibility system.

Figure 4:
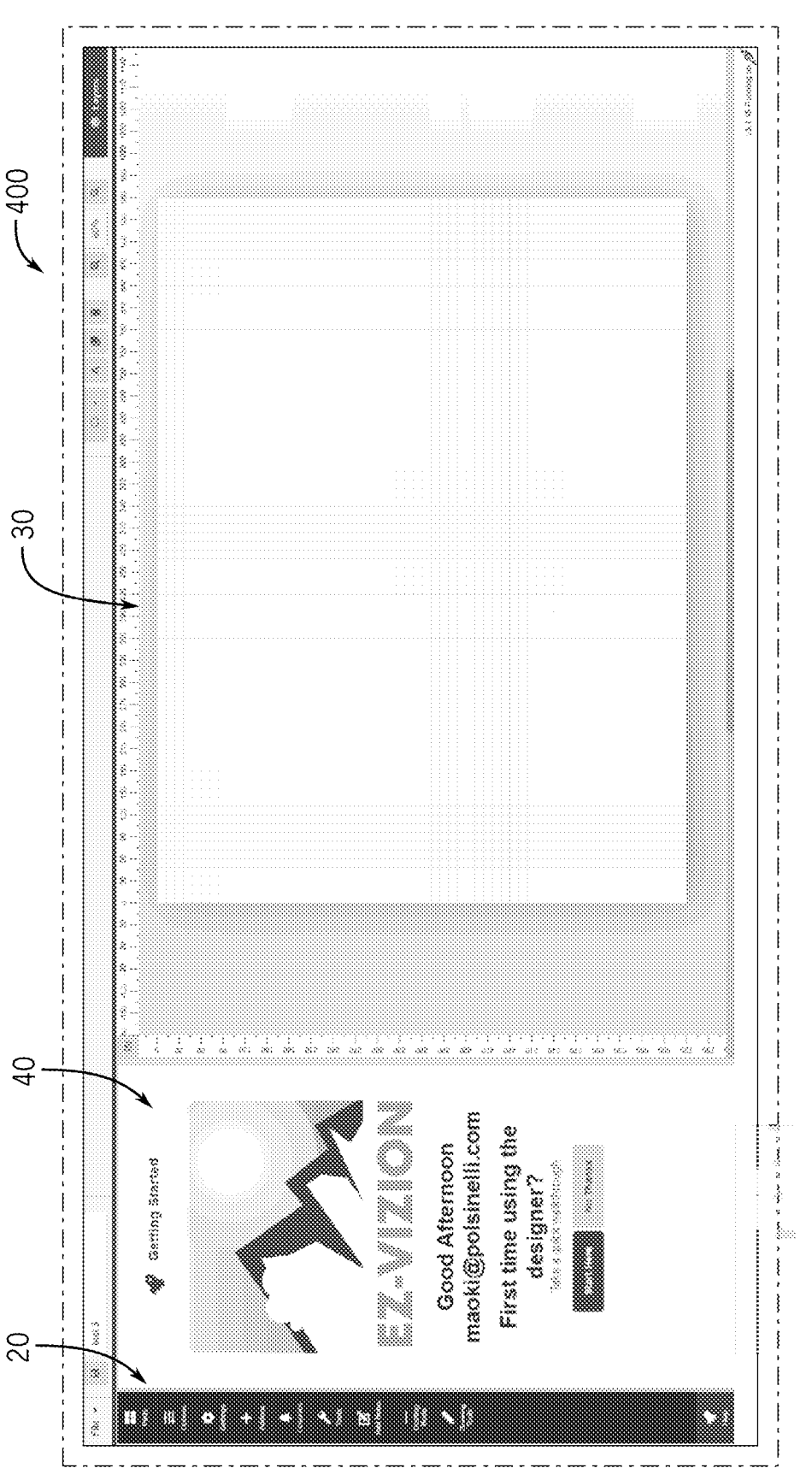

After selecting a desired slope, the user may begin using the client application 102 to build a graphical depiction of an accessibility system, or the user may instead first access a tutorial through a tutorial module 182. In the exemplary screen shot 400 of FIG. 4, a welcome screen is presented inside a second side container window 40 positioned vertically alongside the main container window 30. The welcome screen provides the user with the option to begin with a tutorial or to instead start using the application.

If the tutorial is chosen, the tutorial may display various exemplary screen shots (not shown) that may act to guide the user through the process of graphically building an accessibility system. For instance, the tutorial module 182 may display some or all of the screen shots shown in FIGS. 5-54 as exemplary steps for building an accessibility system, sample errors that may be encountered during the building process, etc. In that regard, the tutorial module 182 may allow a user to step through the various screen shots by clicking on a "Next" button or similar to proceed to the next exemplary screen shot.

After completing some or all of the tutorial and/or skipping the tutorial, a stencil design module 186 may be accessed by the client application 102 to build a graphical depiction of an accessibility system. In general, the stencil design module 186 may be used to select various parts from a list of available parts and/or to create a custom part using, for instance, various input parameters. The selected parts are overlaid onto a graphical canvas or background image that can be used to organize and display the accessibility system graphically built by the user.

Figure 5:
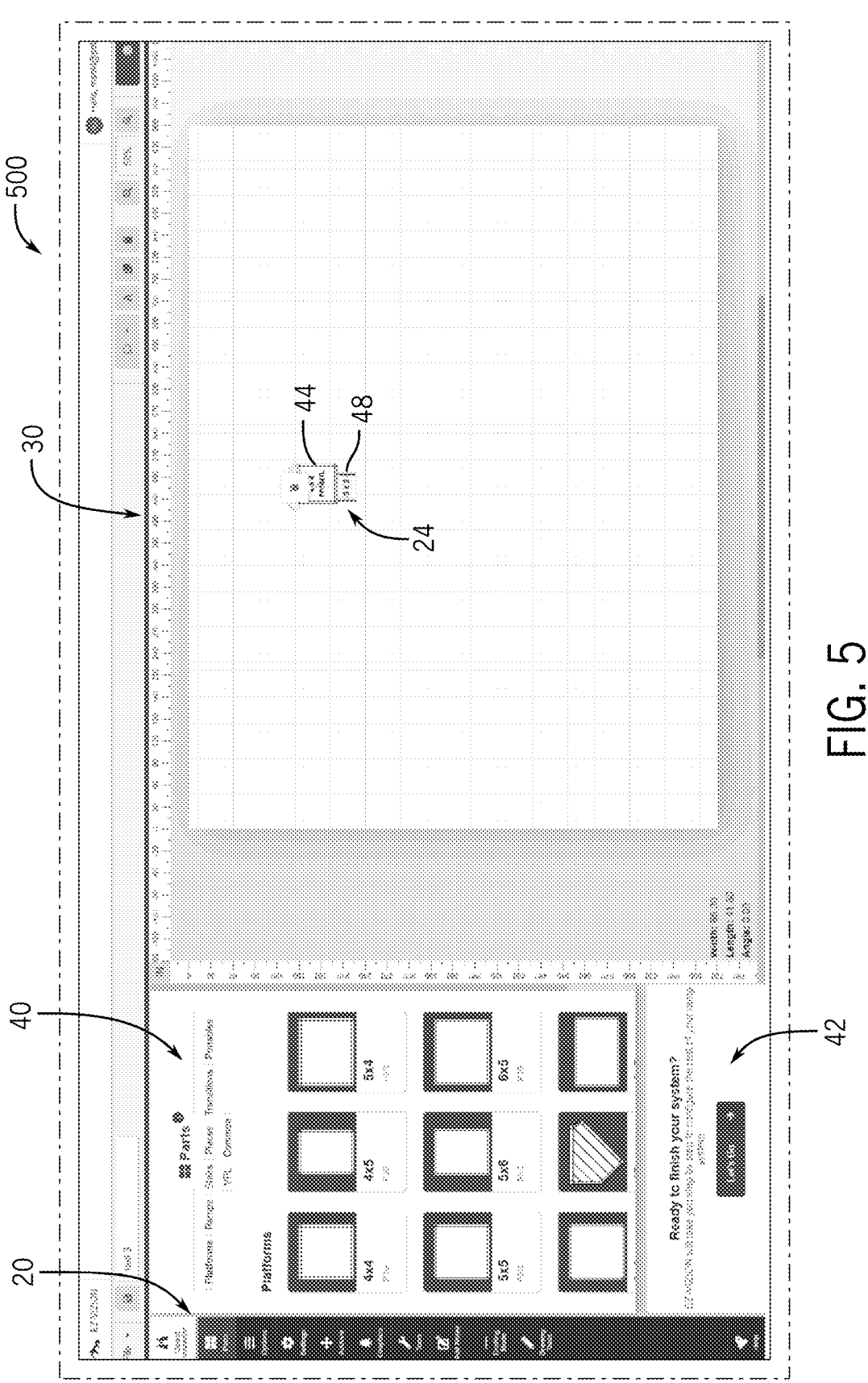

For instance, FIG. 5 illustrates a screen shot 500 of an exemplary GUI display showing a main menu for accessing different tools to graphically build the accessibility system, wherein the main menu is displayed inside a first side container window 20 positioned vertically alongside the second side container window 40. A canvas (not separately labeled) is displayed inside the main container window 30. The canvas may include grid lines and measurement tools extending alongside one or more of the edges.

In the first side container window 20, the user can select a high-level menu option for creating/editing aspects of the graphically depicted accessibility system. For instance, in the first side container window 20, the user can toggle through various main menu items of the stencil design module 186, such as "Object Inspector", "Part Category", "Options", "Settings", "Addons", "Graphics", "Tools", "Add Notes", "Drafting Mode", and "Drawing Tools". It should be appreciated that any other list of actions/functions may instead be provided. Upon selecting (e.g., clicking on) a specific menu item, the images/links in the second side container window 40 update to correspond to the menu item chosen.

In the exemplary screenshot 500 depicted in FIG. 5, the menu item "Parts" has been selected, and various accessibility system part categories are displayed at the top of the second side container window 40. The part categories displayed at the top of the second side container window 40 may include any list of categories, such as "Platforms", "Ramps", "Stairs", "Pieces", "Transitions", "Portables", "VPL" (vertical platform lift), or "Common Parts" (e.g., parts most typically chosen). In the exemplary screenshot 500 shown, the part categories are displayed along a top of the second side container window 40, and upon selecting (e.g., clicking on) a specific part category, a list/image of corresponding parts is displayed beneath the categories.

For instance, as shown in FIG. 5, the category "Platforms" has been selected, and various platform part images are displayed in the second side container window 40. To select a platform part, the user may either click on the part image to cause it to be displayed on the canvas, drag and drop the part image over onto on the canvas, or use some other input command.

In the exemplary screenshot 500 shown, a 4×4 platform 44 has been selected for display on the canvas. In addition, a 3×2 ramp 48 has been selected for display (after selecting the category "Ramps" in the second side container window 40). In the exemplary screenshot 600 shown in FIG. 6, a 15 inch stair part 52 has been selected for display (after selecting the category "stairs" in the first side container window 20) in addition to the 4×4 platform 44 and 3×2 ramp 48. The parts, when laid out together on the canvas, define a system layout or stencil design 24 (FIG. 5) or 24 (FIG. 6).

The selected parts displayed on the canvas can be moved into any desired location on the canvas, for instance, to appropriately position each part next to other parts. The selected parts can also be rotated, deleted, copied, etc., using standard graphical editing tools and functions well known in the art.

Once all the parts have been selected and moved into the appropriate position, a user may proceed to finalize the graphical depiction of the accessibility system by clicking on a "Finish" or "Let's Go" button (or similar) in a third side container window 42, which may be located beneath the second side container window 40. Before proceeding to describe a finalization step(s) of the accessibility system, however, a brief description of other menu items displayed for selection in the first side container window will be briefly described with reference to FIGS. 6-13.

Figure 6:
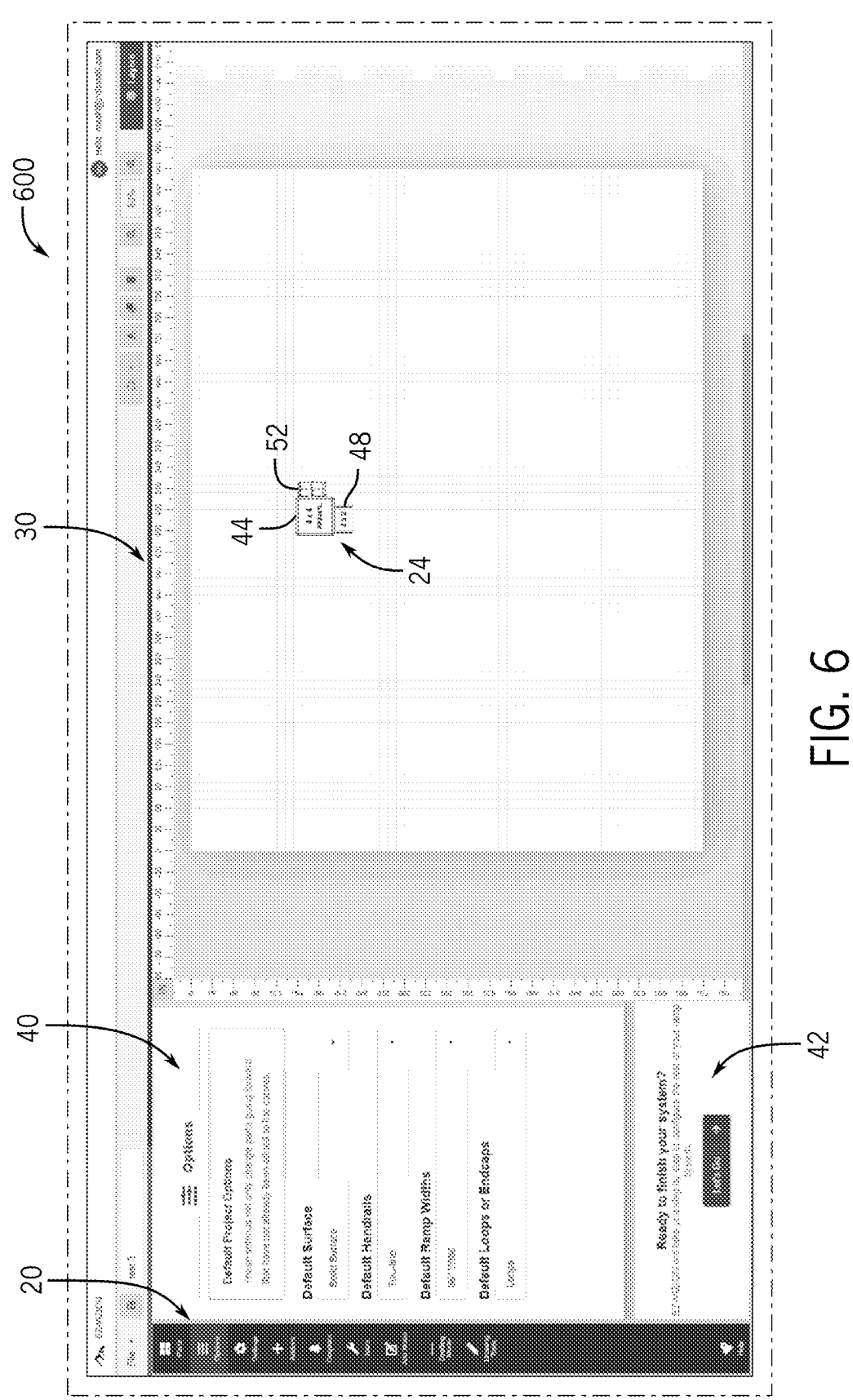

The exemplary screen shot 600 shown in FIG. 6 shows the second side container window 40 displaying options for the client application 102 upon selecting (e.g., clicking on) the "Options" menu item in the first side container window 20. The options for the stencil design may be viewed by and/or changed by the user. For instance, the user may change the type of first (ground) surface for the accessibility system, the type of handrails for the system, the default ramp widths for the system, the type of loops or end caps used for the system, etc.

Figure 7:
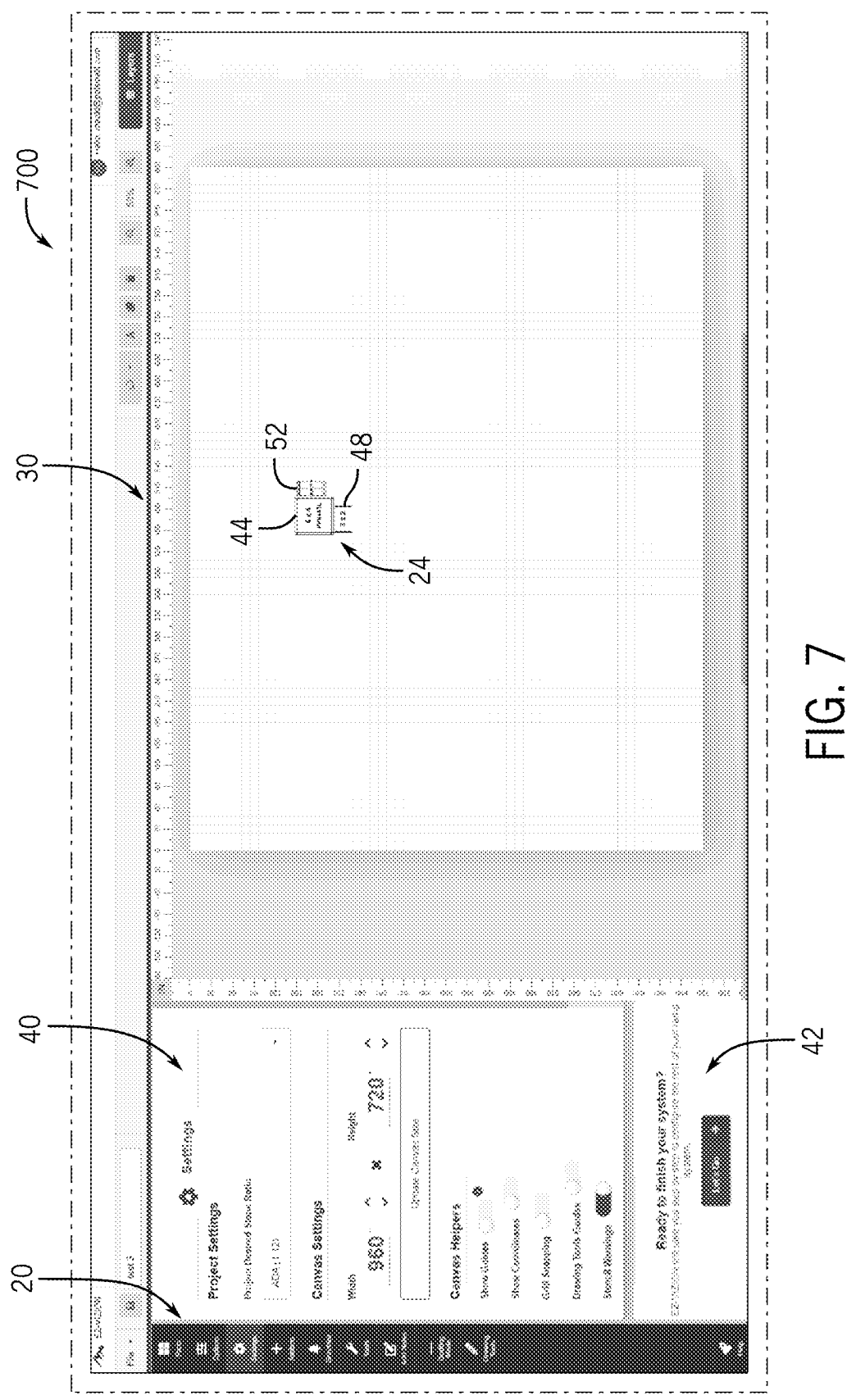

FIG. 7 illustrates a screen shot 700 of an exemplary GUI display showing the second side container window 40 displaying various settings for the client application 102 upon selecting (e.g., clicking on) the "Settings" menu item in the first side container window 20. The settings for the stencil design may be viewed by and/or changed by the user. For instance, the user may view and/or change the desired slope ratio for the accessibility system, the user may change various settings for the canvas, etc.

Figure 8:
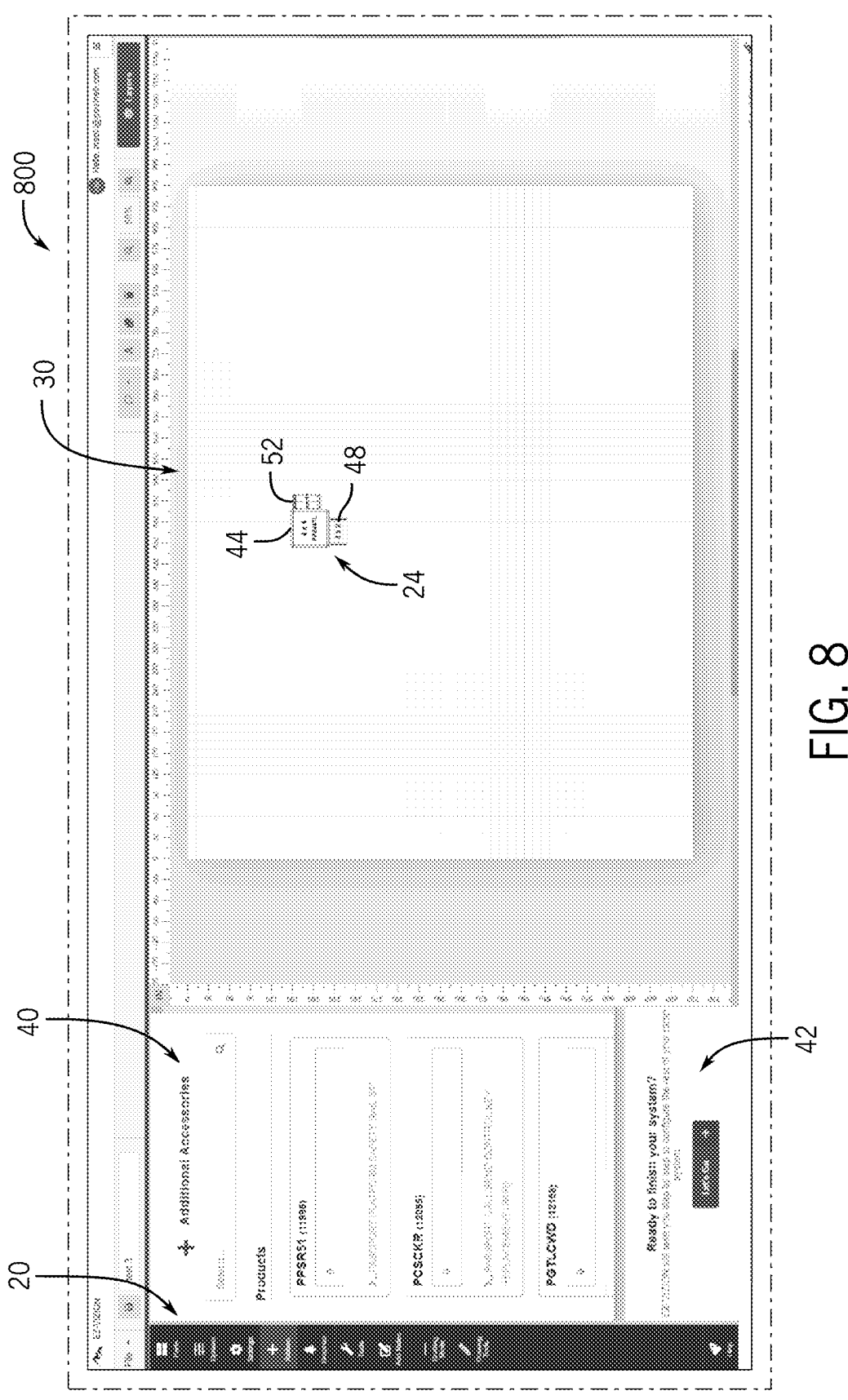

FIG. 8 illustrates a screen shot 800 of an exemplary GUI display showing the second side container window 40 displaying various additional accessories for use during the build of the stencil design 24 upon selecting (e.g., clicking on) the "Addons" menu item in the first side container window 20. For instance, the user may view and/or select certain parts for use in the system, such as safety rails, additional parts, etc.

Figure 9:
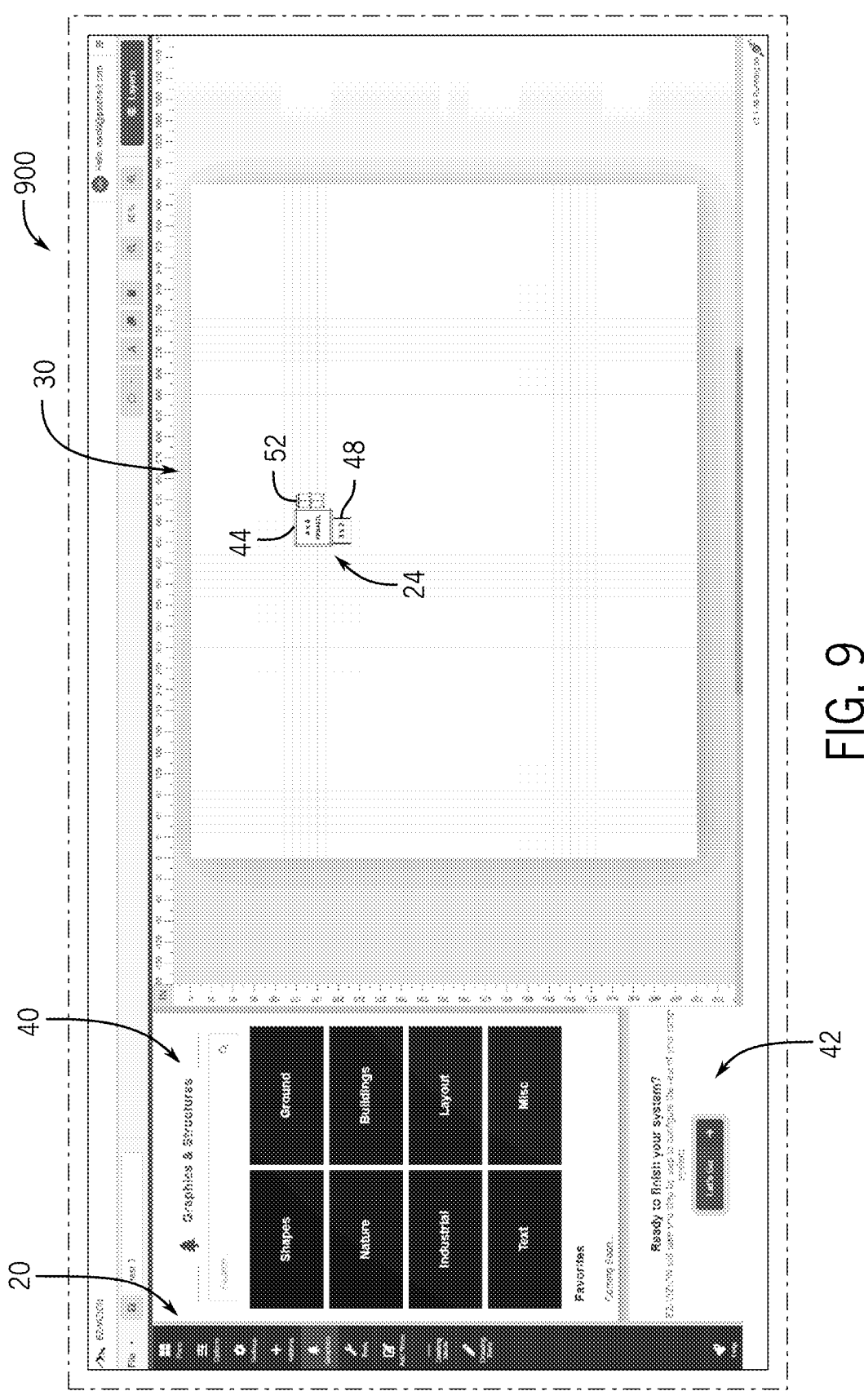

FIG. 9 illustrates a screen shot 900 of an exemplary GUI display showing the second side container window 40 displaying various graphics options and tools for use during the build of the stencil design 24 upon selecting (e.g., clicking on) the "Graphics" menu item in the first side container window 20. For instance, the user may add certain images to the canvas to provide context for the system, such as ground surface, nature/landscaping features, etc.

Figure 10:
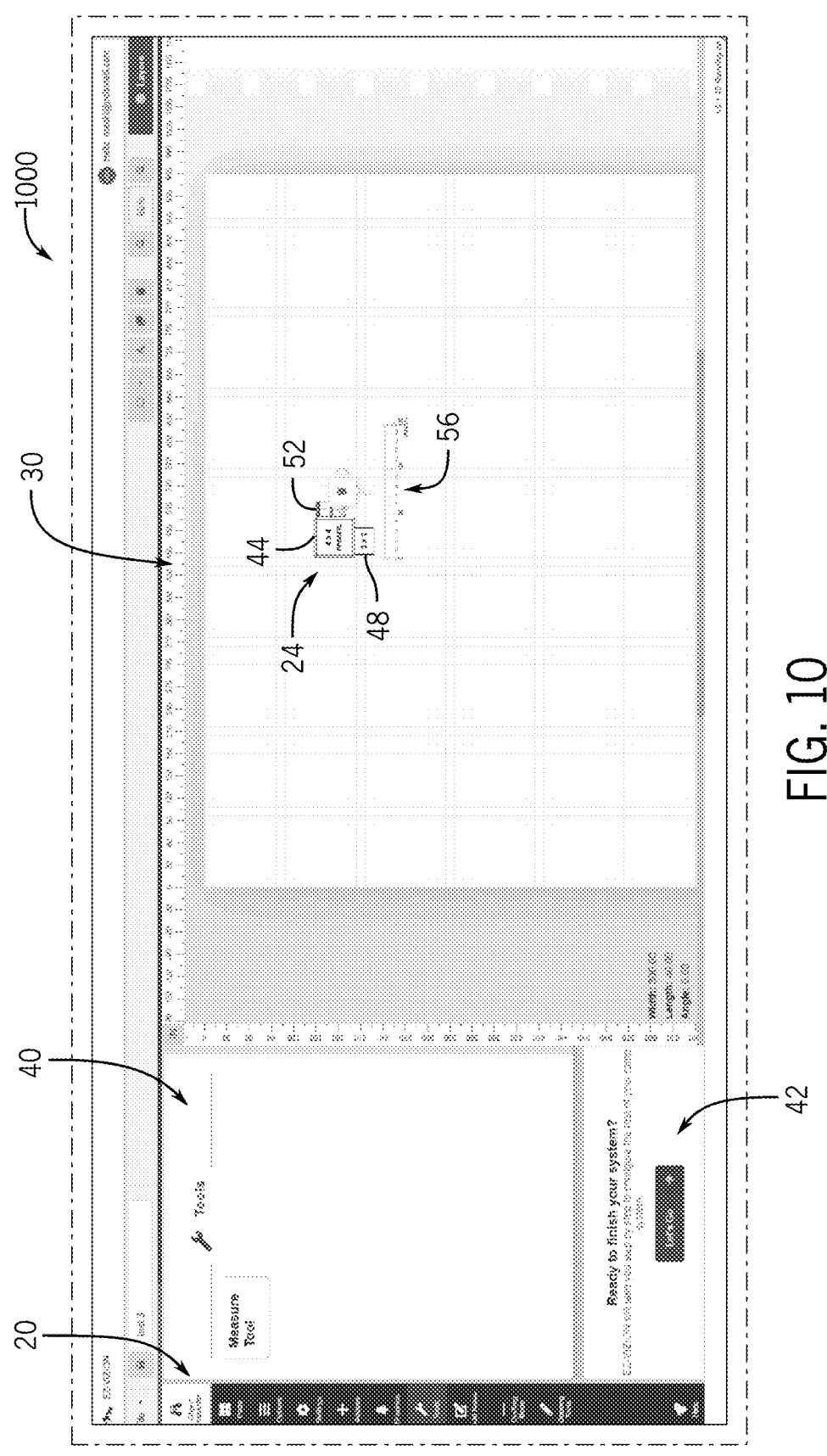

FIG. 10 illustrates a screen shot 1000 of an exemplary GUI display showing the second side container window 40 displaying various tools for use during the build of the stencil design 24 upon selecting (e.g., clicking on) the "Tools" menu item in the first side container window 20. For instance, the user may access a measurement tool for use in building the system, which can be graphically displayed as a ruler 56 alongside the stencil design 24.

Figure 11:
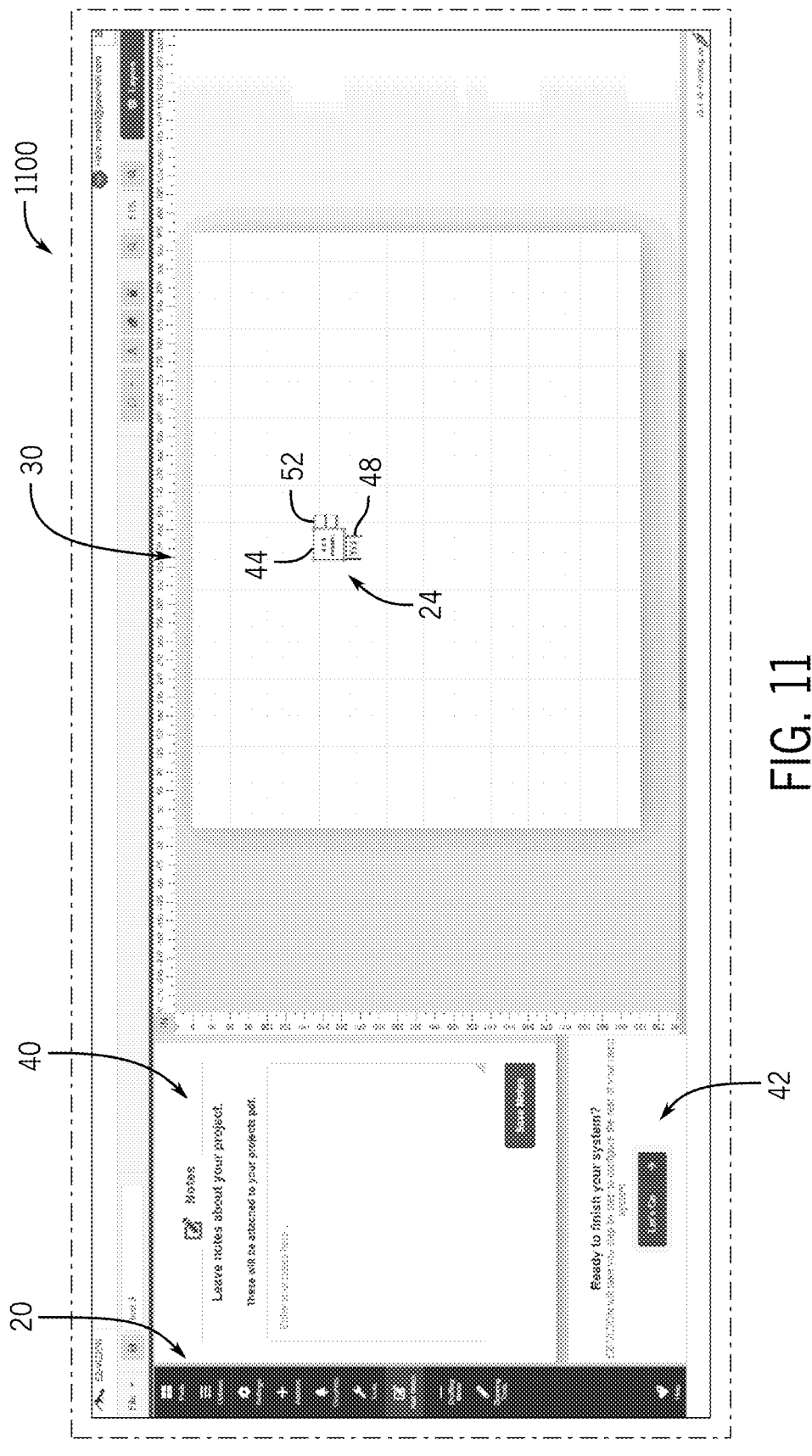

FIG. 11 illustrates a screen shot 1100 of an exemplary GUI display showing the second side container window 40 displaying a note feature for use during the build of the stencil design 24 upon selecting (e.g., clicking on) the "Add Notes" menu item in the first side container window 20. For instance, the user may input text into a text box, where the text will be reproduced on any final an electronic document or file when the accessibility system has been completed.

Figure 12:
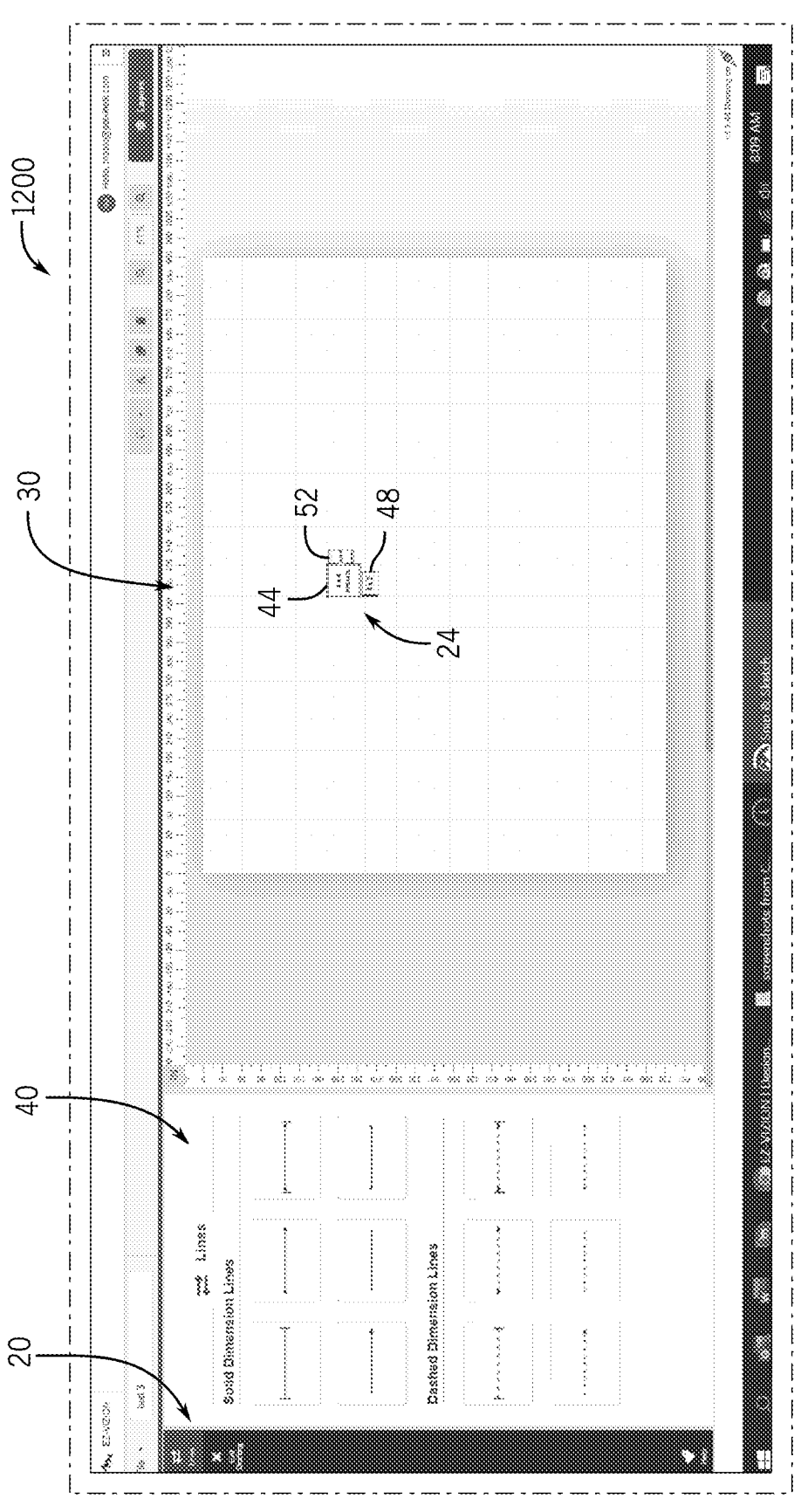

FIG. 12 illustrates a screen shot 1200 of an exemplary GUI display showing the second side container window 40 displaying various line options for creating dimension lines on the canvas. The line options can be accessed upon selecting (e.g., clicking on) the "Drafting Mode" menu item in the first side container window 20. For instance, the user may select various solid or dashed dimension lines.

Figure 13:
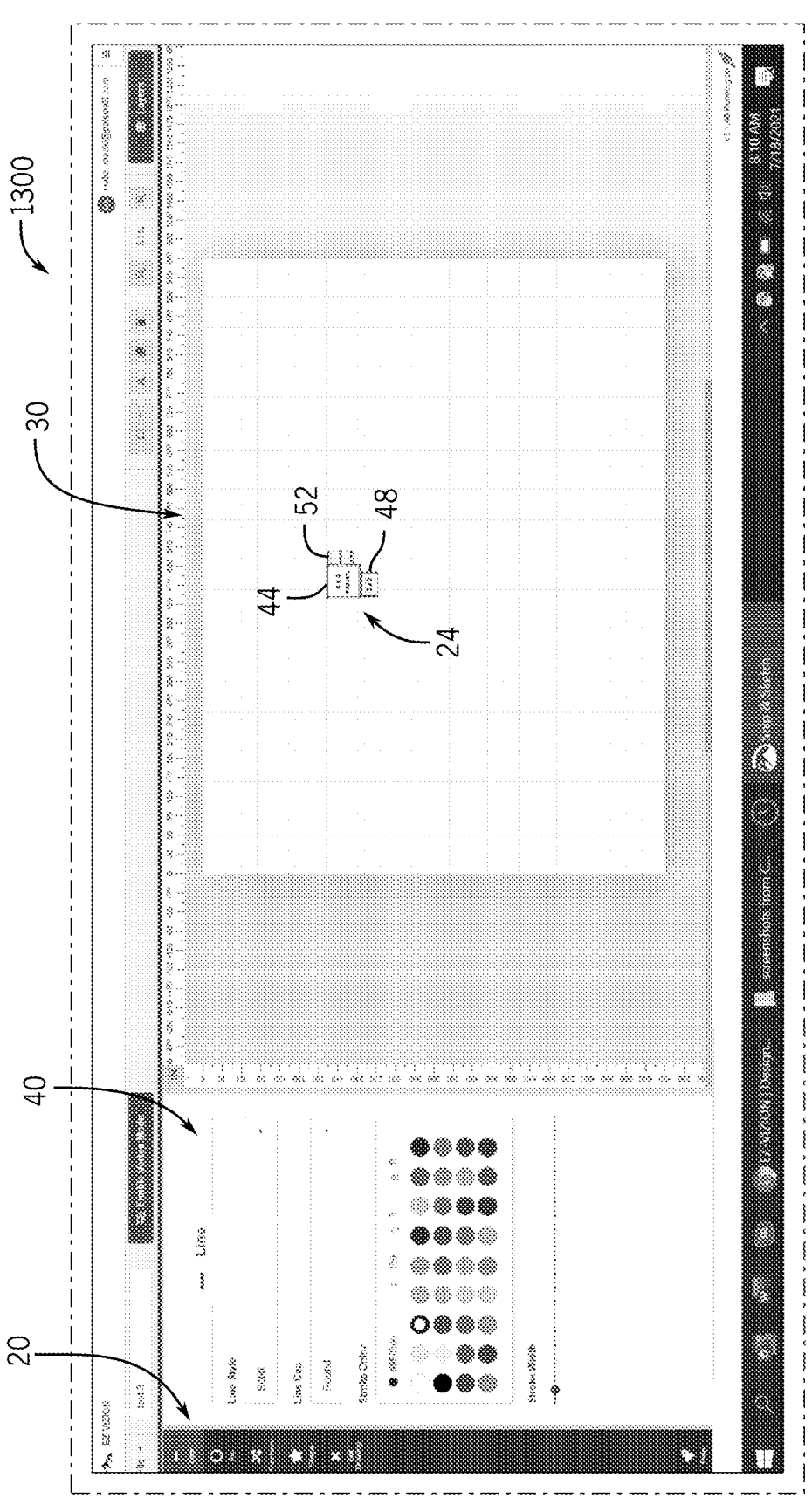

FIG. 13 illustrates a screen shot 1300 of an exemplary GUI display showing the second side container window 40 displaying various drawing options for creating drawing images on the canvas. The drawing options can be accessed upon selecting (e.g., clicking on) the "Drawing Tools" menu item in the first side container window 20. For instance, the user may select various lines, colors, etc., to use for marking up the canvas.

Figure 55:
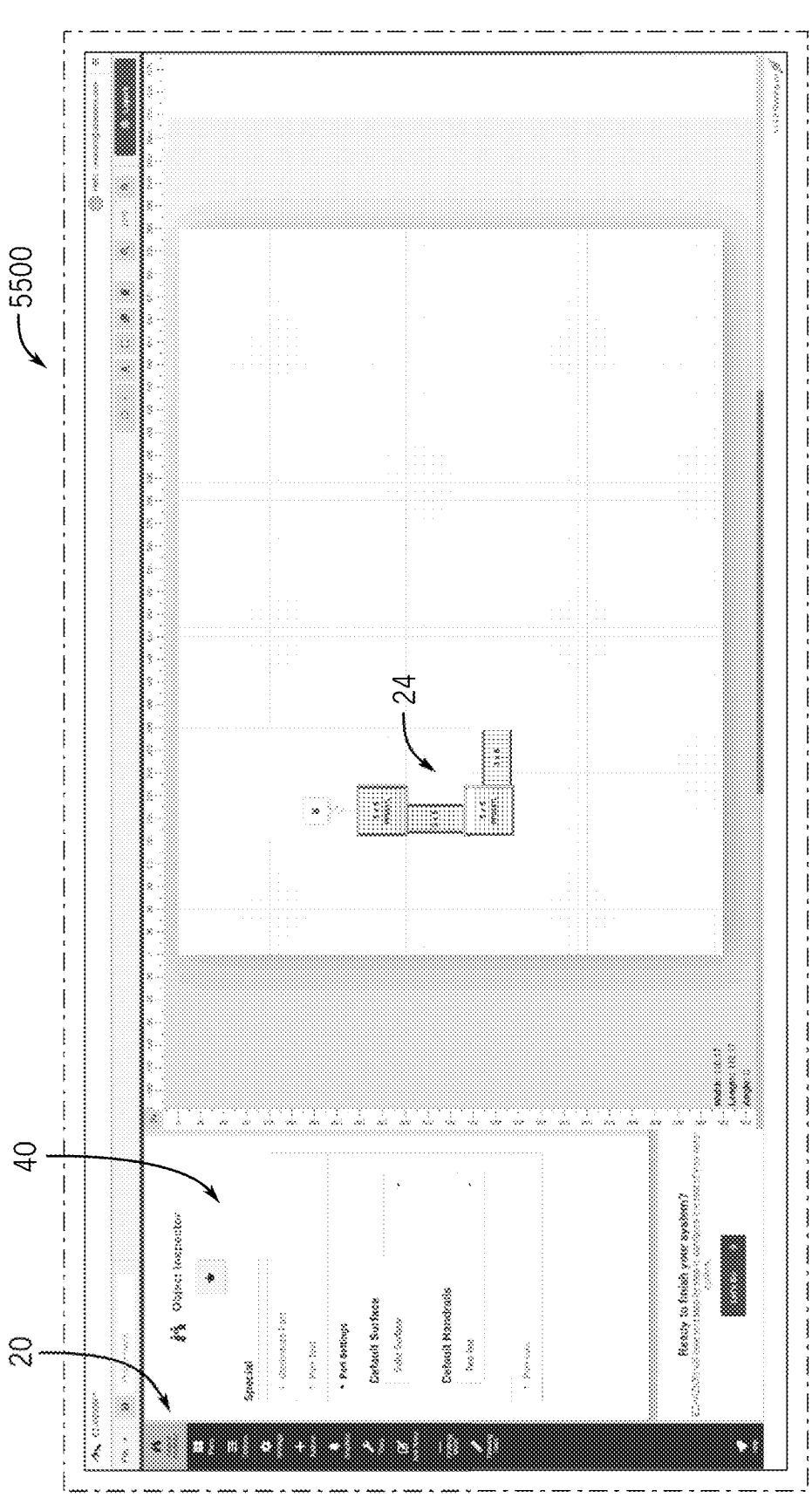
Figure 56:
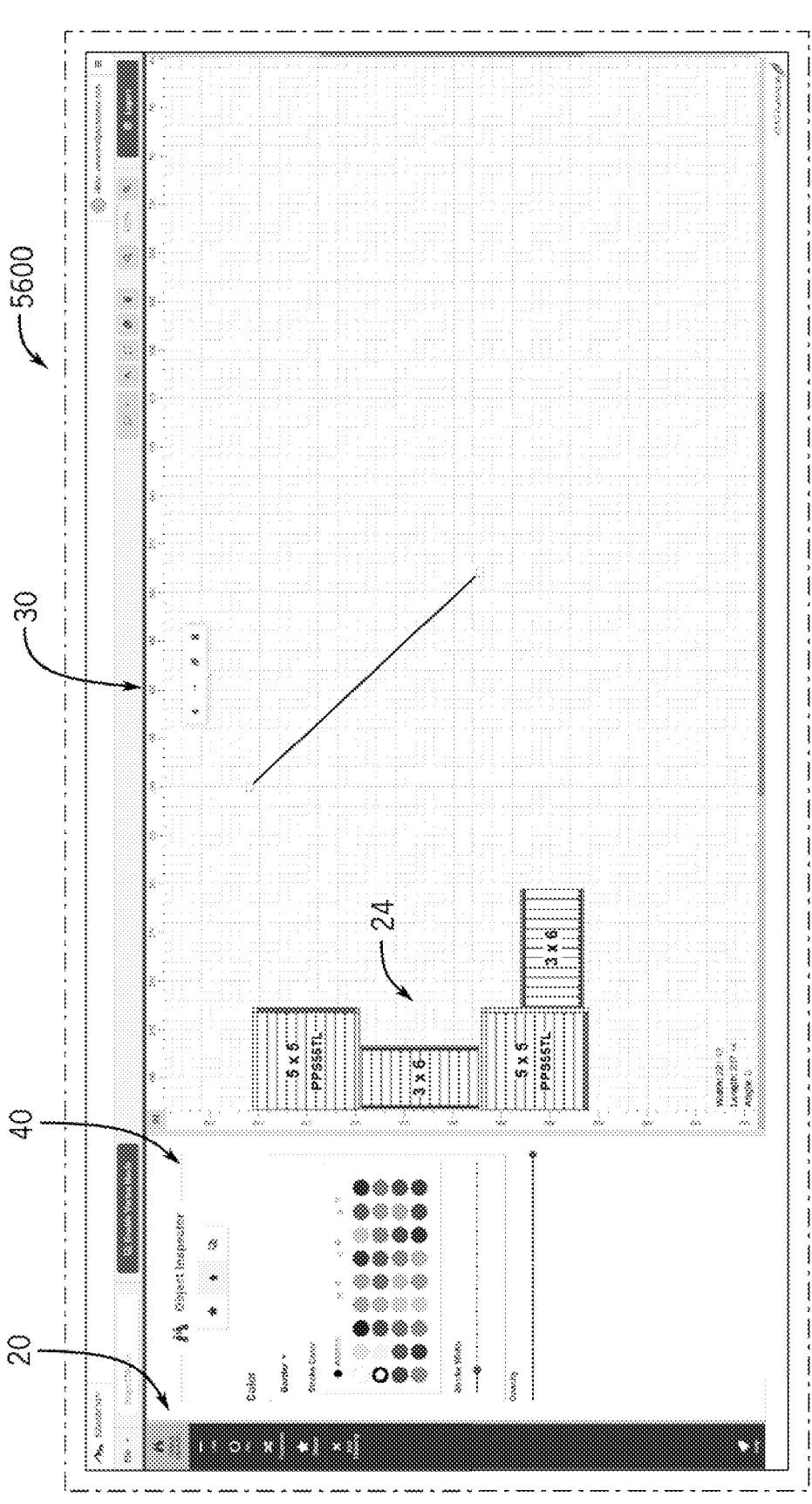

FIGS. 55 and 56 illustrate screen shots 5500 and 5600, respectively, of exemplary GUI displays showing the second side container window 40 displaying options for changing certain properties of the stencil design 24 upon selecting (e.g., clicking on) the "Object Inspector" menu item in the first side container window 20. For instance, the user may change specific properties of a part of the stencil design 24 (e.g. surface type, handrail types, lines, color) upon selecting that part.

Figure 14:
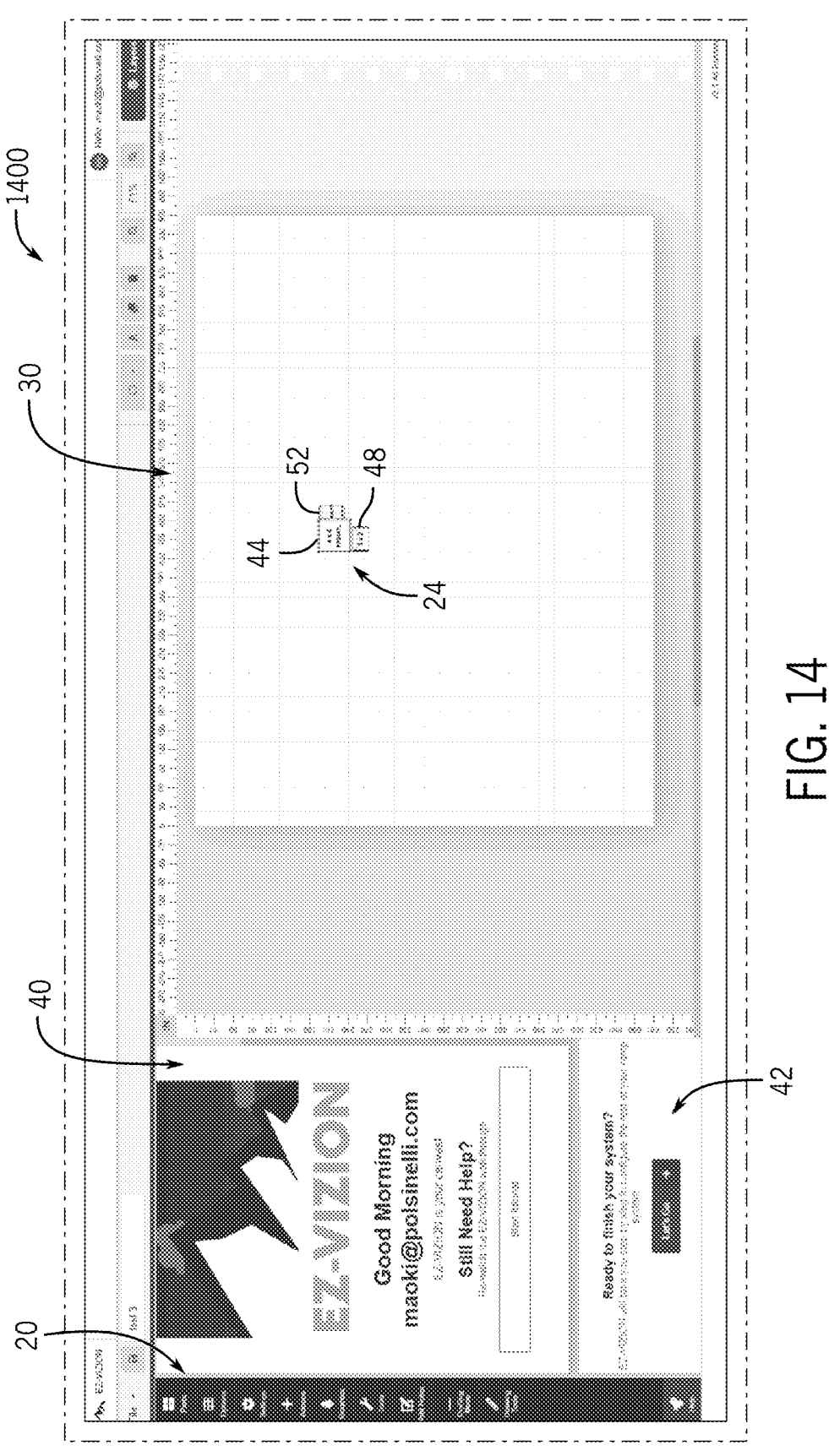

FIG. 14 illustrates a screen shot 1400 of an exemplary GUI display showing the second side container window 40 displaying a welcome screen again, which may be presented after using one or more tools from the main menu in the first side container window 20, when returning to a saved system file, etc. A third side container window 42 located beneath the second side container window 40 displays a "Let's Go" button or similar, which can be selected by the user after the user has finished using the tools from the main menu.

In a next step, the client application 102 runs a stencil checkup module 190 (see FIG. 2) configured to generate feedback data regarding the selected components of the accessibility system. For instance, the stencil checkup module 190 may generate a list of one or more missing components required to form a complete accessibility system, including at least one of a first transition piece for use between a ramp and a first level or surface (e.g., the ground) and a second transition piece for use between a second raised level or surface (e.g., an existing raised surface, such as a building entrance) to the platform.

Figure 15:
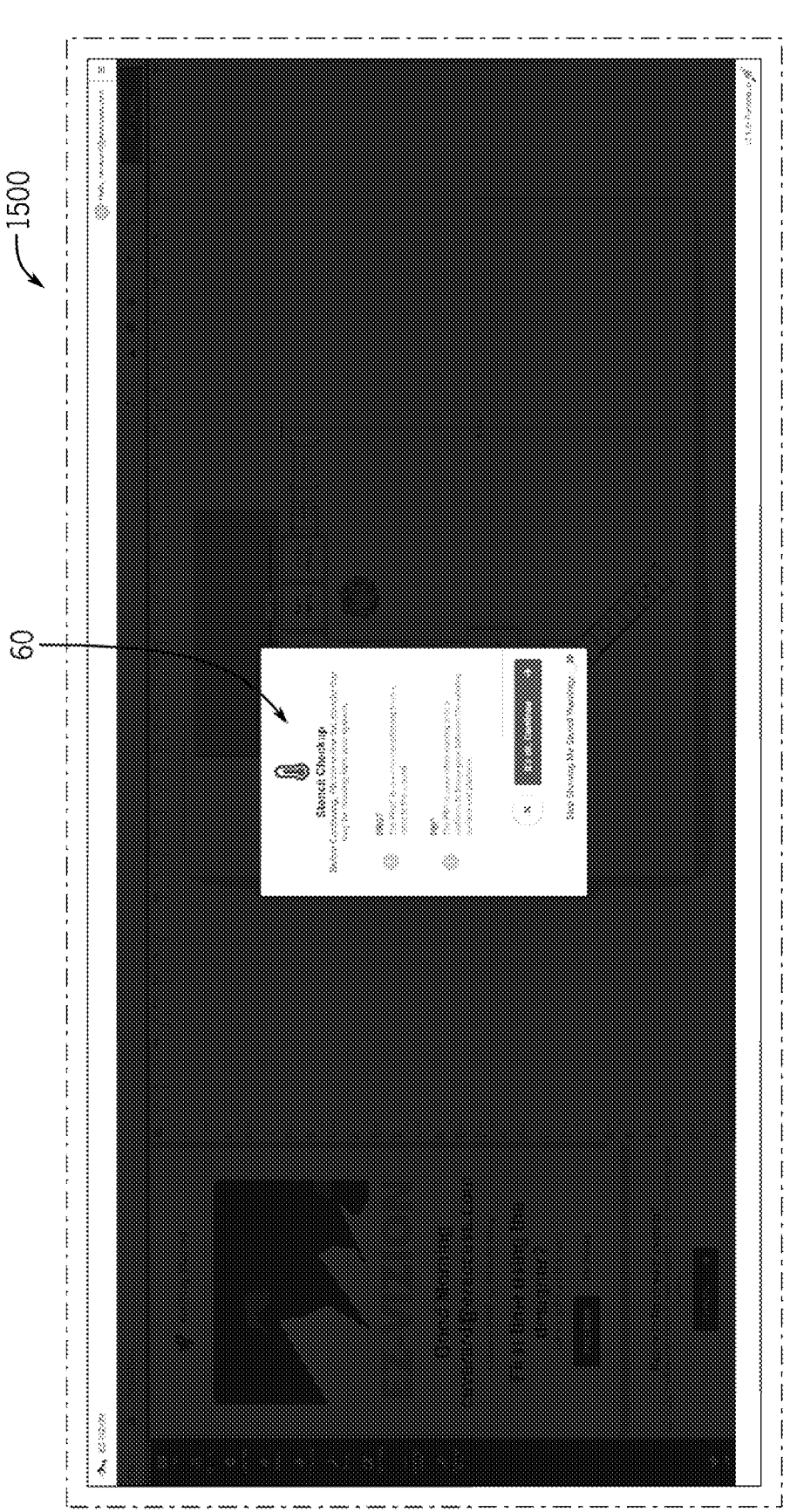

FIG. 15 illustrates a screen shot 1500 of an exemplary GUI display showing a pop-up window 60 displaying the results of the stencil checkup module 190. The pop-up window 60 indicates that certain parts are missing from the stencil design, such as "PRGT" for transitioning from the ramp to the first surface, and a "PBP" for transitioning from a second raised surface to the platform. The user has the option to close the window and add the recommended parts or continue without the parts (but with the warning that they were missing).

Figure 16:
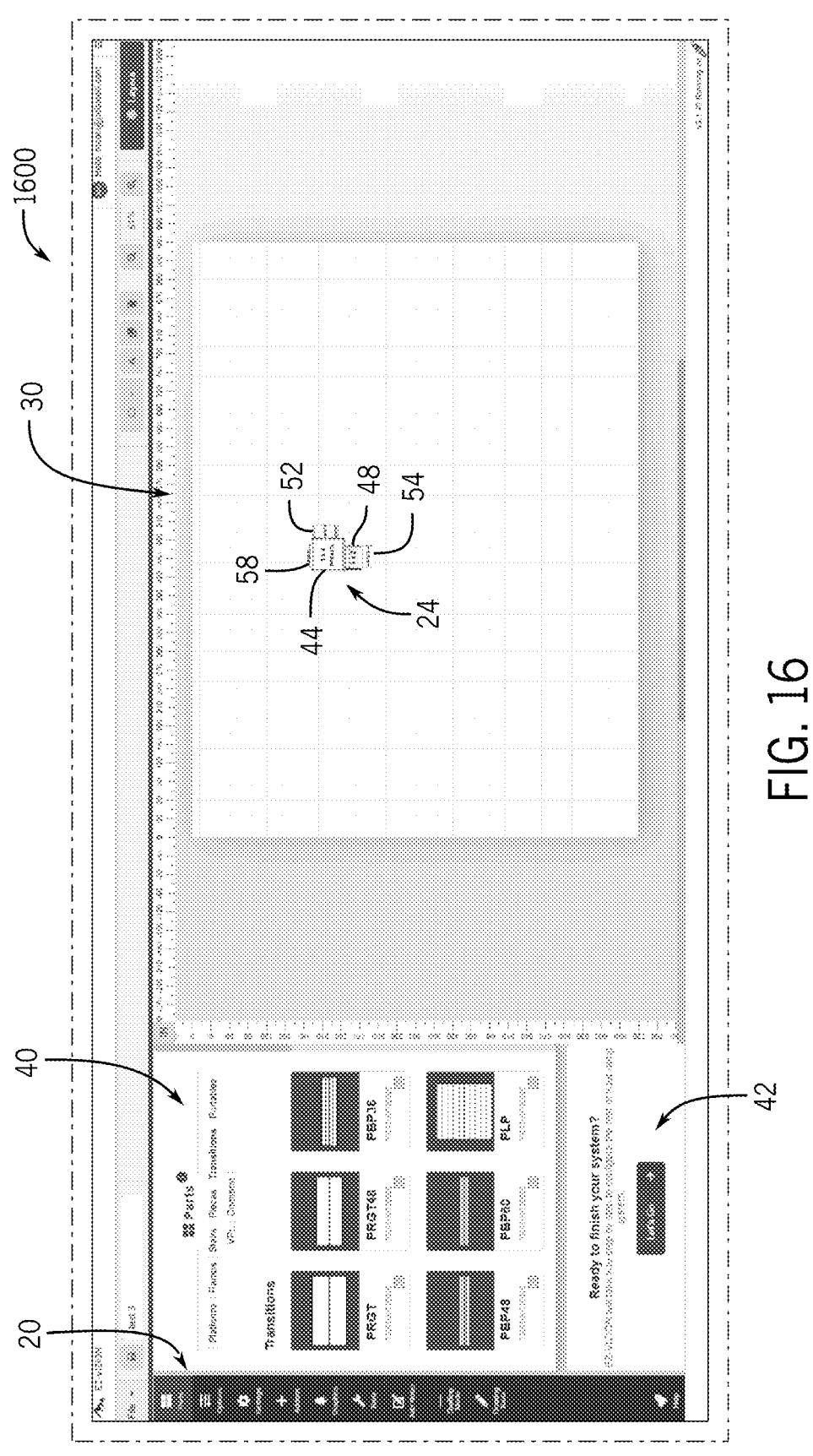

If the user wants to add the recommended parts, the user can click the "X" button and go back to the menu item "Parts" in the first side container window 20 and "Transitions" at the top of the second side container window 40 in order to display the various parts in the second side container window 40, as shown in the exemplary screen shot 1600 of FIG. 16. Here the user has added a first transition piece 58 for the ramp 48 to the ground and a second transition piece 54 for an existing raised surface to the platform 44, as recommended. After adding some or all the recommended parts, the user can again select a "Let's Go" button or similar in the third side container window 42.

After selecting the "Let's Go" button, the client application 102 may re-run the stencil checkup module 190 to determine if one or more required components are missing from the designed accessibility system. If no parts are found to be missing, the client application 102 may run a handrail builder module 194 (see FIG. 2) configured to add handrails and/or other safety feature (such as treads) to components of the system. The handrail builder module 194 (see FIG. 2) may also be configured to generate feedback data indicating whether for instance, a handrail can connect to a component (such as a platform, ramp, or stairs) or otherwise has a connection issue with the component, whether a certain component is missing a recommended handrail or other safety feature, and/or whether a selected position for the handrail is compatible with the run.

Figure 17:
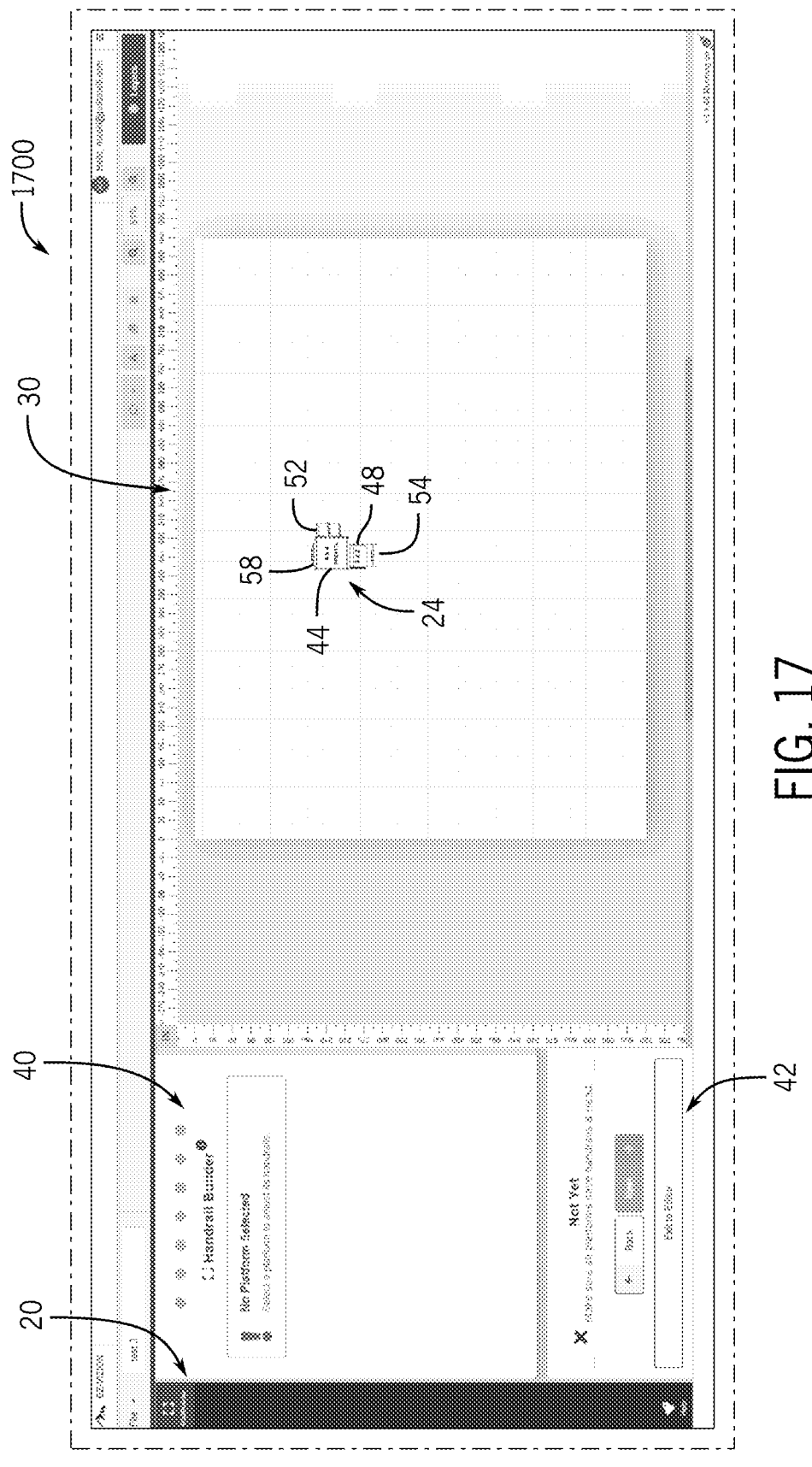

As an example, FIG. 17 illustrates a screen shot 1700 of an exemplary GUI display showing results of the handrail builder module 194 in the third side container window 42. Specifically, the handrail builder module 194 generates feedback data in the third side container window 42 indicating that the platform(s) are missing handrails and tread. In one embodiment, the handrails and other safety features (such as treads) are instead added automatically, and the user has the option to remove the handrails and other safety features.

In the depicted exemplary embodiment, the user has the option to close the window and add the recommended parts or continue without the parts (but with the warning that they were missing). If the user wants to add the recommended parts, the user can click the "Exit to Editor" button or similar and go to the first side container window 20, which now displays a menu item "RailBuilder" at the top. Upon selecting "RailBuilder" in the first side container window 20, handrail builder features are displayed in the second side container window 40. For instance, to proceed with the handrail builder module 194, the user must select a component (such as a platform, ramp, or stairs) on which handrails or other safety features (such as treads) may be added.

Figure 18:
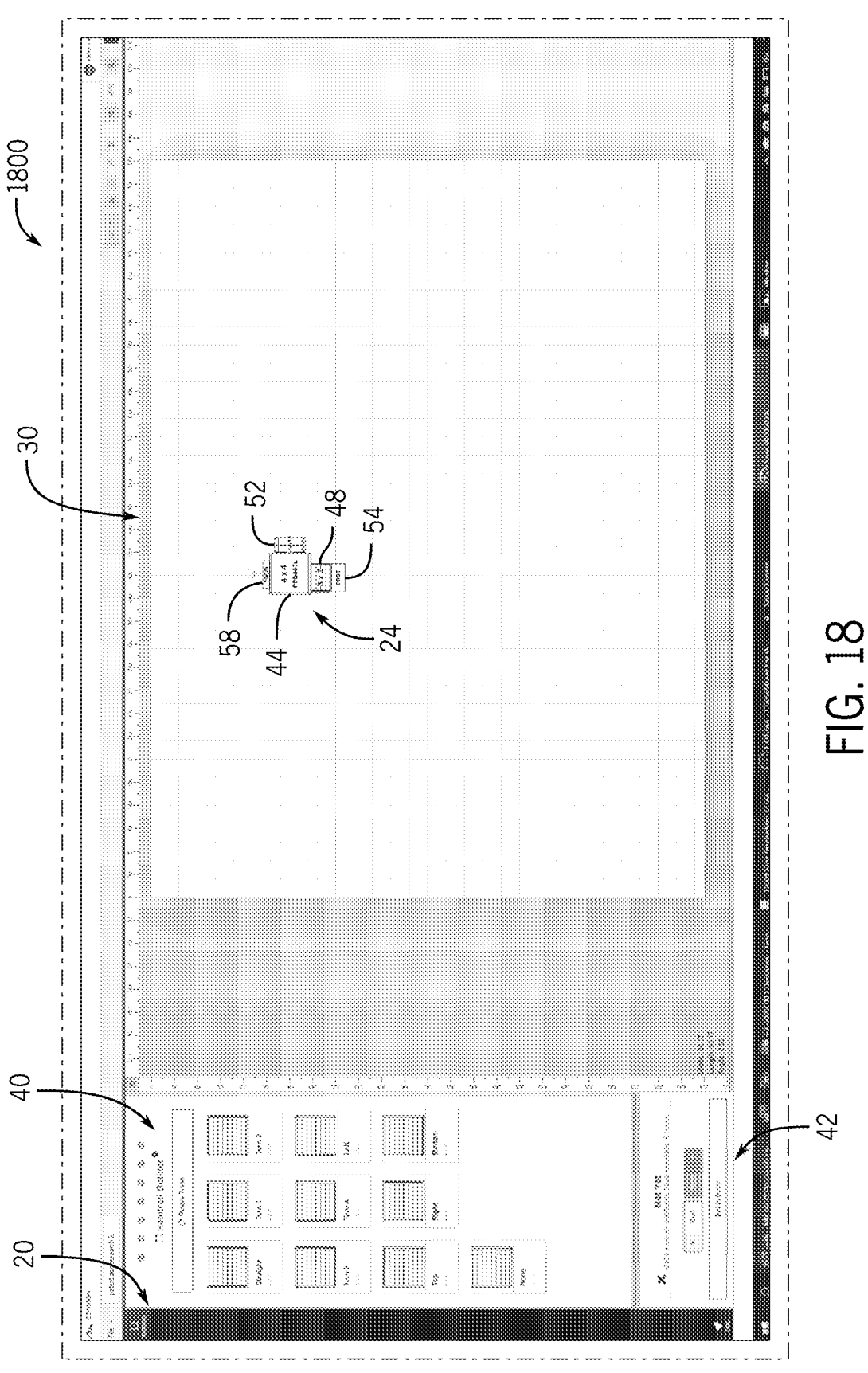
Figure 19:
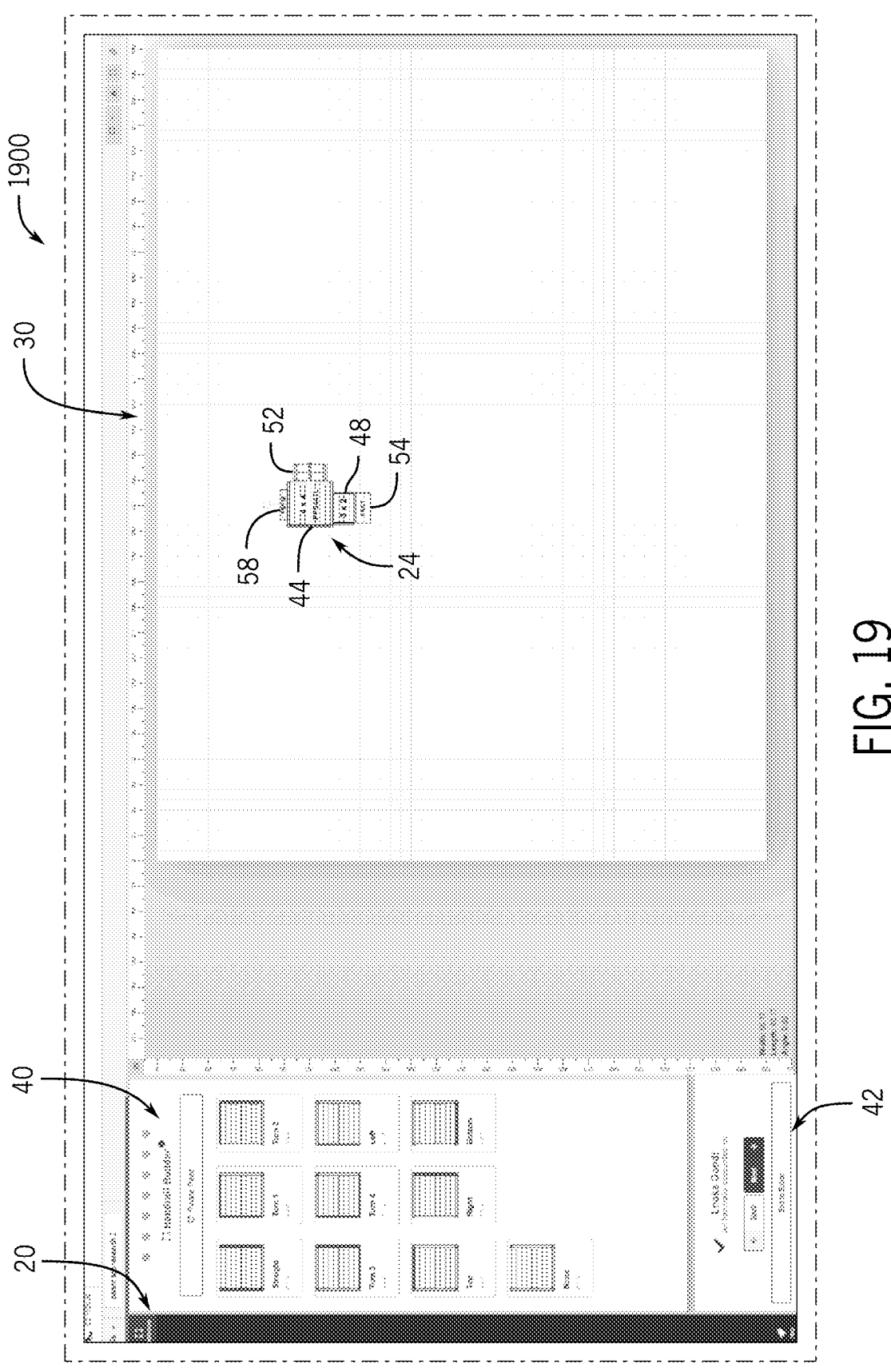
Figure 45:
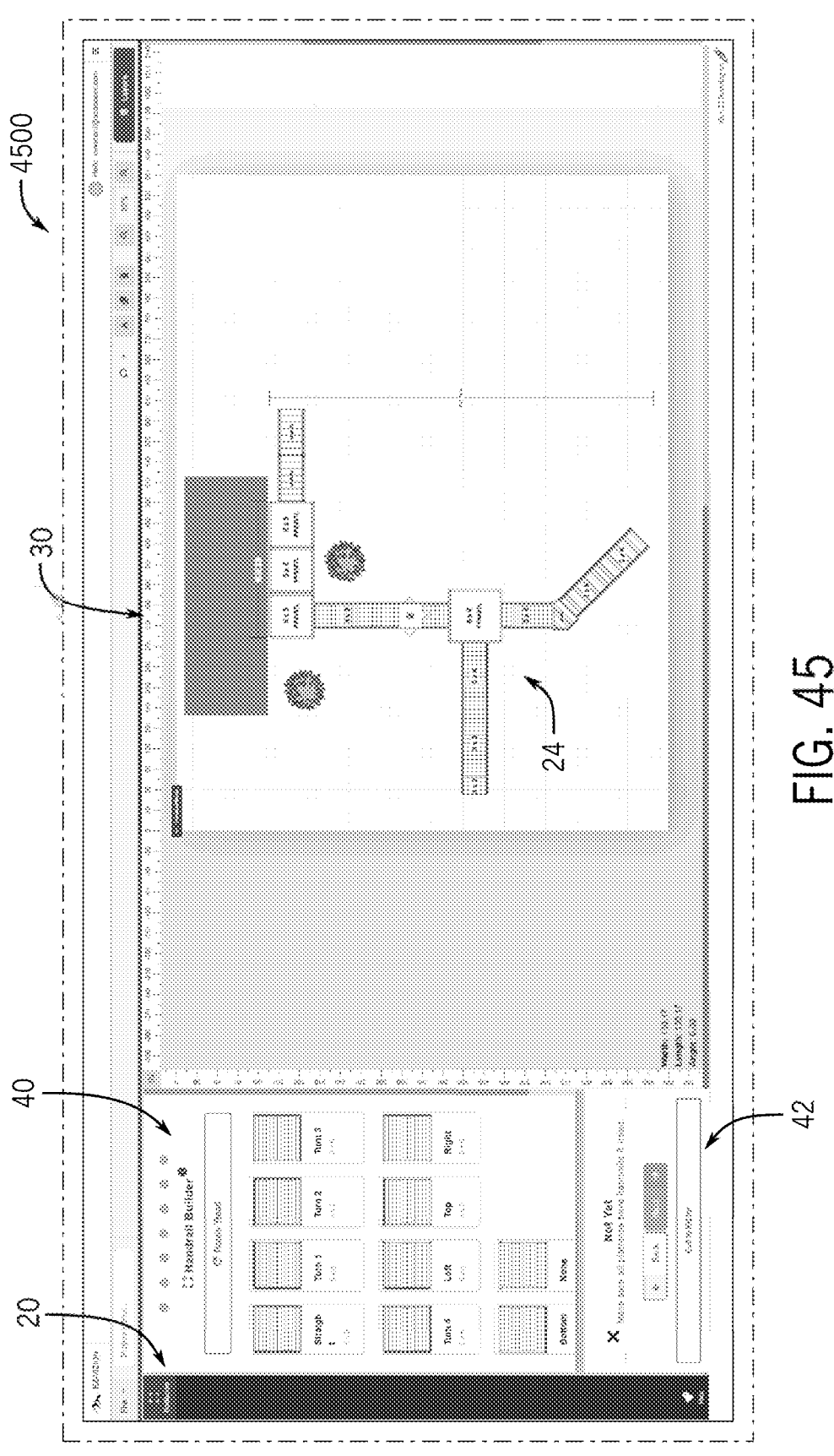
Figure 46:
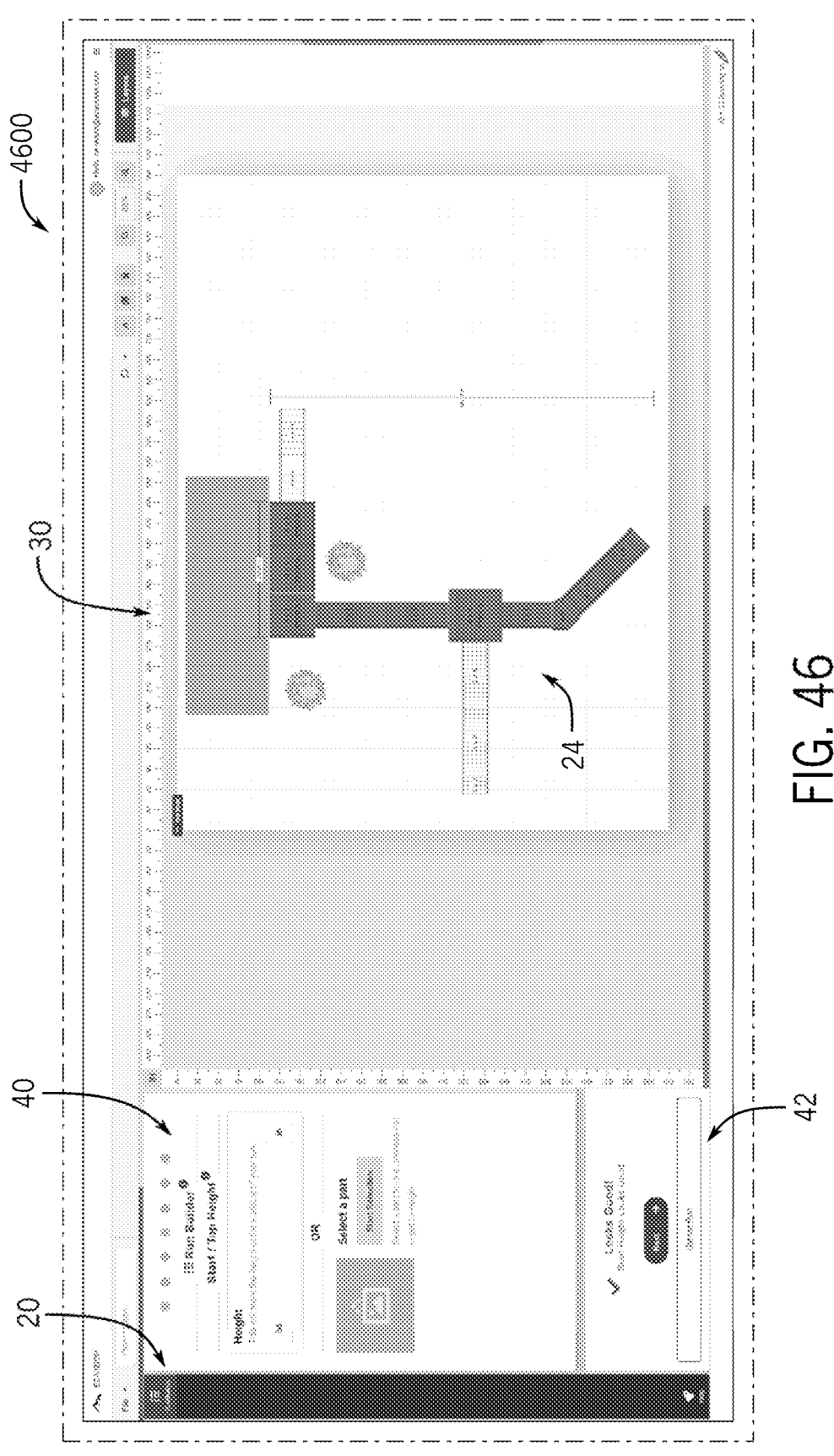

As an example, and referring to the exemplary screen shot 1800 of FIG. 18, after selecting the ramp 48, a variety of different handrail position options are displayed in the second side container window 40. The user can click on a preferred handrail position (e.g. left, right, front, and/or rear) to add it to the ramp 48. Referring to the exemplary screen shot 1900 of FIG. 19, the user can then select another component, such as the platform 44, and a variety of different handrail position options are displayed in the second side container window 40. The user can click on a preferred handrail position to add it to the platform 44. FIG. 45 shows an exemplary screen shot 4500 of a GUI display showing another stencil design 24 having handrails added to the design using the handrail builder module 194.

The handrail builder module 194 may generate feedback data (such as in the second side container window 40) indicating that the selected position is not compatible with the run 24. For instance, an error may be generated and displayed if a top handrail was chosen for platform 44 because a top handrail would prevent access to the platform 44. The handrail builder module 194 may also present an option to alter the treads of the component in the second side container window or change or add any other safety feature.

Figure 20:
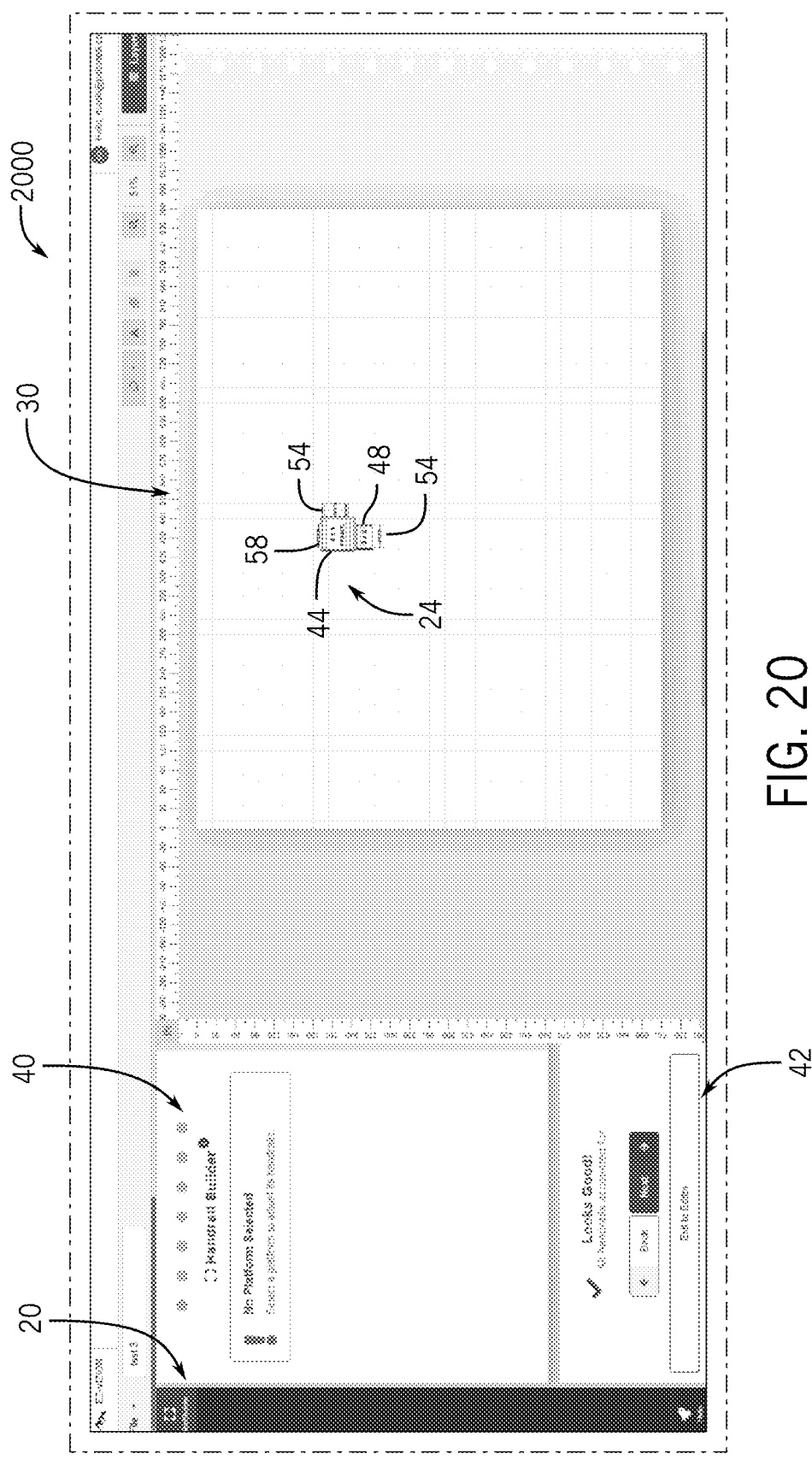

Referring to the exemplary screen shot 2000 of FIG. 20, the handrail builder module 194 may display an indication in the first side container window 20 that all handrails or other safety features are accounted for after all the components have the recommended handrail or other safety feature. The user can then select a "Next" button or similar in the third side container window 42 to proceed to any next steps in building the graphical depiction of an accessibility system.

Figure 21:
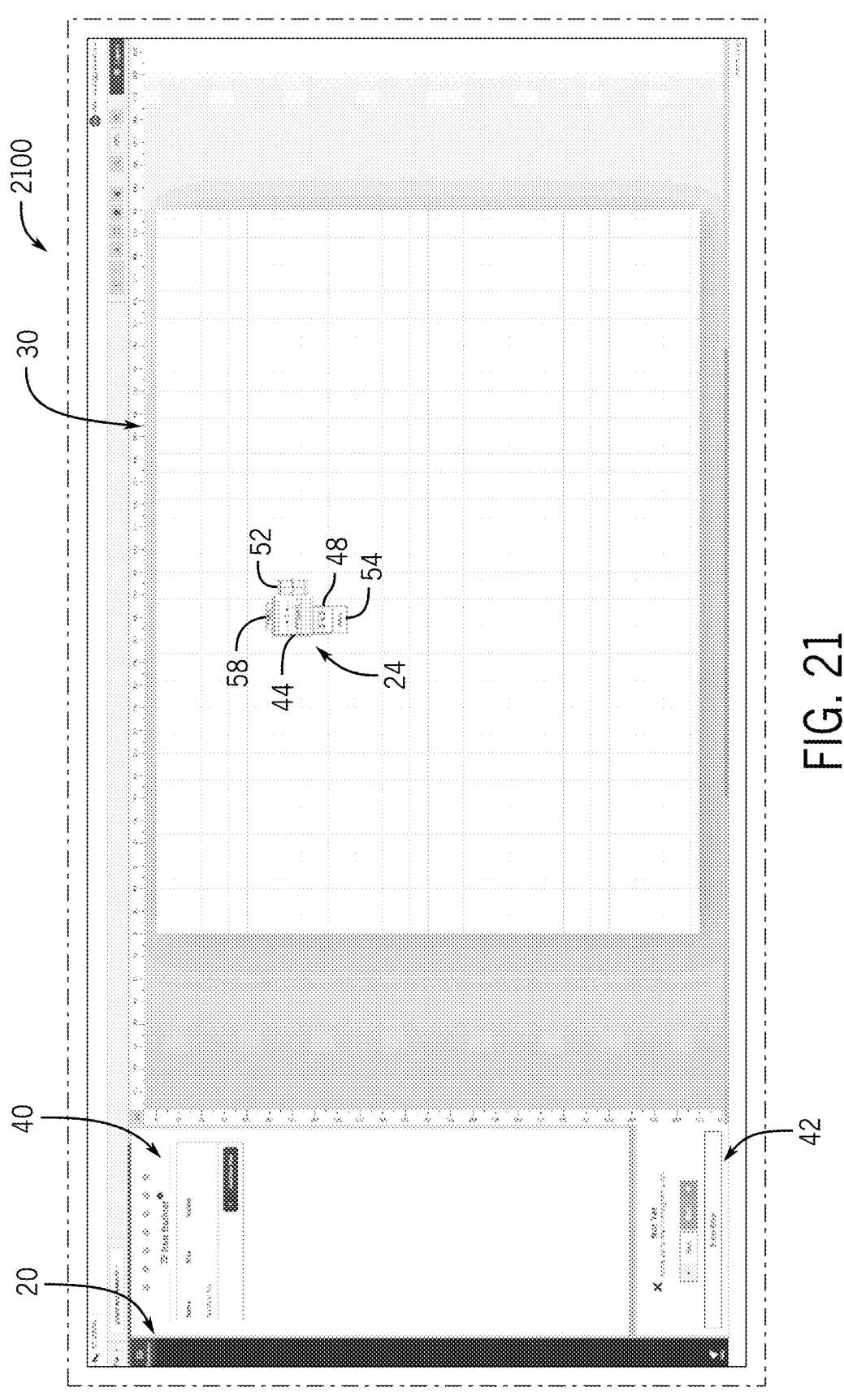
Figure 22:
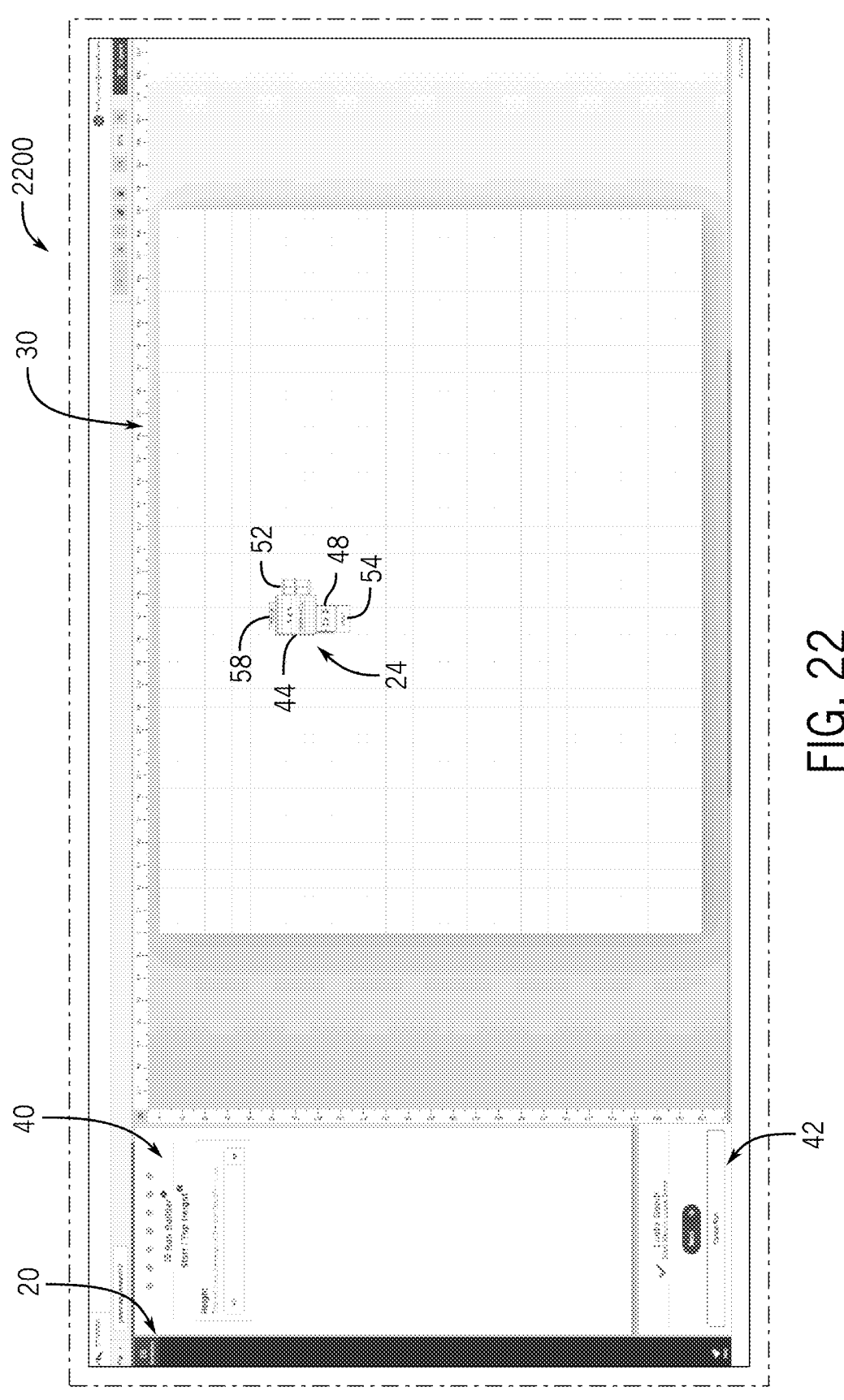

Referring to the exemplary screen shot 2100 of FIG. 21, in a next step, the client application 102 may run a run builder module 198 (see FIG. 2 and the "RunBuilder" menu item displayed at the top of the first side container window 20) to generate feedback data regarding the slope or ratio of selected components of the accessibility system. For instance, the run builder module 198 may generate feedback data indicating whether one or more components of the accessibility system create a run (a non-branched, uninterrupted path through the system) having the desired ratio selected with the slope input module 178.

In a first step, the run builder module 198 displays an option to "Add New Run" by clicking a button in the second side container window 40 in the exemplary screen shot 2100 of FIG. 21. After clicking on "Add New Run", the user may inputs a start/top height for the run (which may be indicated that it needs to be more than 0 inches), as shown in the exemplary screenshot 2200 in FIG. 22. For instance, the user may input a start/top height of ninety inches into a text box in the second side container window 40.

Figure 23:
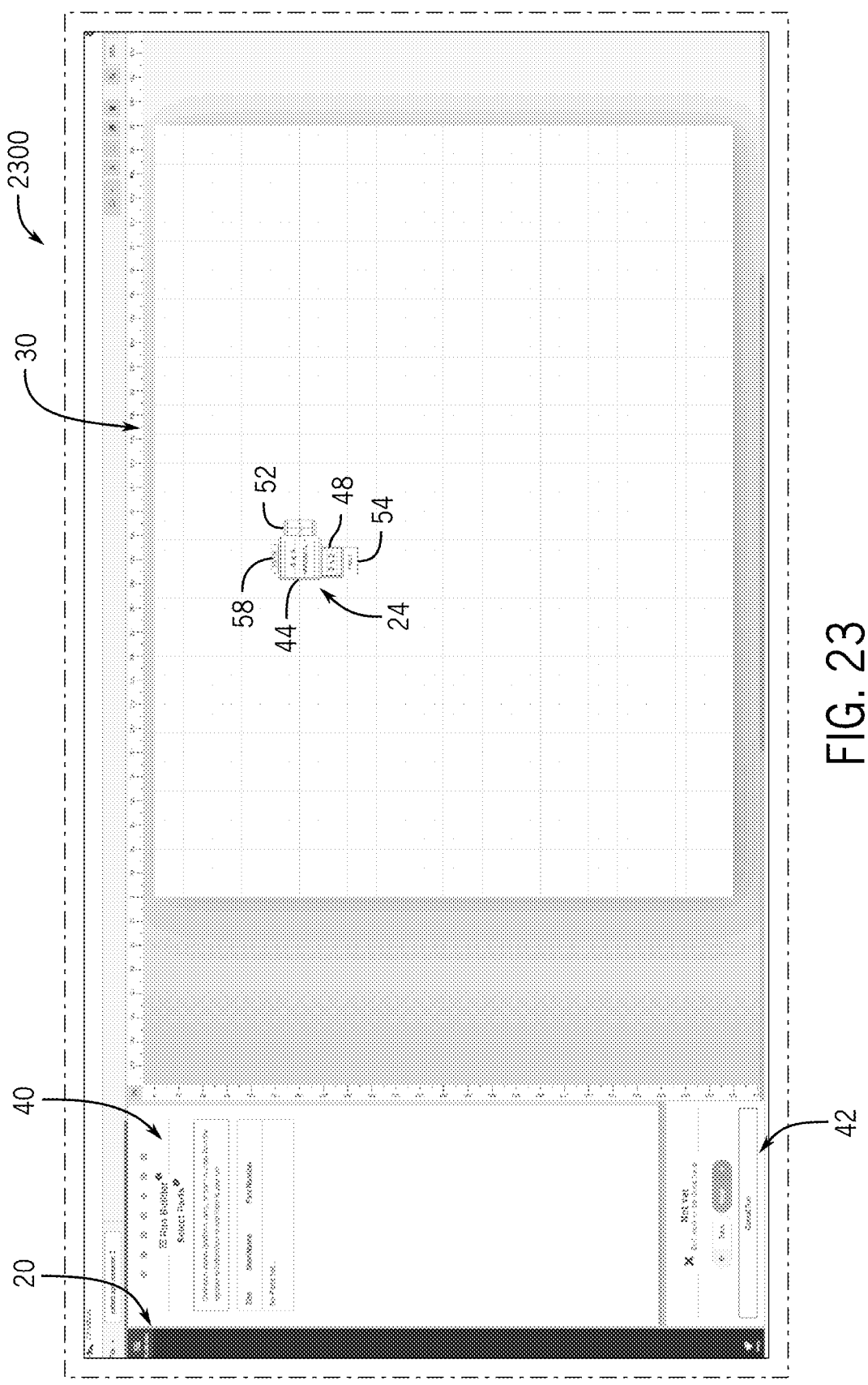
Figure 24:
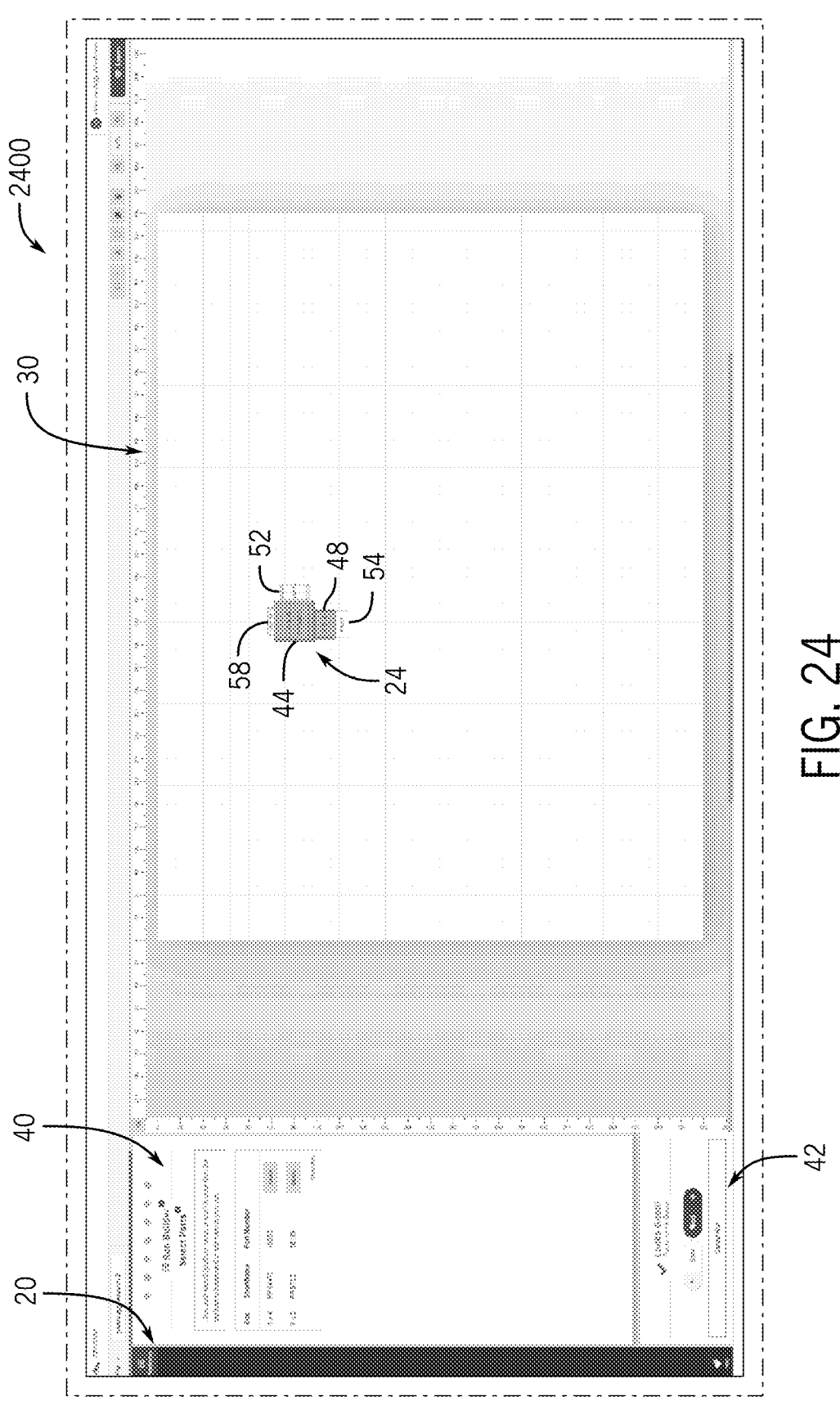

In a next step shown in the exemplary screen shot 2300 of FIG. 23, the user is prompted to select the components of the run to be analyzed. The run builder module 198 may be configured such that a user may only start the run by selecting the top (highest point) of the run and may then click through or select every piece in order until the bottom (lowest point) of the run is reached. For instance, the user may click on parts 44 and 48 to define a run to be analyzed, as shown in the exemplary screen shot 2400 of FIG. 24. The run builder module 198 may be configured to generate an error or feedback if the user tries to begin the run with an intermediate or bottom component.

In other aspects, the run builder module 198 may be configured to generate an error or feedback if stairs are included in the primary run, if stairs and a ramp are in the same run, if the run includes different sized ramps (as described below with regards to a connections module 202), if the components are ordered incorrectly in the run, and/or if the run length is too long and a resting platform is needed.

Figure 25:
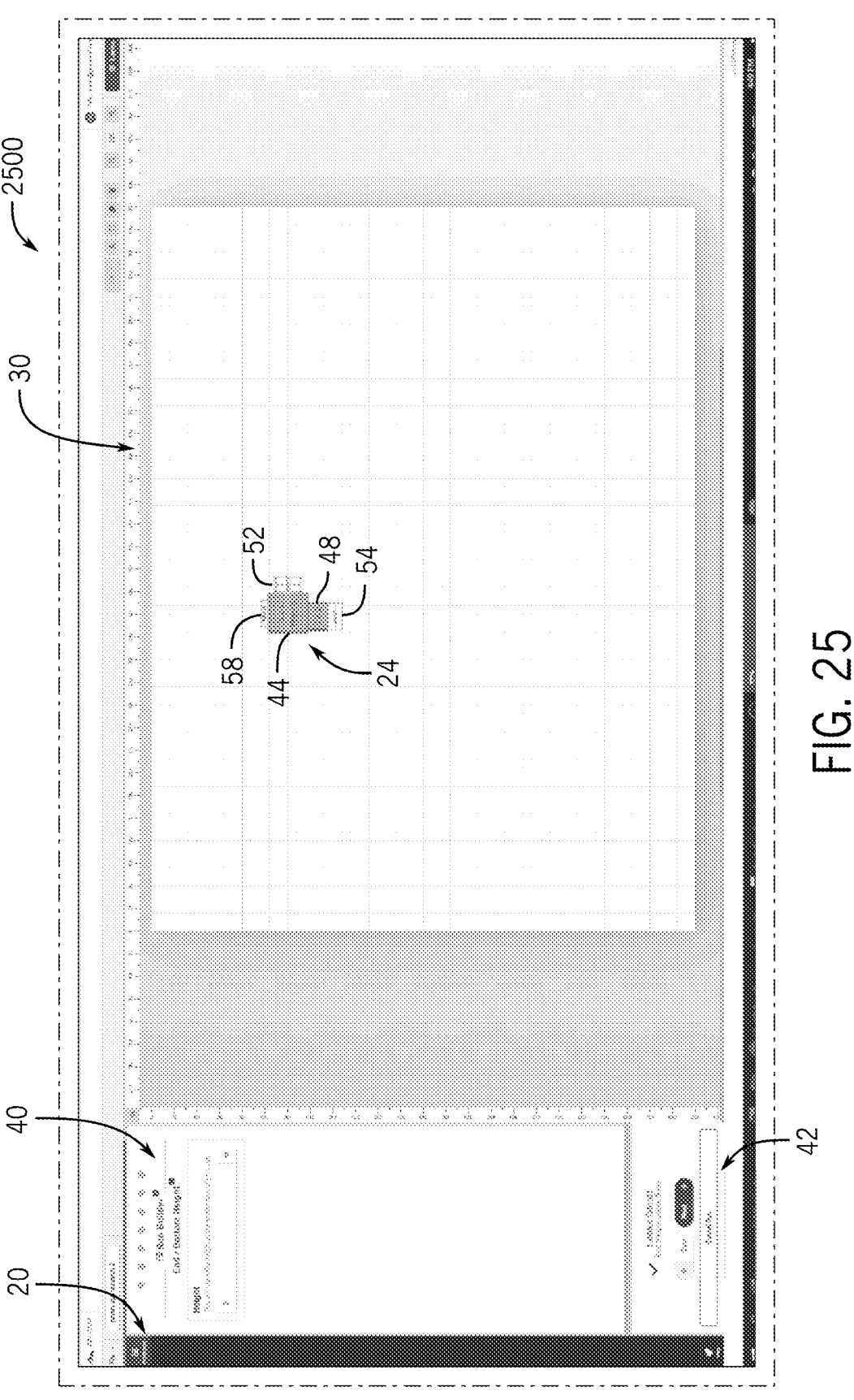

In a next step, the user may input an end/bottom height for the run, as shown in the exemplary screenshot 2500 in FIG. 25. In some aspects, the run builder module 192 may generate feedback indicating that end/bottom height cannot be higher or greater than the start/top height. In the exemplary screenshot 2500 in FIG. 25, an end/bottom height of 2 inches is inputted into a text box in the second side container window 40. After selecting the end/bottom height, the user may click on the "Next" button or similar in the third side container window 42 to proceed with analyzing the run.

Figure 26:
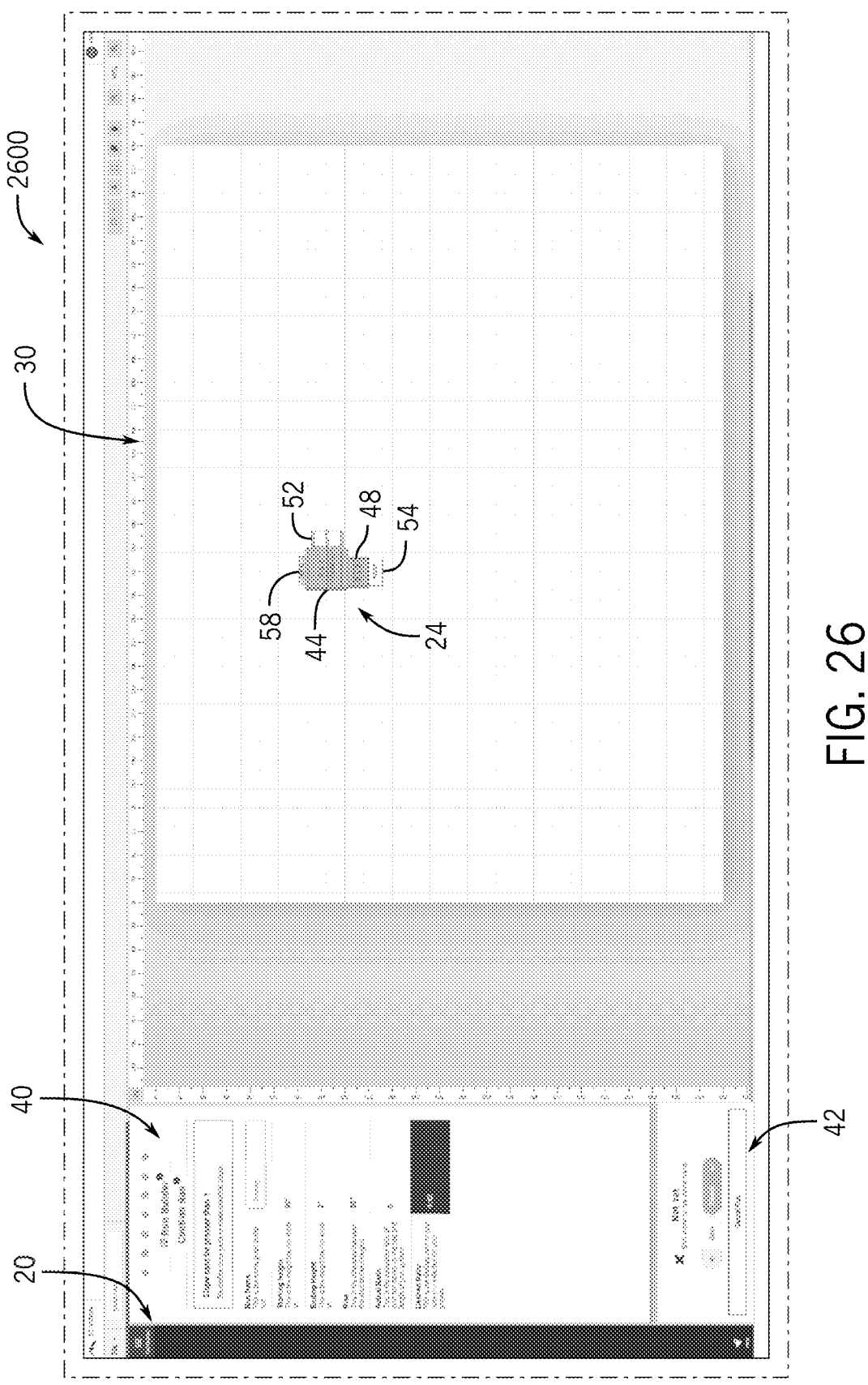
Figure 27:
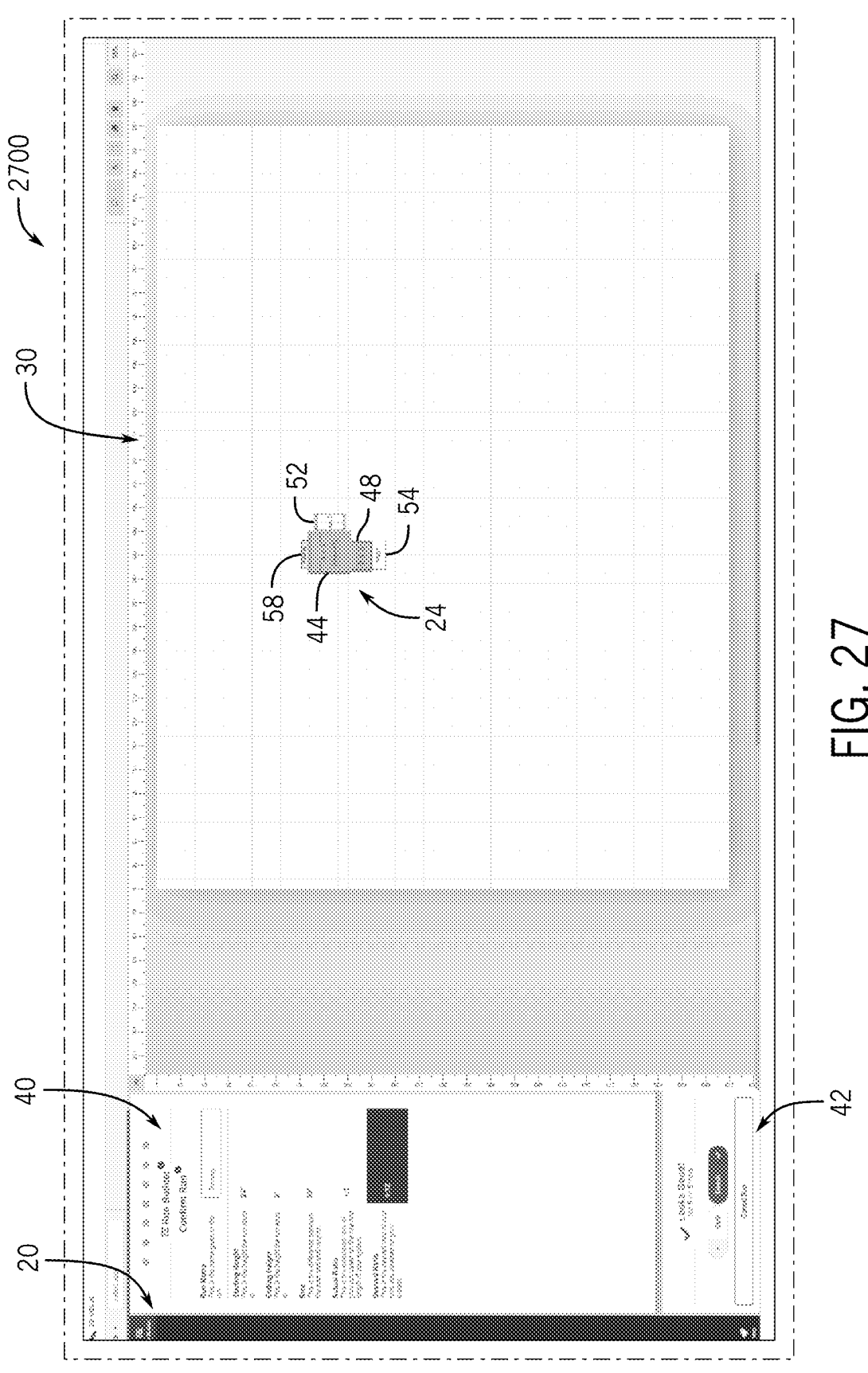

In a next step shown in the exemplary screenshot 2600 in FIG. 26, the run builder module 198 analyzes the ratio of the selected run of the accessibility system and displays the results in the second side container window 40. For instance, the run builder module 198 may generate feedback data indicating an actual ratio compared to a desired ratio.

In the exemplary screenshot 2600 depicted in FIG. 6, the selected run includes parts 44 and 48, a start/top height of ninety inches, and an ending height of 2 inches. As such, the run builder module 198 displays that the actual ratio of the run is 0, wherein the desired ratio is 1:12. Other information may also be displayed, such as the slope, the rise of the run, the run name, etc. In the exemplary screenshot 2600 depicted in FIG. 26, the selected run has a slope that is greater than 1, which generates a warning/error by the run builder module 198 displayed in the second side container window 40.

The run builder module 198 displays this resultant information in the second side container window 40 so that, if desired, the user can go back and modify the stencil design to achieve the desired ratio. In that regard, the user can select either a "Back" button, a "Finish" button, a "Cancel" button, or the like in the third side container window 42 to either fix the ratio of the run or to continue with the run as currently designed (knowing the ratio is different than what was intended).

If the "Back" or "Cancel" button is selected, the client application 102 may direct the user back to the beginning of the run builder module 198 to enter a different start/end height, to select different parts for the run, etc. The run builder module 198 can then analyze the slope ratio of the updated run and display the results in the second side container window 40, as shown in the exemplary screenshot 2700 depicted in FIG. 27. In the alternative, the client application 102 may direct the user back to the main menu (such as that shown in the first side container window 20 of the exemplary screenshot 500 of FIG. 5) to change any parts in the stencil design.

Figure 28:
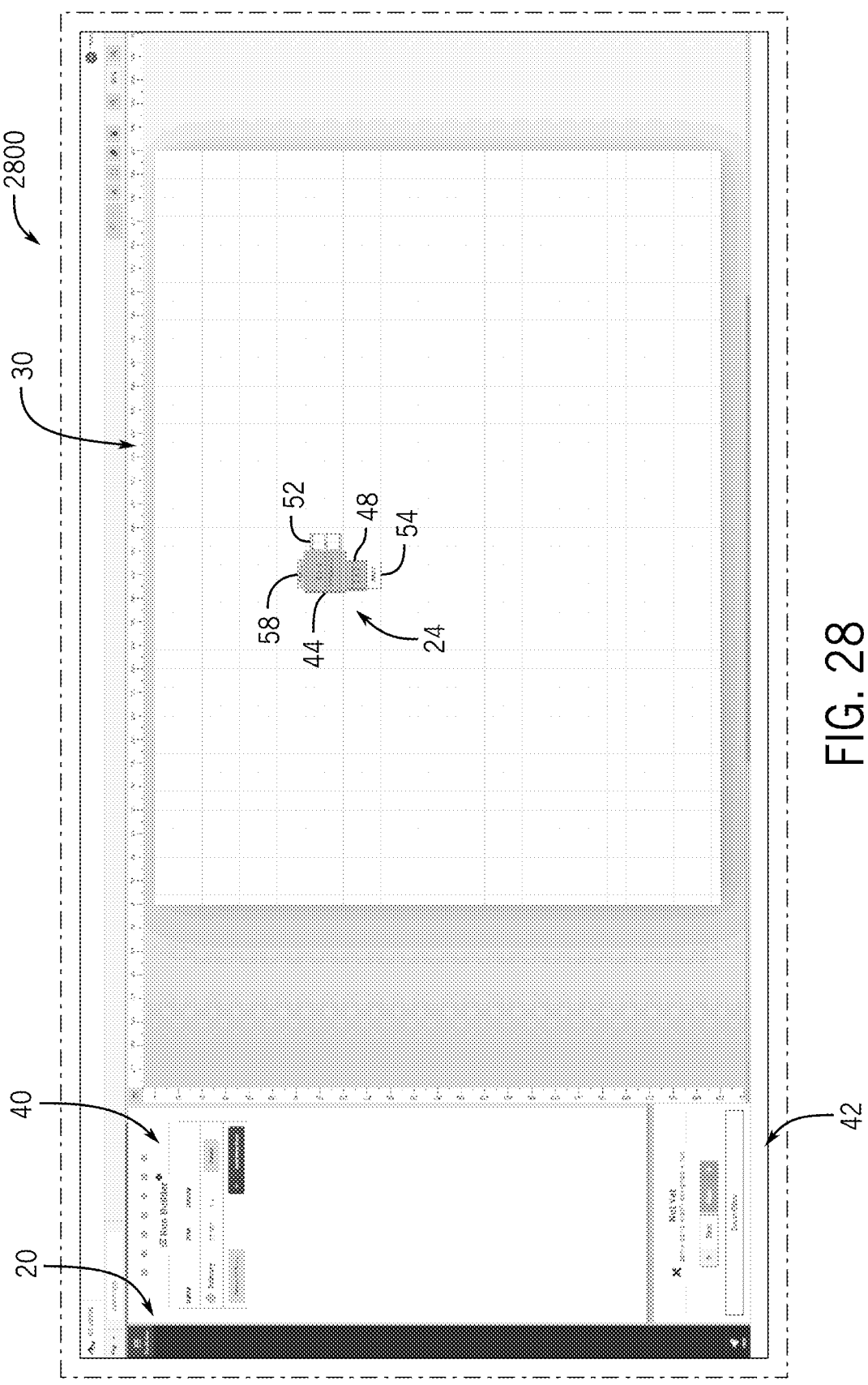
Figure 29:
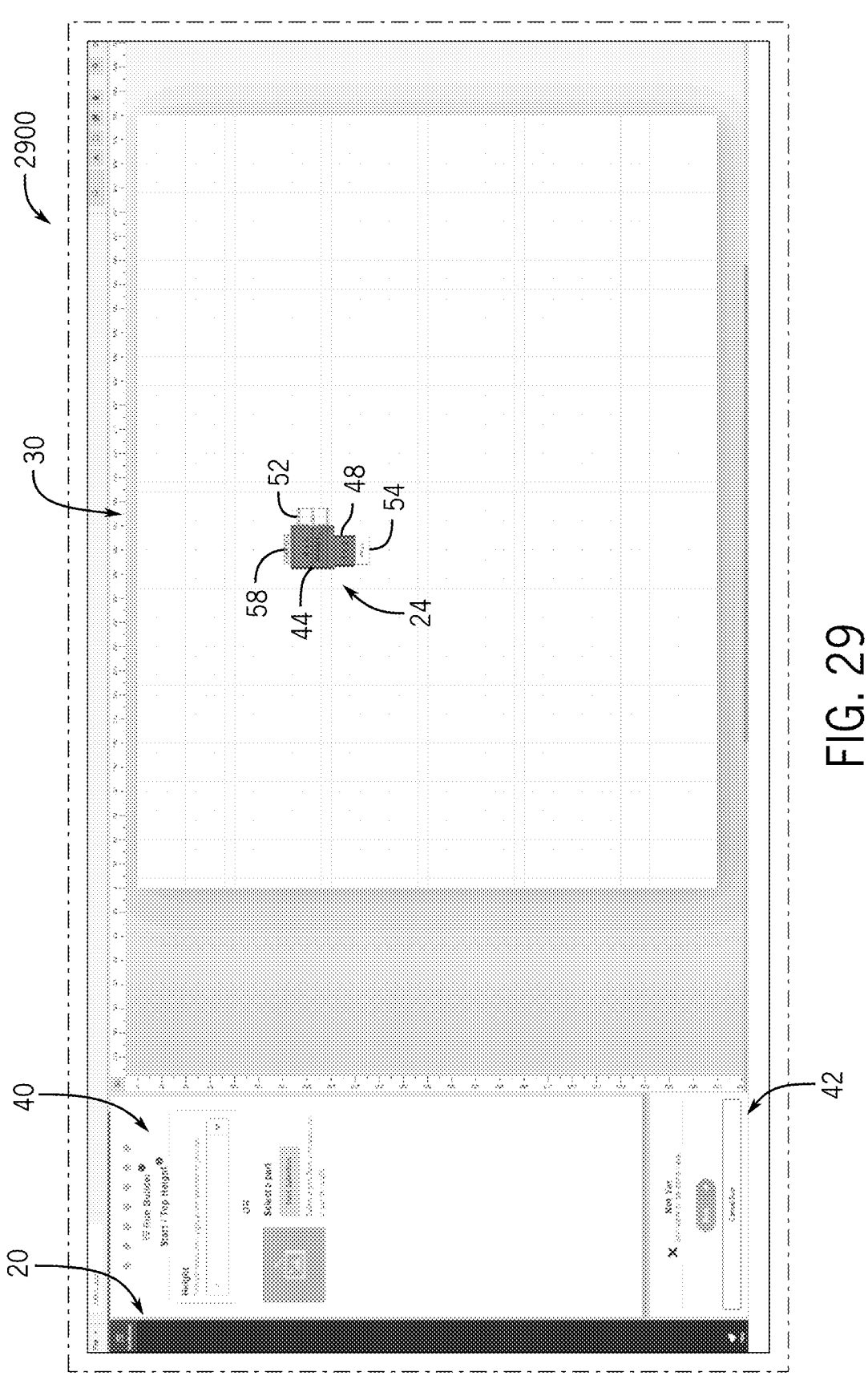
Figure 30:
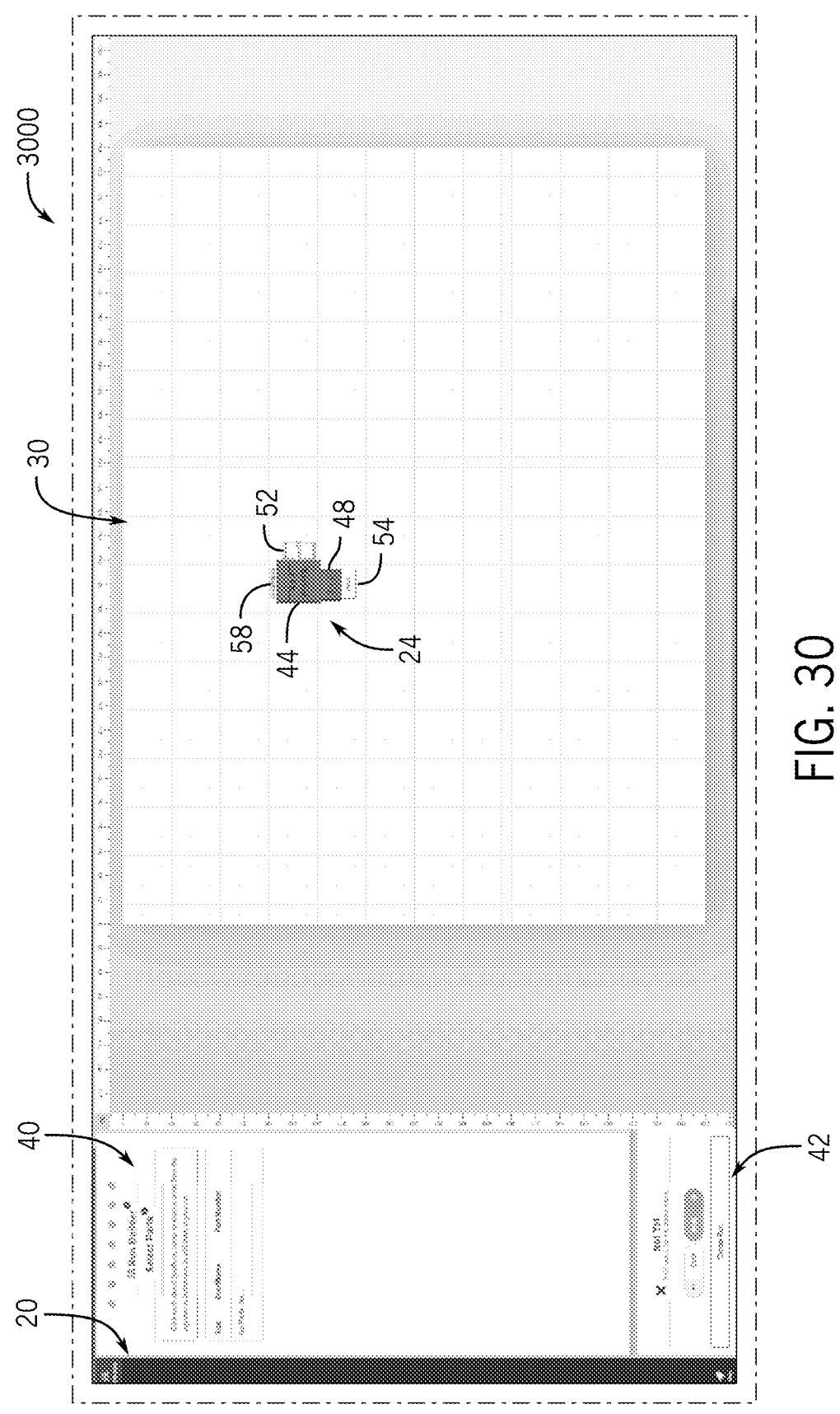
Figure 31:
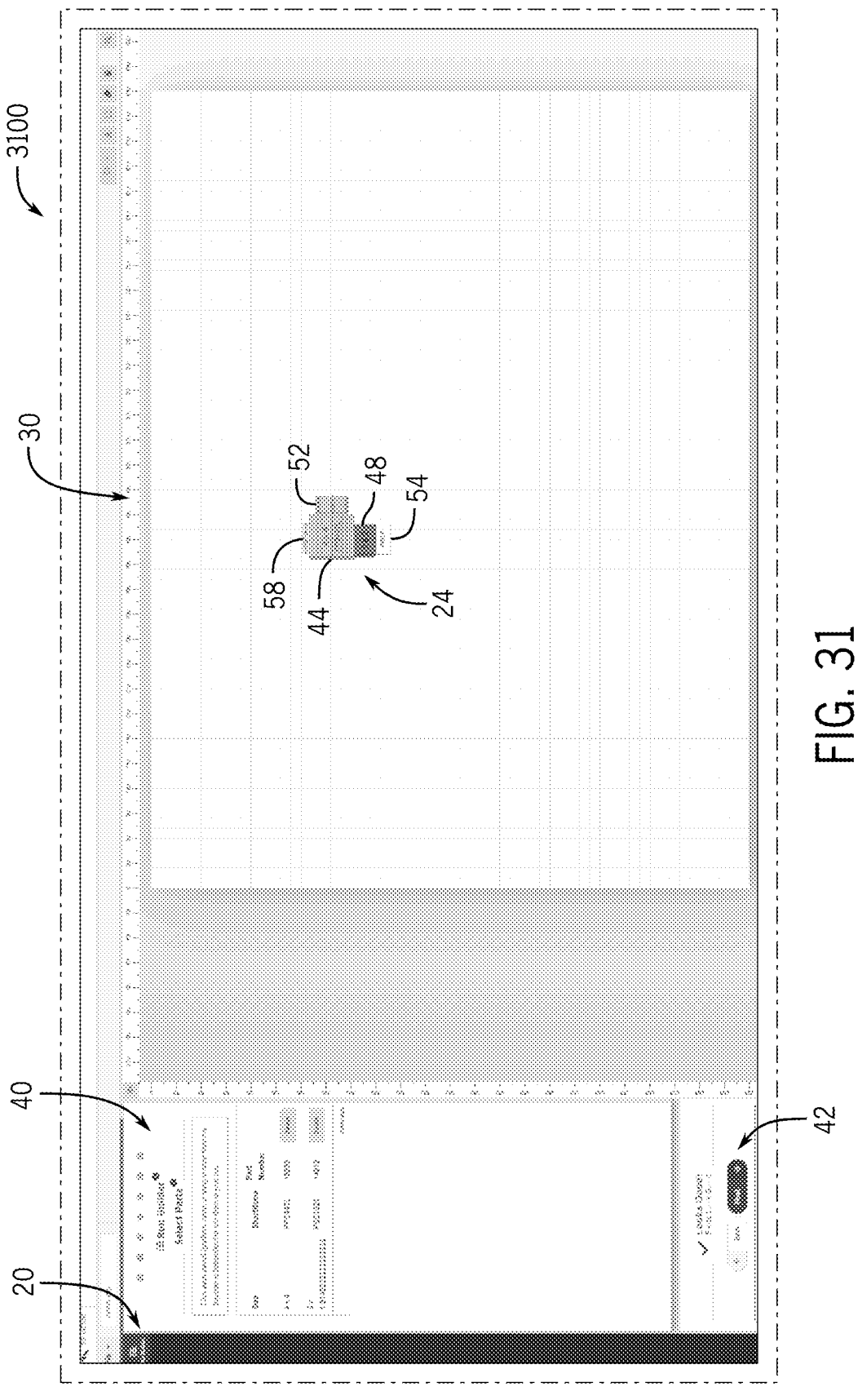
Figure 32:
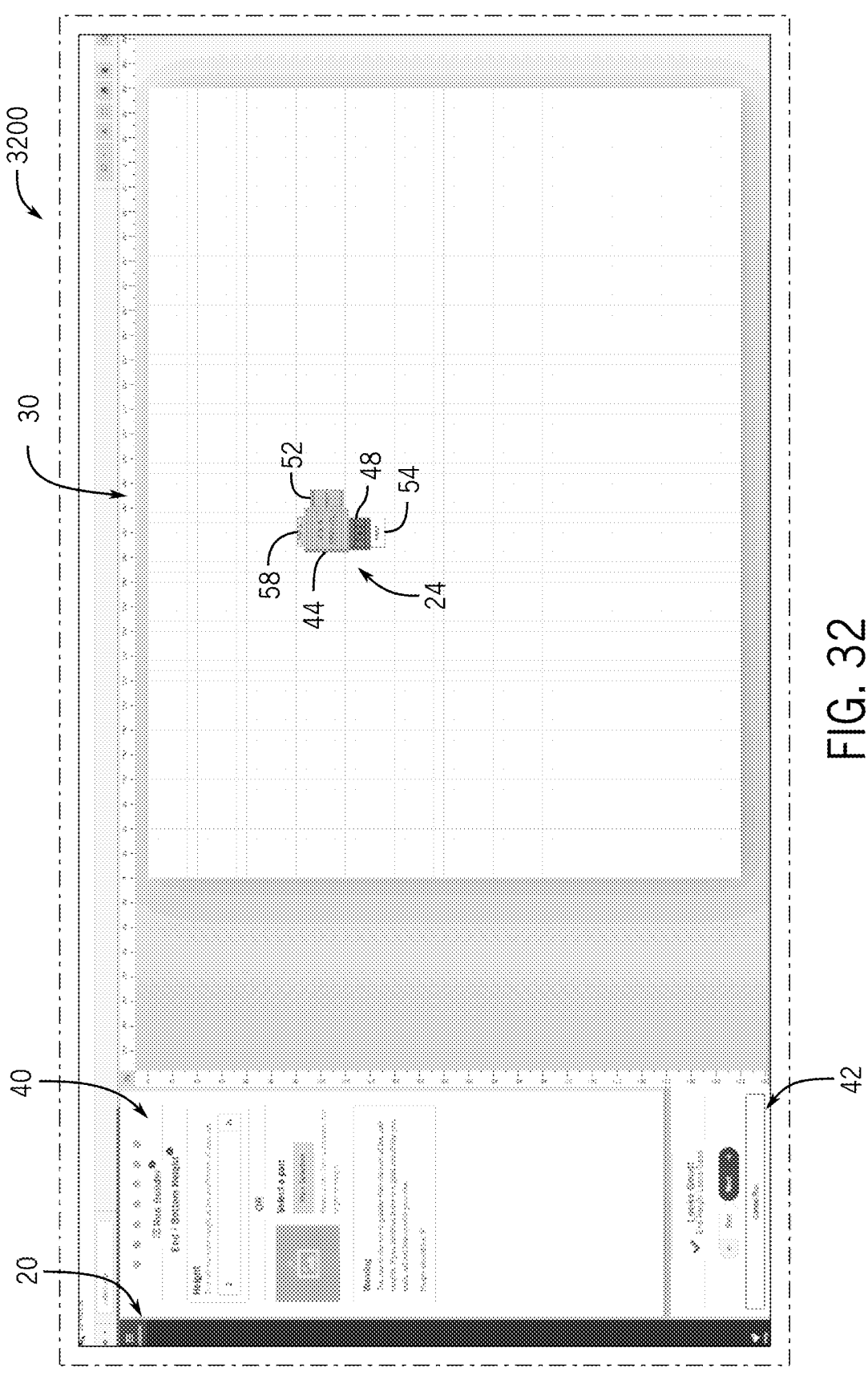

If the user continues with the run as currently designed, the overall results of the run builder module 198 may be displayed in the second side container window 40, such as shown in the exemplary screenshot 2800 of FIG. 28. The user will also have the option to add a new run to be analyzed by the run builder module 198 by selecting "Add New Run" or the like in the second side container window 40. After selecting "Add New Run" or the like, the start/top height may be entered into a text box (see FIG. 29), the parts may be selected for the run (see FIGS. 30 and 31), and the end/bottom height may be entered into a text box (see FIG. 32). As can be seen in FIGS. 29 and 32, the start/top and/or end/bottom height may instead be inputted by selecting a part of a previous run having a defined height.

In the exemplary screenshot 3200 depicted in FIG. 32, the run selected for analysis includes a stair part 52. In this regard, when a height of 2 inches is entered into a text box for the end/bottom height, a warning is displayed in the second side container window 40 indicating that the rise of the run is greater than the sum of the stair heights. In this regard, the run builder module 192 analyzes the start/top and/or end/bottom height and provides feedback indicating whether the start and/or end/bottom height accommodates the parts in the run. For instance, in some aspects, the run builder module 192 may automatically lock the end/bottom height to equal the start/top height if the run only has platforms.

Figure 33:
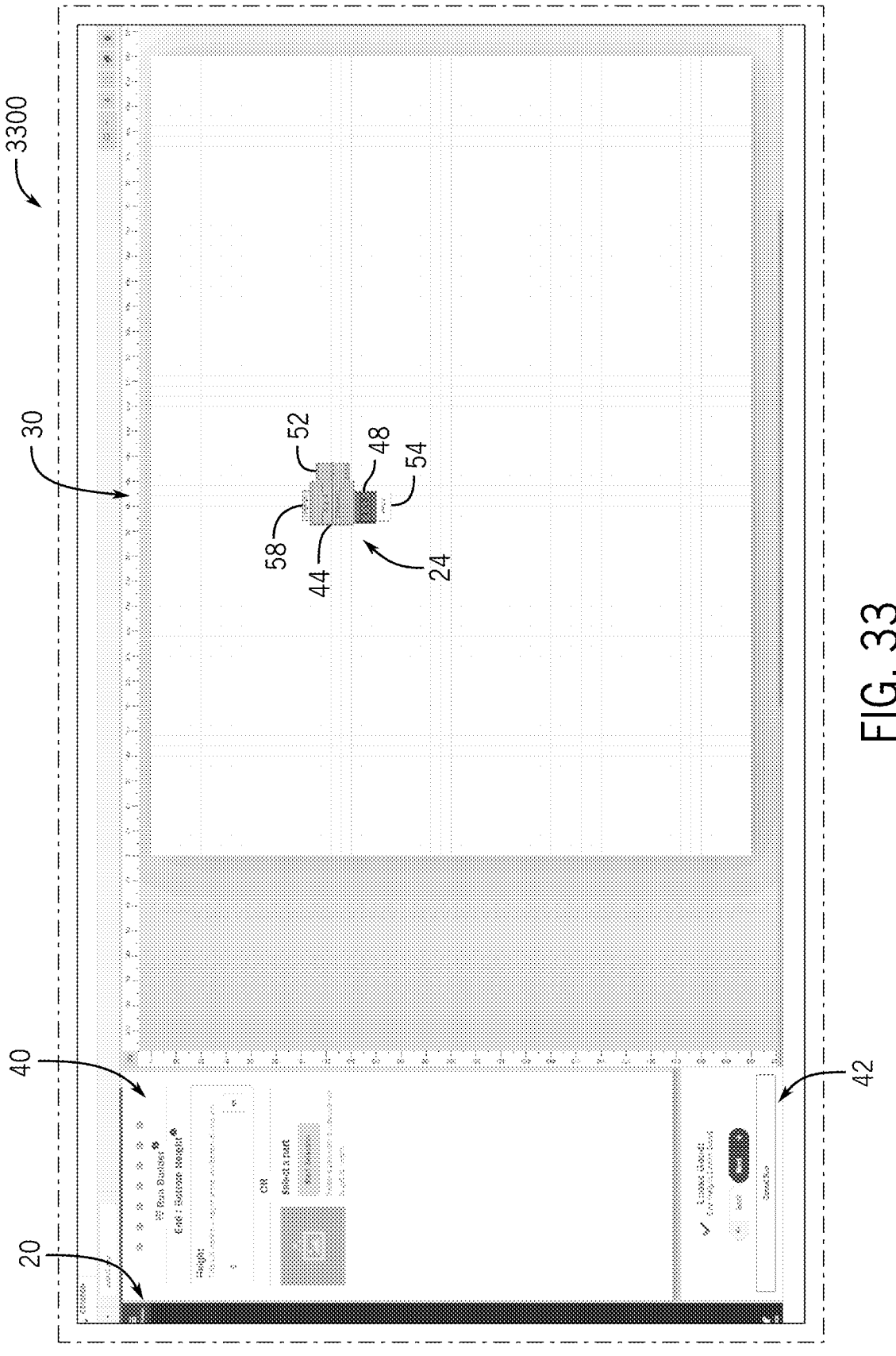
Figure 34:
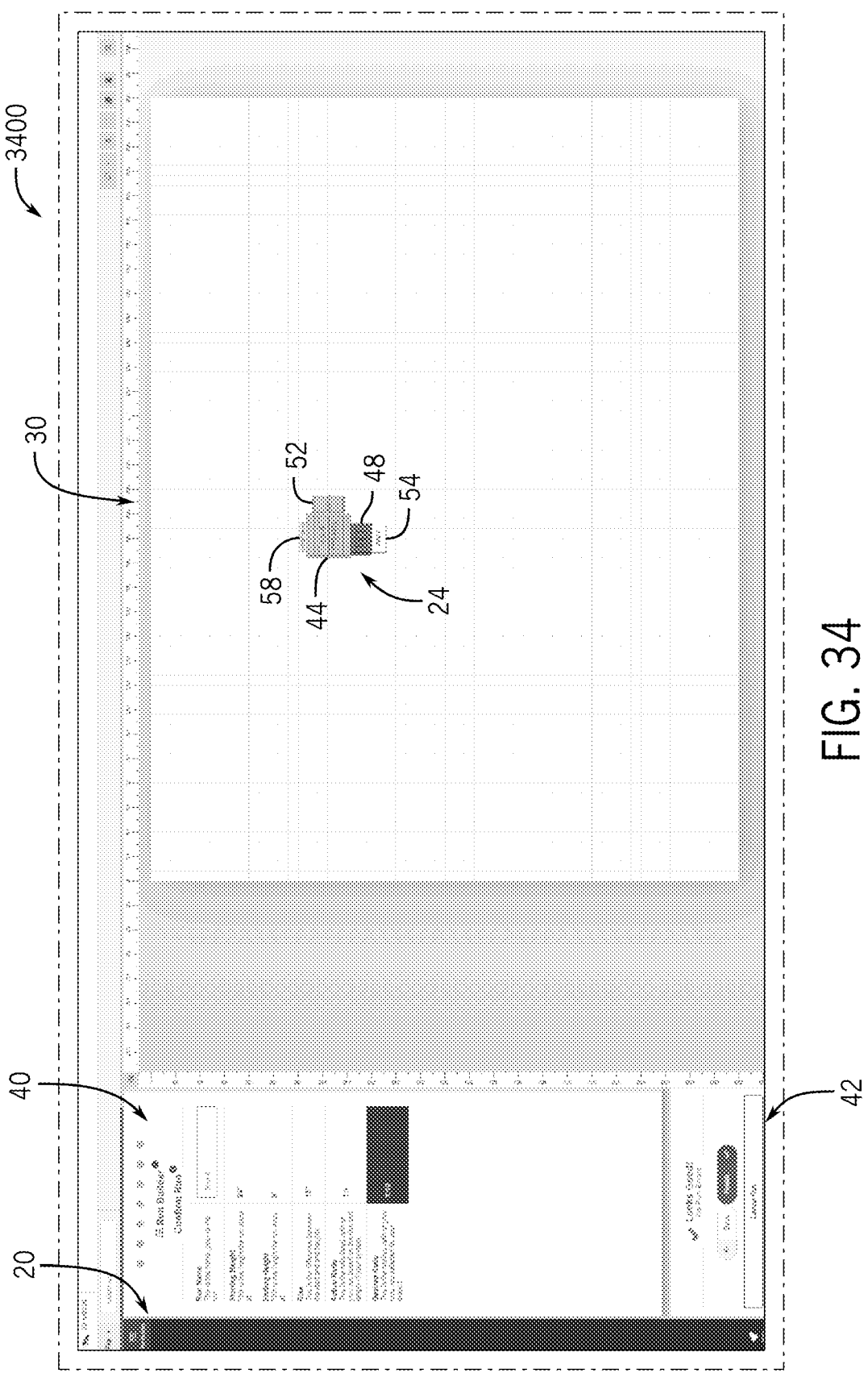
Figure 35:
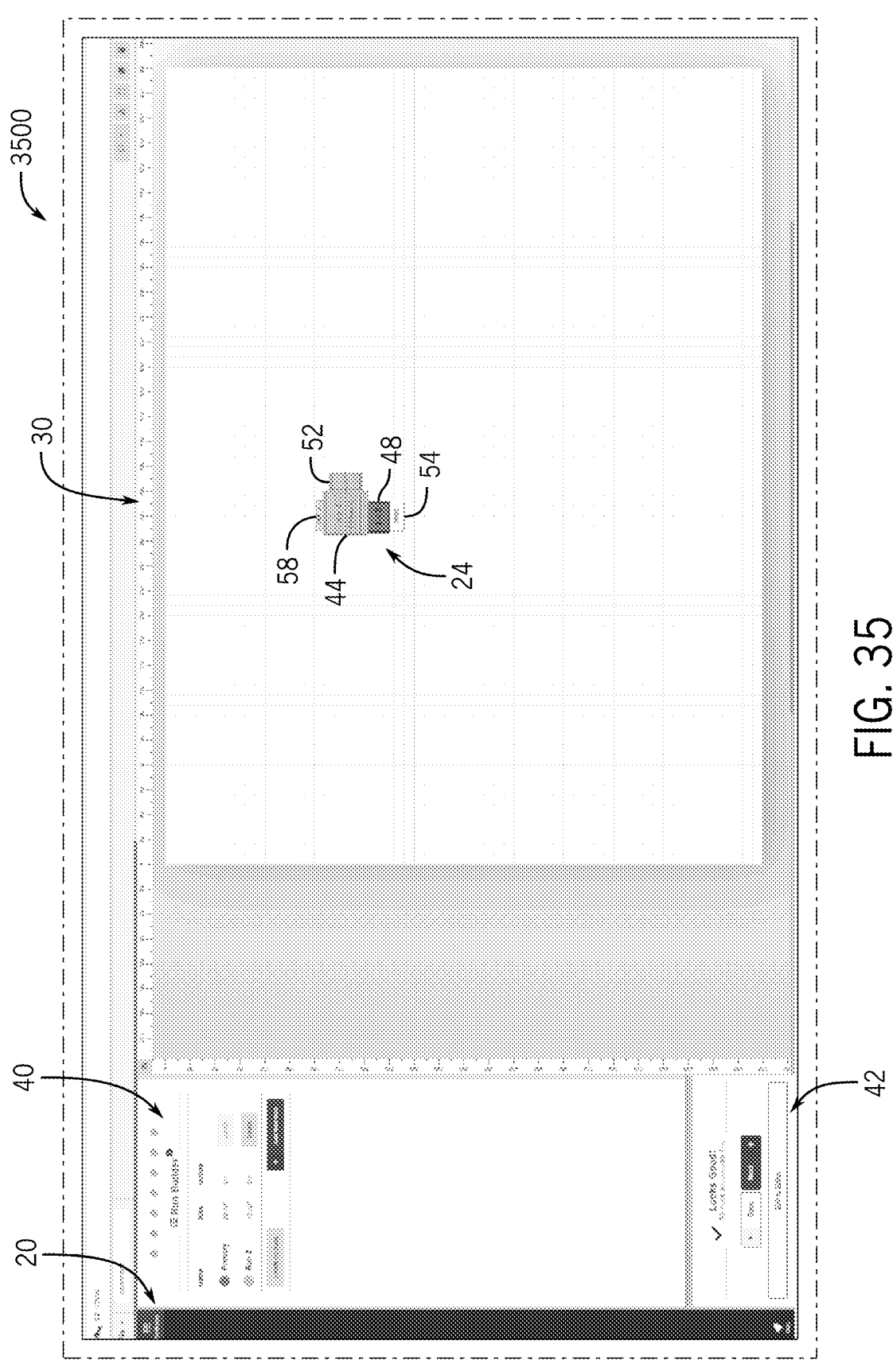

In response to the feedback, a height of 0 inches is instead entered into a text box for the end/bottom height, as shown in the exemplary screenshot 3300 depicted in FIG. 33. After clicking the "Next" button in the third side container window 42, the run builder module 198 analyzes the selected run and displays the results in the second side container window 40, as shown in the exemplary screenshot 3400 depicted in FIG. 34. For instance, the run builder module 198 may generate feedback data indicating an actual ratio compared to a desired ratio. The user may either change the run or continue with the run as currently designed, after which the overall results of the run builder module 198 may be displayed in the second side container window 40, such as shown in the exemplary screenshot 3500 of FIG. 35.

Figure 47:
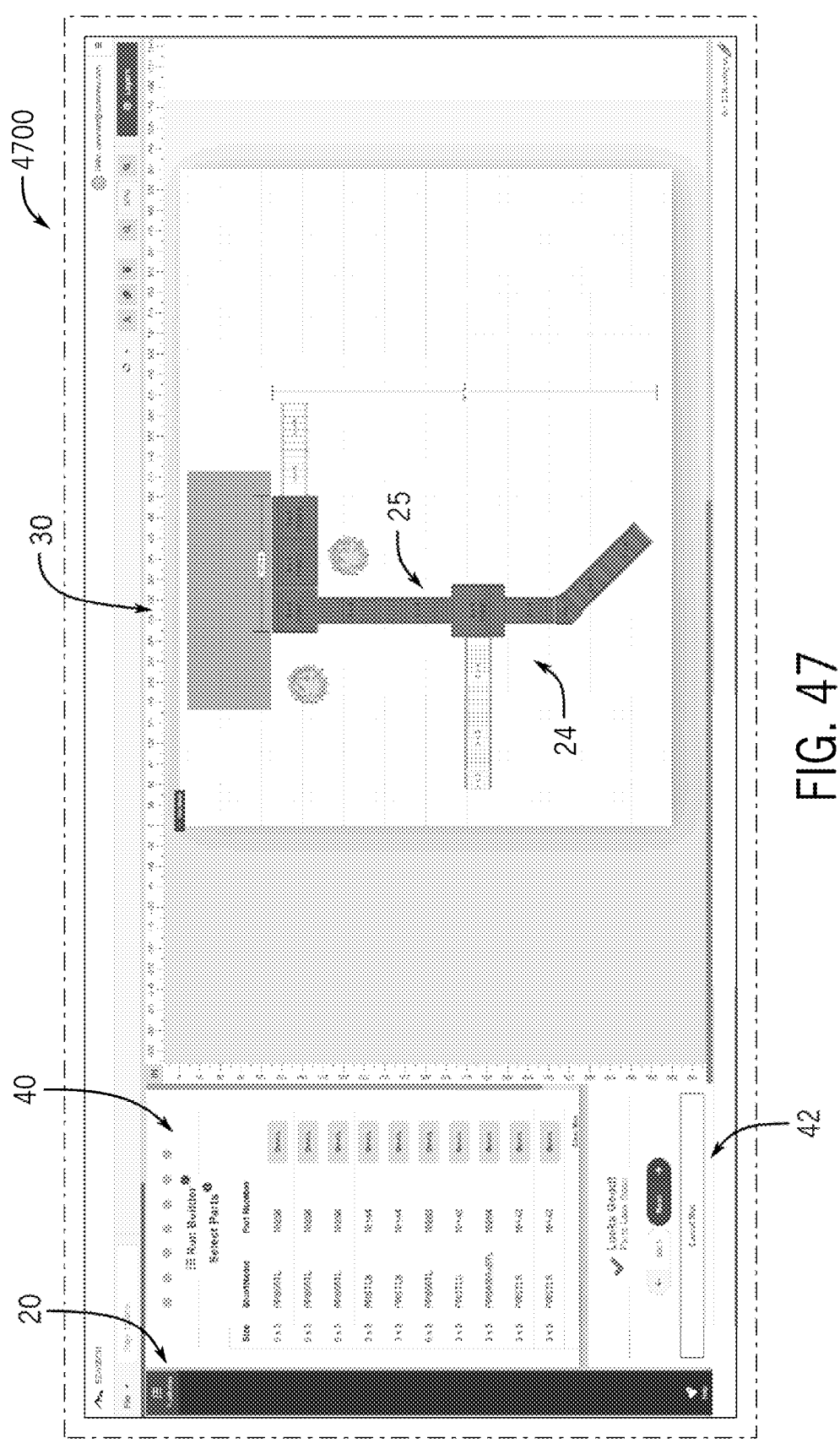
Figure 48:
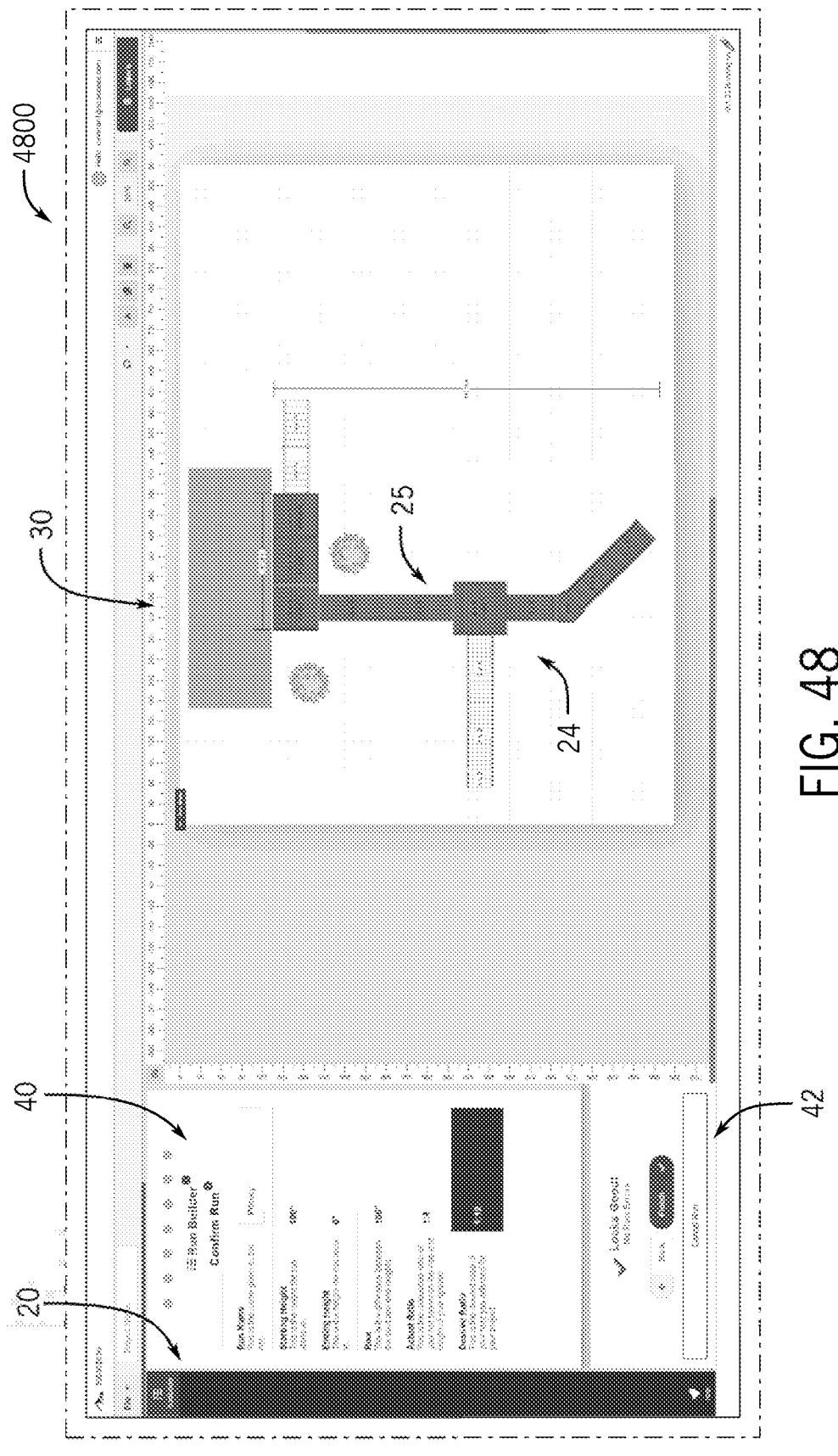
Figure 49:
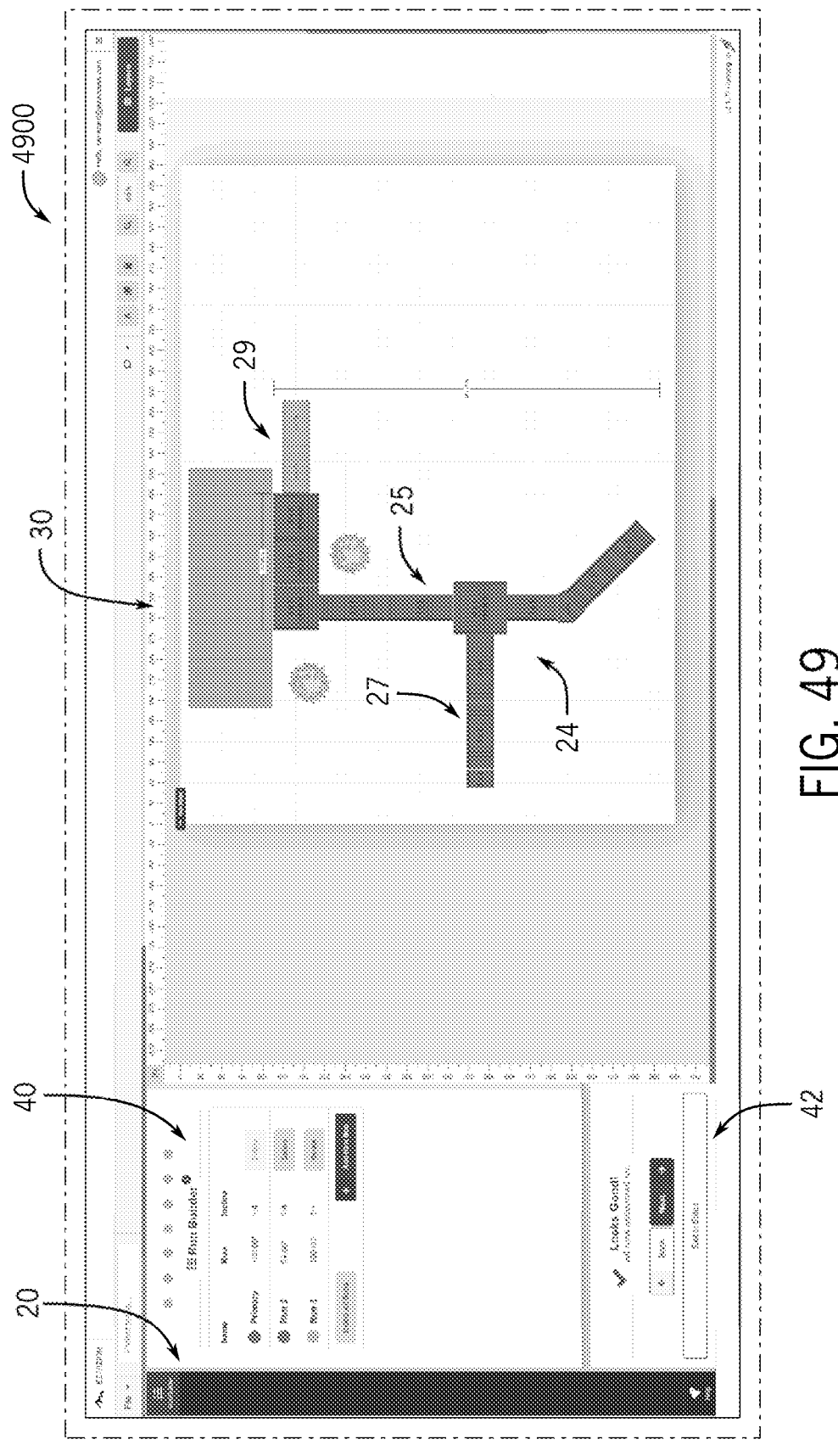

FIGS. 46-50 depict alternative exemplary screen shots of exemplary GUI displays showing other stencil designs analyzed by the run builder module 198. The exemplary screenshot 4600 depicted in FIG. 46, for instance, shows a start/top height of fifty-four inches inputted for a first run (such as after clicking on "Add New Run" in a previous screen). The exemplary screen shot 4700 of FIG. 47 shows a selection of components for the first run 25 to be analyzed. The exemplary screen shot 4800 of FIG. 48 shows an analysis of the ratio of the first run displayed in the second side container window 40 (e.g., a rise, an actual ratio compared to a desired ratio, etc.), which may be completed after inputting an end/bottom height (not shown). The exemplary screen shot 4900 of FIG. 49 shows analysis results of a primary run, a second run ("Run 2"), and a third run ("Run 3") after the second and third runs were added for analysis by the run builder module 198 (not shown).

Figure 57:
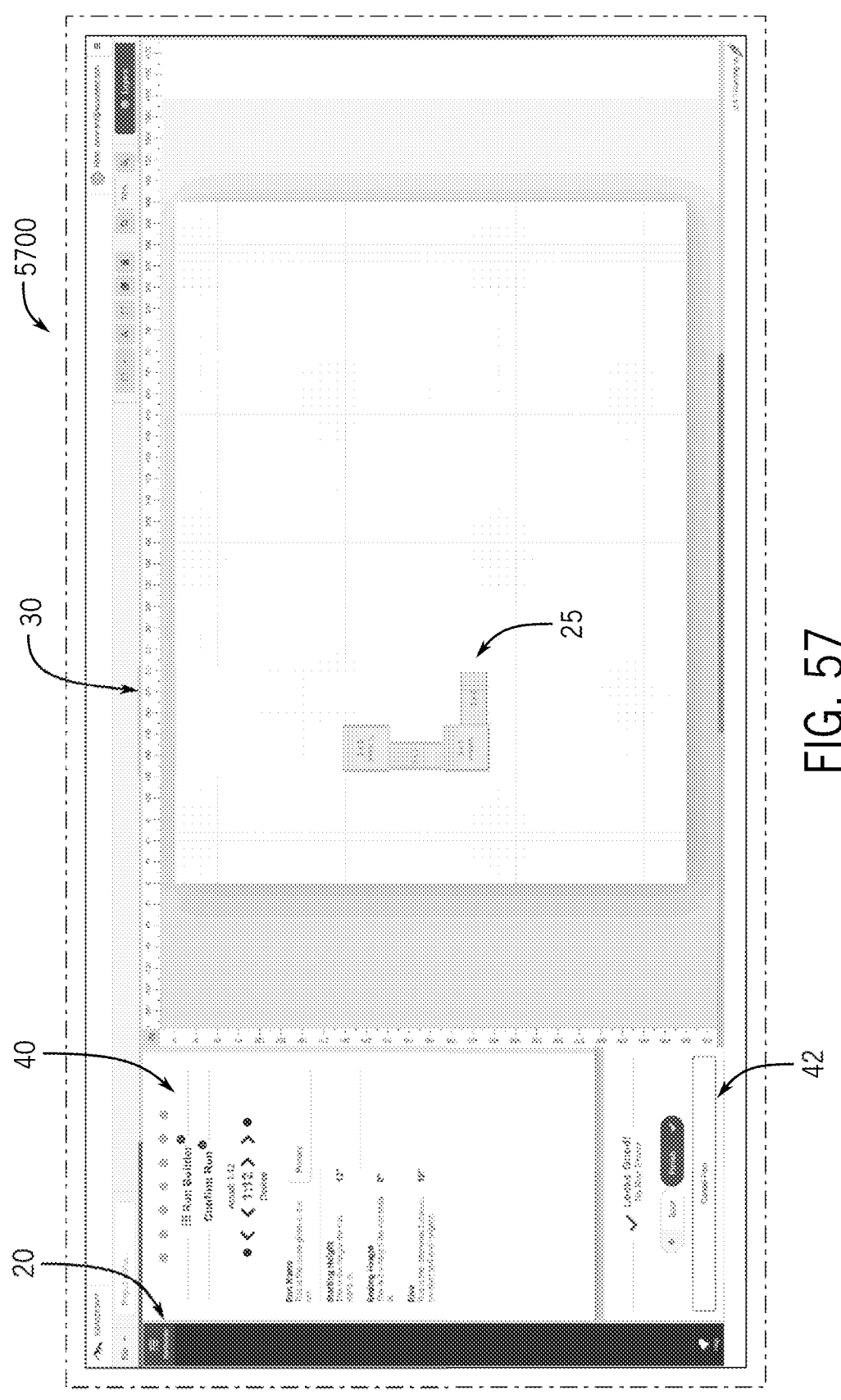
Figure 58:
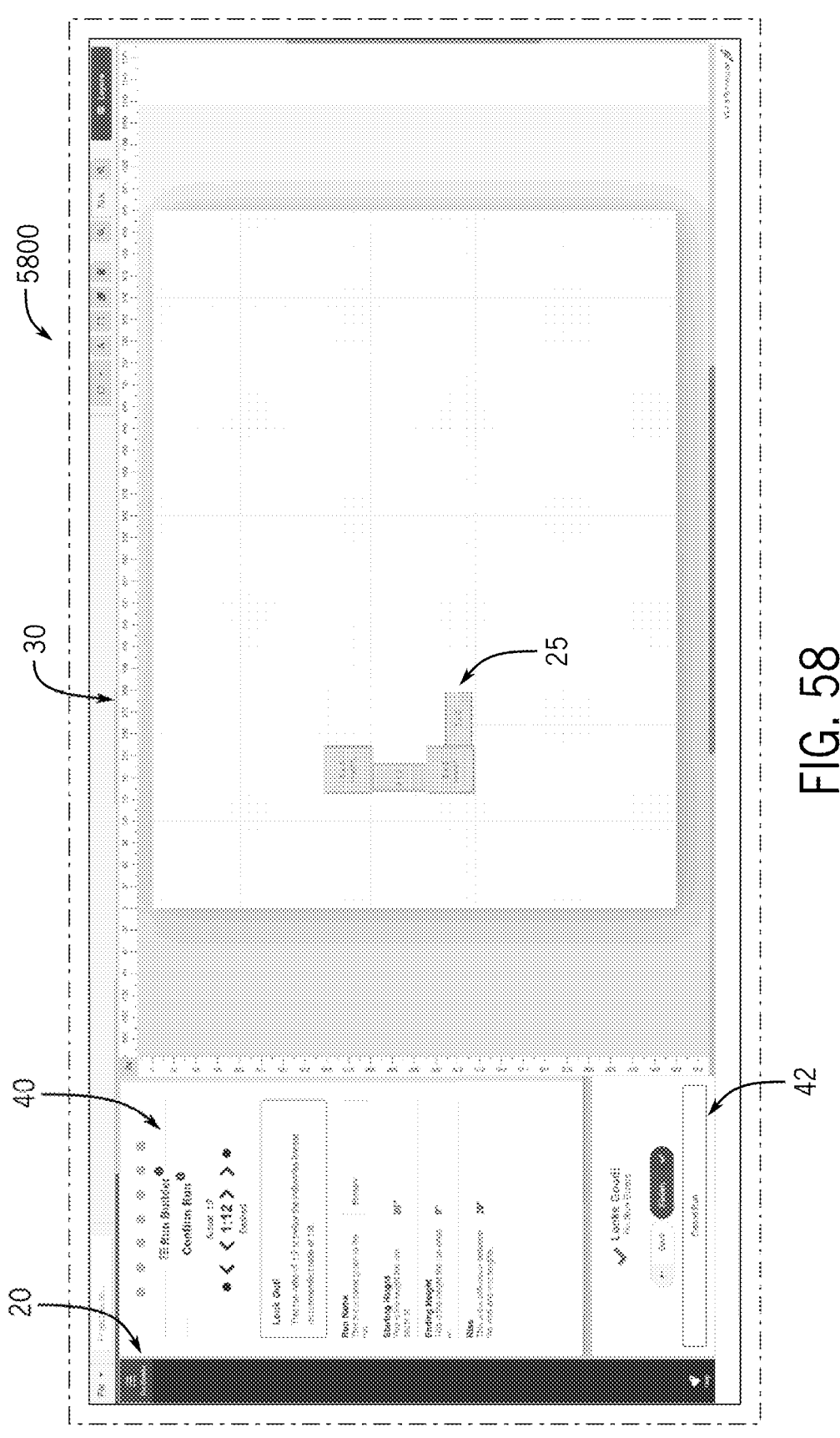
Figure 59:
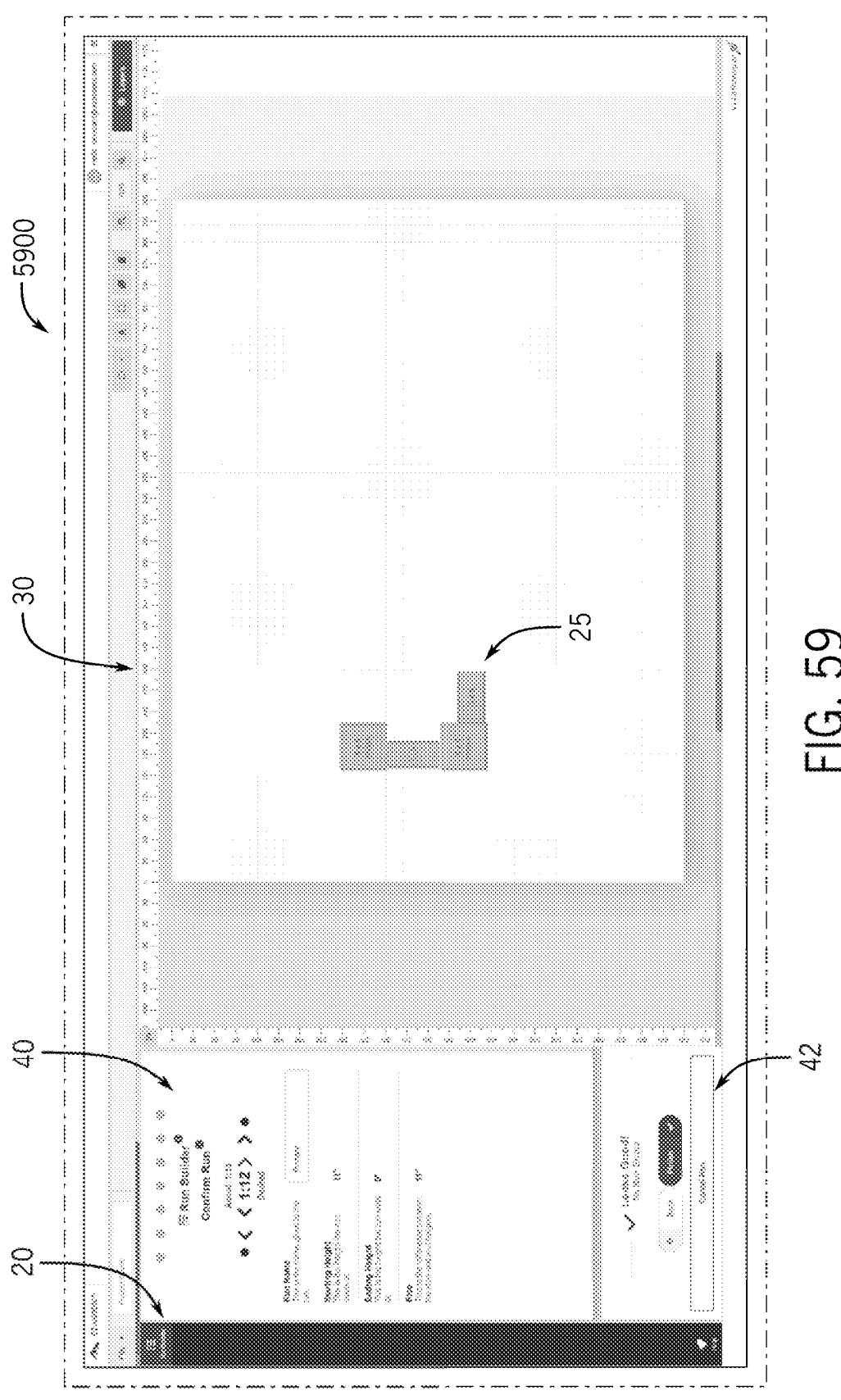

FIGS. 57-59 depict yet further alternative exemplary screen shots of exemplary GUI displays showing other stencil designs analyzed by the run builder module 198. The exemplary screenshot 5700 depicted in FIG. 57, for instance, shows a start/top height of 12 inches, an ending height of 0 inches for a run 25, and an analysis of the ratio of the run 25 displayed in the second side container window 40 (e.g., a rise, an actual ratio compared to a desired ratio, etc.). For instance, for the run 25, the actual ratio and desired ratio are both 1:12. The text "1:12" may be displayed in green to indicate that the actual ratio matches the desired ratio.

The exemplary screen shot 5800 of FIG. 58 shows analysis results of a run 25 having a start/top height of twenty inches and an ending height of 0 inches. An analysis of the ratio of the run 25 is displayed in the second side container window 40 indicating that the actual ratio is 1:7 and the desired ratio is 1:12. Because the slope is steeper than desired (e.g., the slope or rise is twenty inches, which is greater than the desired rise of twelve inches) the text "1:7" or "1:12" may be displayed in red to indicate that the slope is too steep. Further, when the slope of the run is steeper than desired, a warning may be provided in the second side container window 40 (e.g., "Look Out! This run ratio of 1:7 is below the industry lowest recommended ratio of 1:8"). Any other indicators may also be used to indicate that the actual ratio does match the desired ratio and/or that the slope is too steep.

The exemplary screen shot 5900 of FIG. 59 shows analysis results of a run 25 having a start/top height of 11 inches and an ending height of 0 inches. An analysis of the ratio of the run 25 is displayed in the second side container window 40 indicating that the actual ratio is 1:13 and the desired ratio is 1:12. The text "1:13" or "1:12" may be displayed in green to indicate that the slope is less steep than desired. Any other indicators may also be used to indicate that the actual ratio sufficiently matches the desired ratio and/or that the slope is acceptable.

Figure 50:
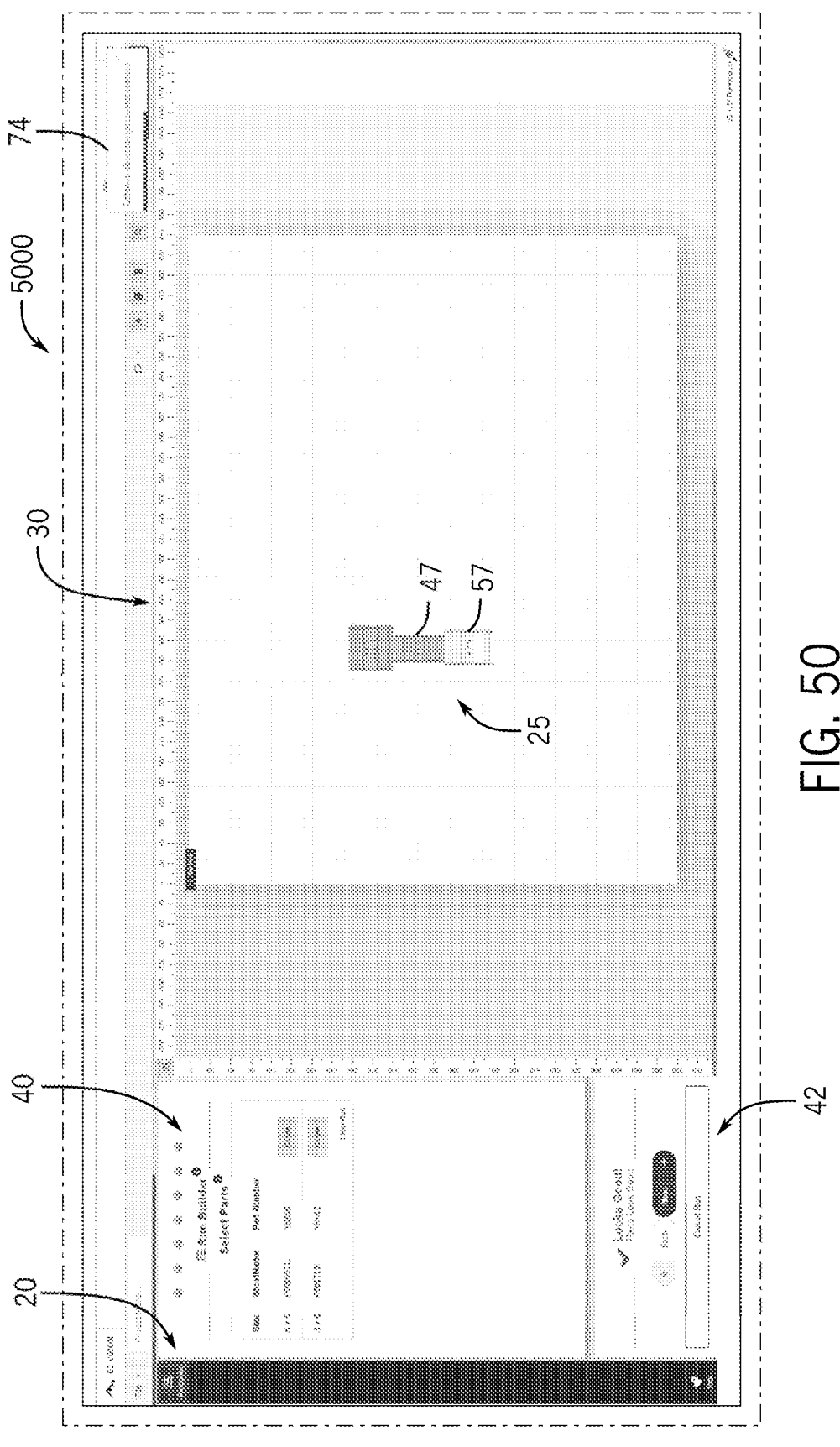

The exemplary screen shot 5000 of FIG. 50 shows an alternate example selection of components for a first run 25 to be analyzed. In this example, an error message 74 is displayed at the top right-hand corner of the screenshot indicating that components 47 and 57 cannot connect after clicking on each component. Specifically, the error message 74 indicates that components 47 and 57 cannot connect because they are different sized ramps. The error message 74 may be generated by running a connections module 202 in parallel with the run builder module 198. In that regard, it should be appreciated that some or all the modules of the client application 102 may be run in parallel and/or in the background of any other module being used, and any necessary warnings or other feedback may be displayed in one or more of the side container windows or the main container window of the screen shot currently displayed.

Figure 60:
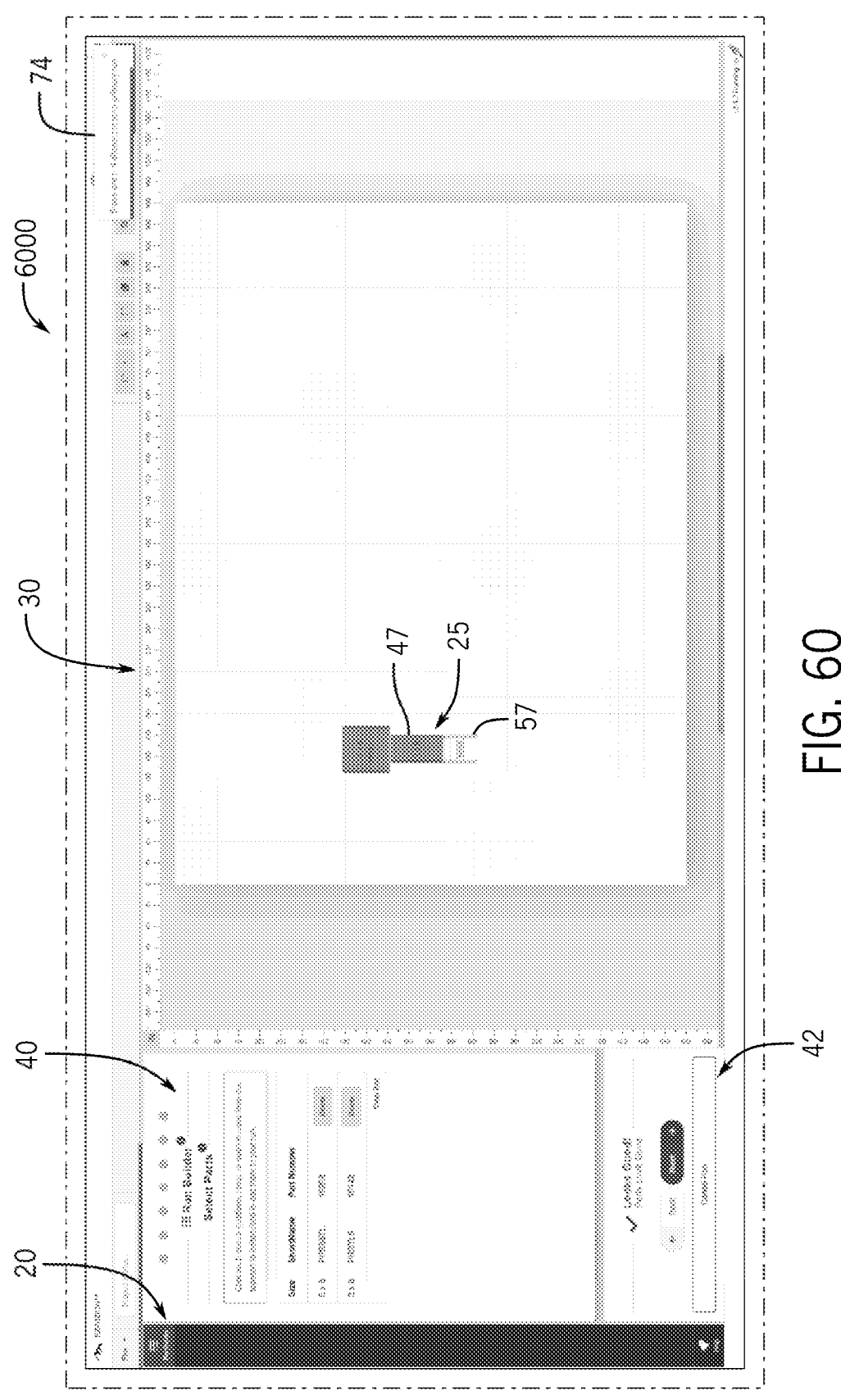

In another example shown in FIG. 60, an error message 74 is displayed at the top right-hand corner of a screenshot 6000 indicating that components 47 and 57 cannot connect because stairs (component 57) are not allowed in the primary run if a ramp is part of the system. In other examples, an error may be generated by the run builder module 198 indicating one or more of the following (after clicking on components in the run):

Stairs and ramps not allowed in same run

Parts have different sized ramp widths

A 45 degree platform cannot start a run

A 45 degree platform cannot connect to standard platforms.

A starter ramp must be at the end of a run (such as for a commercial run).

A run cannot have a part with child rails and a part without child rails (such as for a commercial run)

Any other errors may also be generated by the run builder module 198.

Figure 36:
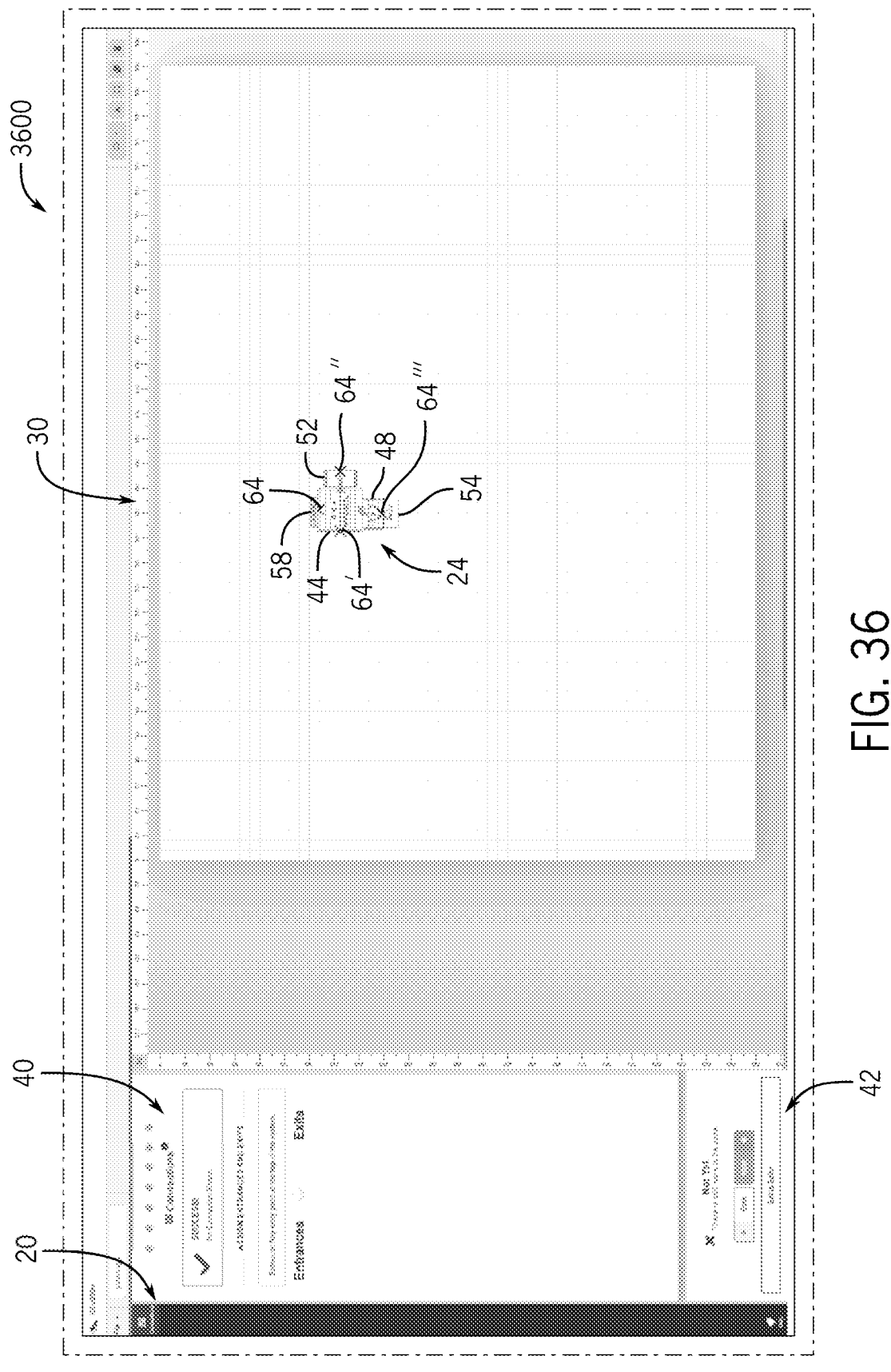

Turning back to the exemplary screen shot 3600 of FIG. 36, after running the run builder module 198, the client application 102 may run a connections module 202 (see FIG. 2 and the "Connections" menu item displayed at the top of the first side container window 20). The connections module 202 may essentially create a connection web between the different components of the accessibility system. In creating this connection web, the connections module 202 may generate feedback data if one or more components is incompatible with any adjacent components in the run. The connections module 202 may also be used to assign an entrance or an exit for the system and generate feedback data indicating which components of the accessibility system may be assigned as an entrance or an exit.

For instance, in a first step, the connections module 202 displays an option to "Assign Entrances and Exits" to the system by clicking a slide button in the second side container window 40. After clicking on "Entrances", for instance, the user may assign an entrance(s) for the system. Text in the second side container window 40 may indicate that an entrance may be defined at any entry point at the top of the system to give guidance to the user.

Figure 37:
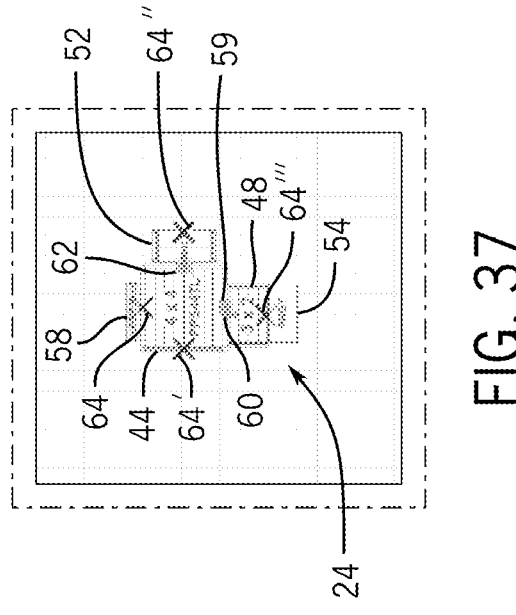
Figure 38:
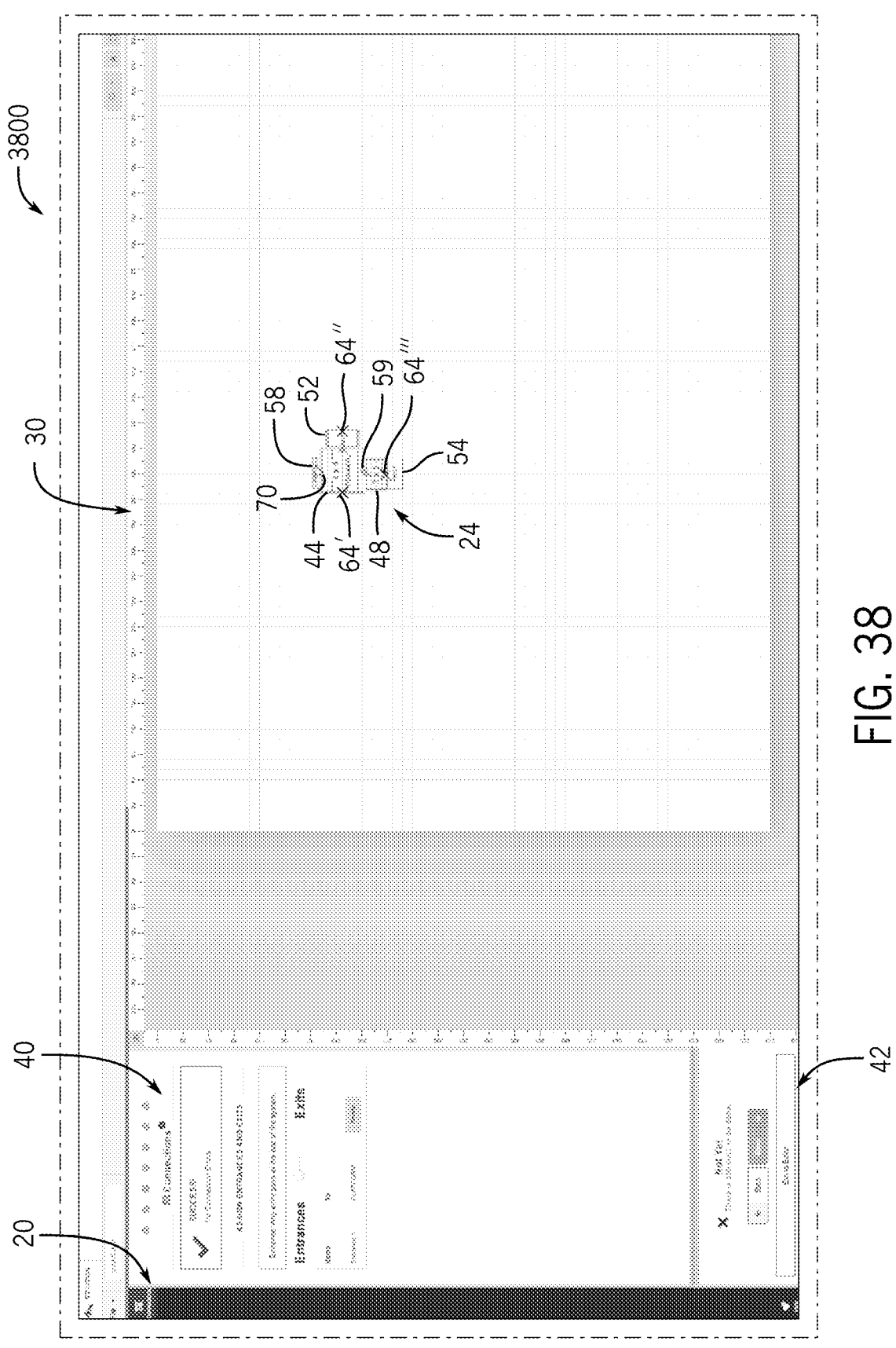

Potential entrances may be marked by an initial indicator (such as an "X" or similar), and a user can click on the initial indicator to define it as an entrance. For instance, as shown in the exemplary screen shot 3600 of FIG. 36, first, second, third, and fourth initial indicators 64, 64', 64", and 64'" are provided as potential entrances for the system. FIG. 37 shows an enlarged graphical depiction of the system shown in the exemplary screen shot 3600 of FIG. 36. Referring to the exemplary screen shot 3800 of FIG. 38, the user has clicked on the first initial indicator 64 (see FIG. 36) to change the initial indicator to a first entrance indicator 70.

Figure 39:
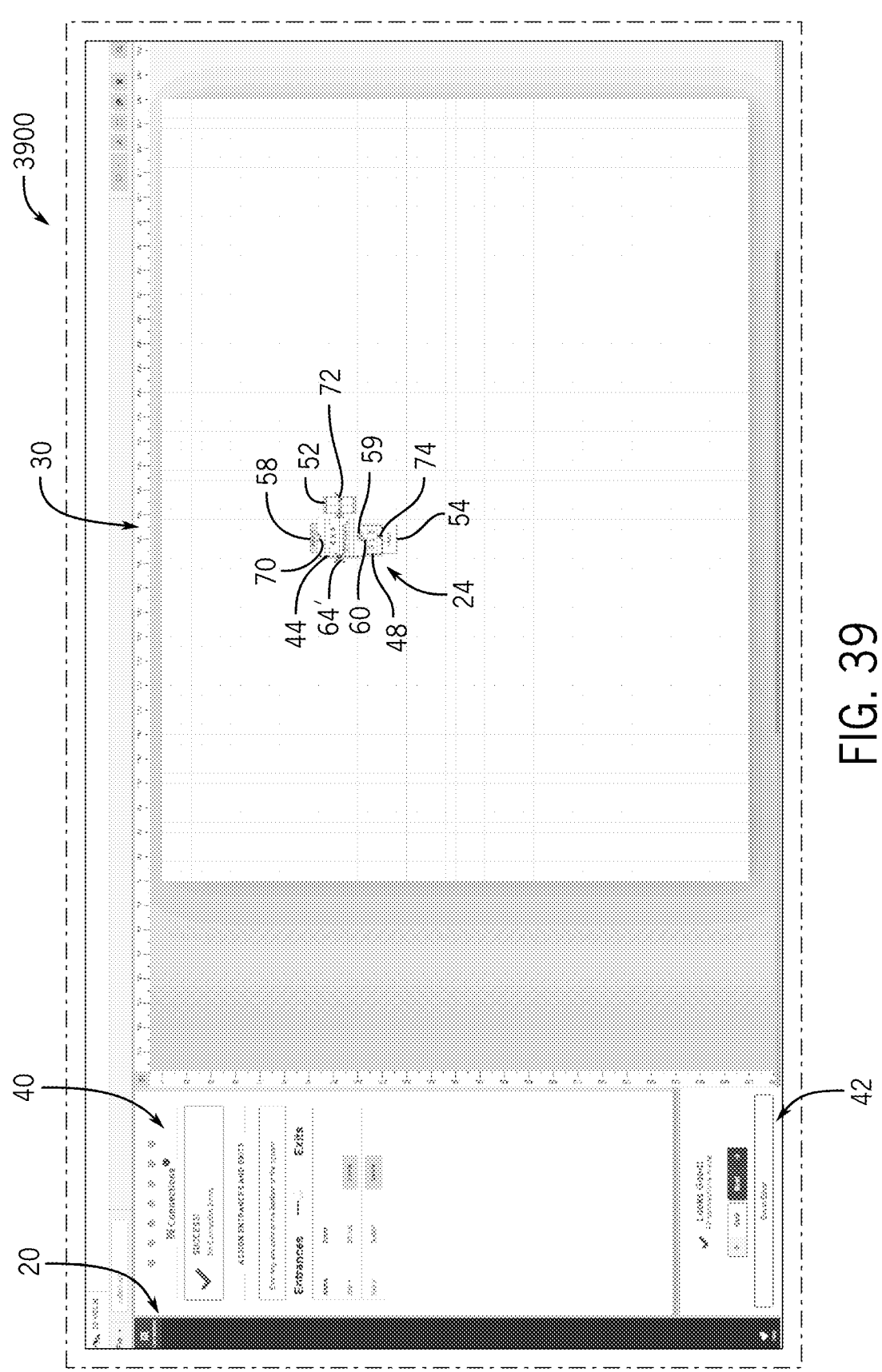

Referring to the exemplary screen shot 3900 of FIG. 39, in a next step, the user may select "Exits", for instance, to assign an exit(s) for the system. Text in the second side container window 40 may indicate that an exit may be defined at the bottom of the system to give guidance to the user.

Potential exits may be marked by an initial indicator (such as an "X" or similar), and a user can click on the initial indicator to define it as an exit (see the second initial indicator 64' provided as a potential exit for the system). In the exemplary screen shot 3900 of FIG. 39, the user has defined first, second, and third exits marked by corresponding exit indicators 70, 72, and 74 for the system.

Figure 61:
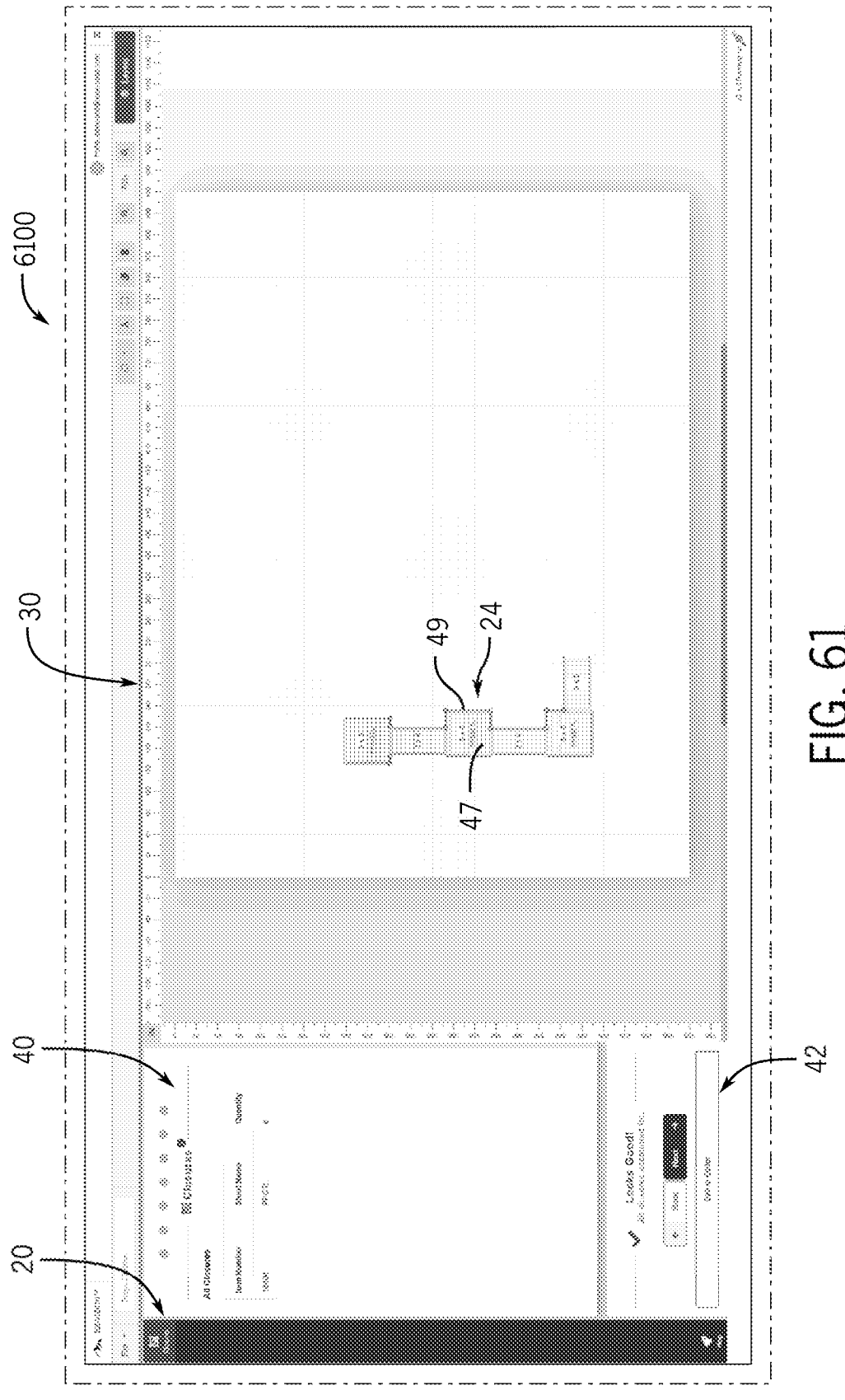

In some examples, the connections module 202 may generate feedback data indicating where certain components should be closed off for safety. For instance, in the exemplary screen shot 6100 of FIG. 61, the connections module 202 has indicated with an indicator 49 that component 47 should include a closure along at least a right side of the component. It should be appreciated that such closure indicators may instead be generated by the handrail builder module 194.

As noted above, the connections module 202 may also be configured to generate feedback data if one or more components is incompatible with any adjacent component(s) in the run. In that regard, the connections module 202 may generate feedback data regarding the connectability of adjacent components of the accessibility system.

For instance, the connections module 202 may receive a location placement selection of a component of the accessibility system relative to a location of at least one other component, and the connections module 202 may generate feedback data indicating whether the component can be placed in the selected location relative to the at least one other component. Referring to the exemplary screen shots 3600, 3800, and 3900 of FIGS. 36, 38, and 39, the connections module 202 has analyzed adjacent parts in the run and determined that the adjacent components have a proper connection. As a result, a message may be displayed in the corresponding second side container window 40 indicating that no connection errors were found (or similar).

In addition, the connections module 202 may display a first indicator between components having a proper connection and a second indicator between components having an improper connection. For instance, and as may best be seen by referring to FIG. 37, a first graphical icon 59 may be displayed on a first component 44 and a second graphical icon 60 may be displayed on a second component 48, and the first and second graphical icons 59 and 60 may overlap and define a darkened area indicative of a proper connection between the first and second components 44 and 48.

Figure 51:
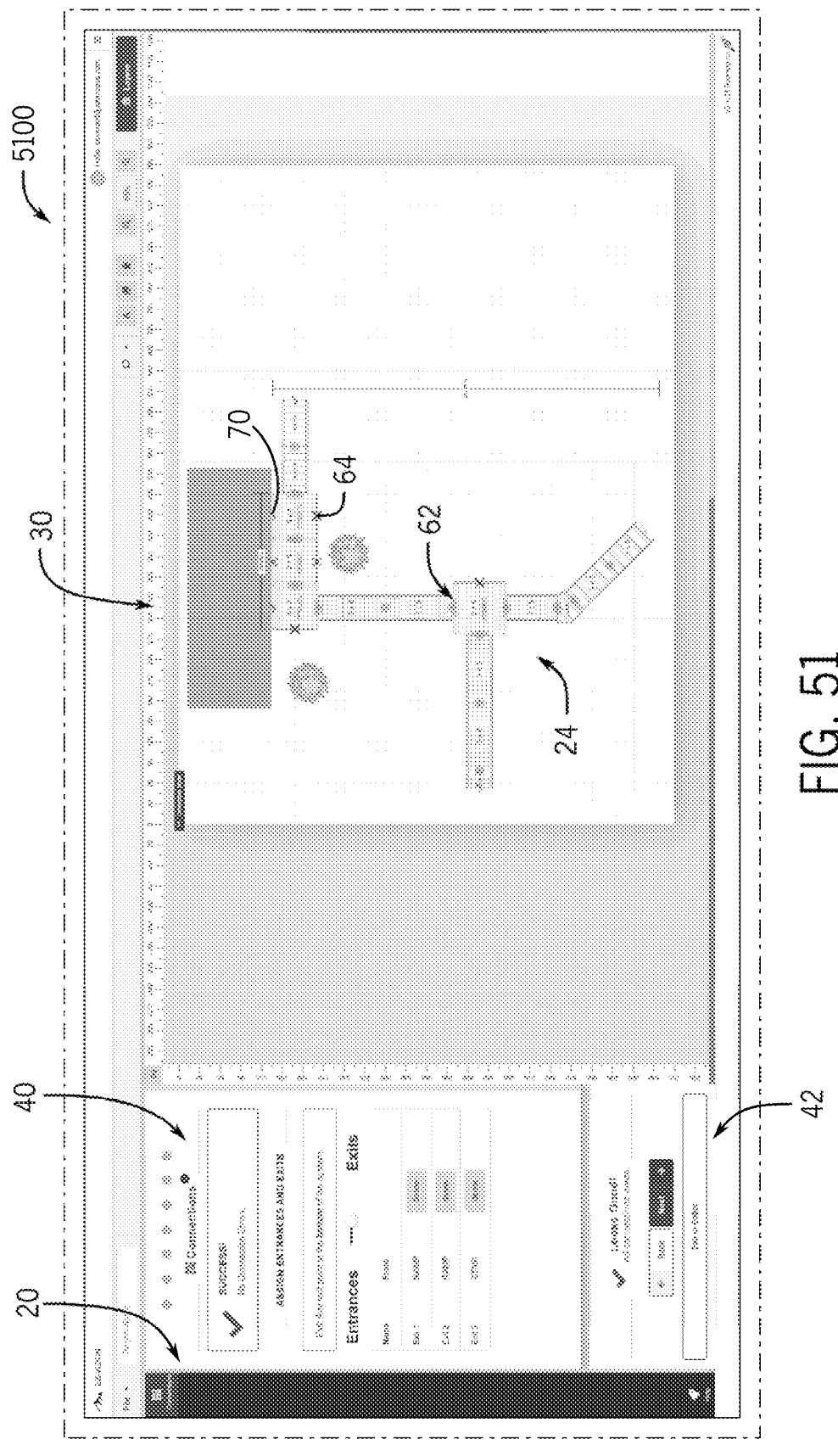

FIG. 51 depicts an alternative exemplary screen shot of an exemplary GUI display showing another stencil design 24 analyzed by the connections module 202. The exemplary screenshot 5100 depicted in FIG. 51, for instance, shows the stencil design 24 having proper connections between components, as well as defined entrances and exits for the various runs. In each of the exemplary screen shots 3600, 3800, 3900, and 5100 of FIGS. 36, 38, 39, and 51, the connections module 202 has also displayed a message indicating that there are no connection errors. It should be appreciated that any other suitable indicators and/or messages may instead be used.

Figure 52:
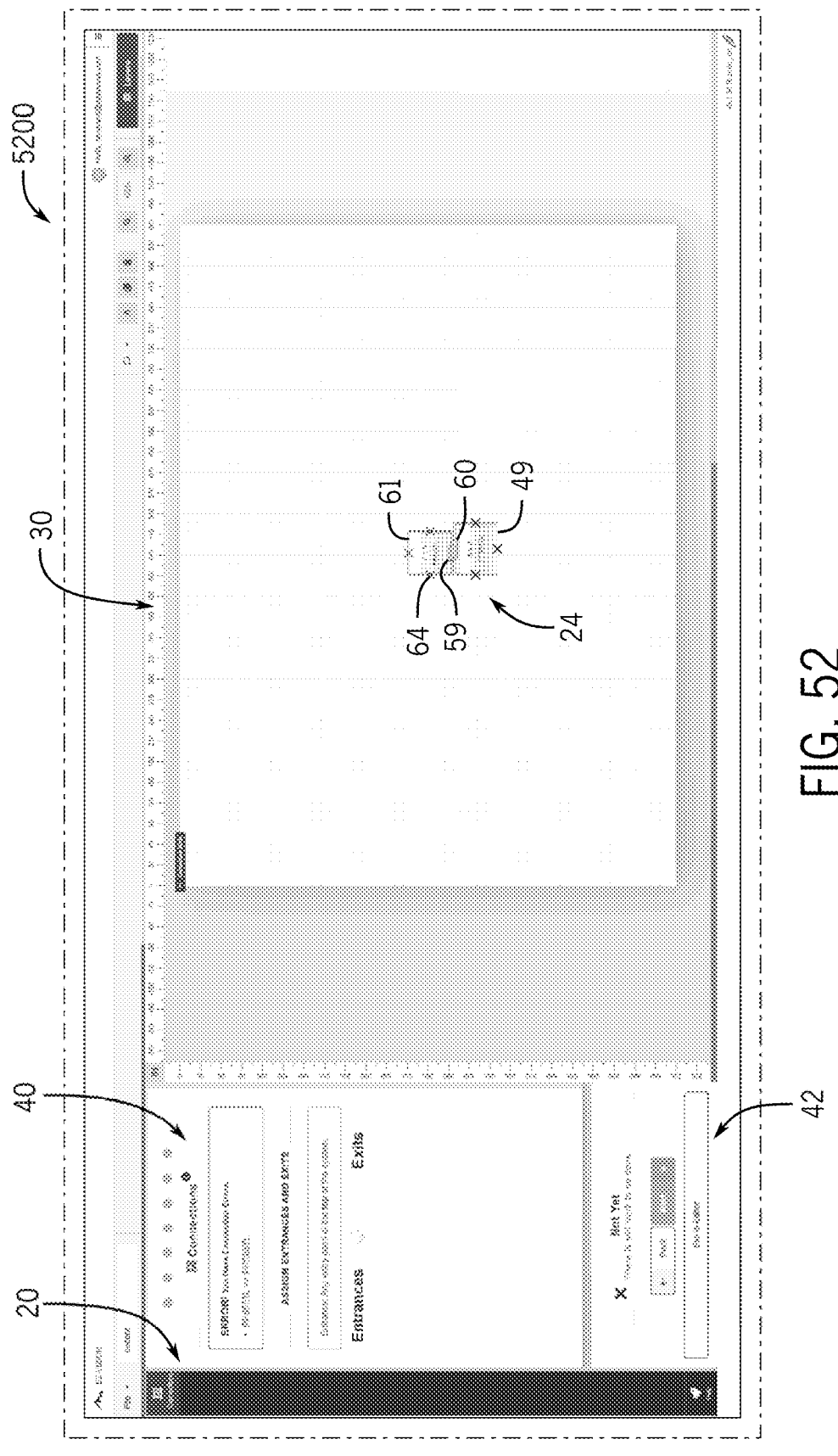

In another instance, and as may best be seen by referring to the exemplary screen shot 5200 of FIG. 52, a first graphical icon 29 may be displayed on a first component 61 and a second graphical icon 60 may be displayed on a second component 49, and the first and second graphical icons 59 and 60 may overlap and define an open area indicative of an improper connection between the first and second components 44 and 48. The second side container window 40 may also display a warning indicating that there are connection errors between the respective parts.

If an improper connection is detected between the first and second components, a different part or component may be selected, and/or the components may be moved relative to each other to define a proper connection. For instance, in the exemplary screenshot 5200 of FIG. 52, the first component 61 has a first width and the second component 49 has a second width greater than the first width. Accordingly, one of the first component 61 may be exchanged for another component to match the width of the adjacent second component 49 (or vice versa).

As another example, the exemplary screen shot 5000 of FIG. 50 shows an error message 74 displayed at the top right-hand corner of the screenshot indicating that components 47 and 57 cannot connect. Specifically, the error message 74 indicates that components 47 and 57 cannot connect because they are different sized ramps. Accordingly, one of the first component 47 may be exchanged for another component to match the width of the adjacent second component 57 (or vice versa). In another example shown in FIG. 60, an error message 74 is displayed at the top right-hand corner of a screenshot 6000 indicating that components 47 and 57 cannot connect because stairs (component 57) are not allowed in the primary run if a ramp is part of the system. Accordingly, component 57 may be exchanged for another component compatible with the run.

If the error message or improper connection indicator was instead generated because the components were not positioned correctly relative to each other, one or both of the components may be moved (i.e., dragged across the canvas into another location) such that a proper connection may be defined between the components.

Figure 40:
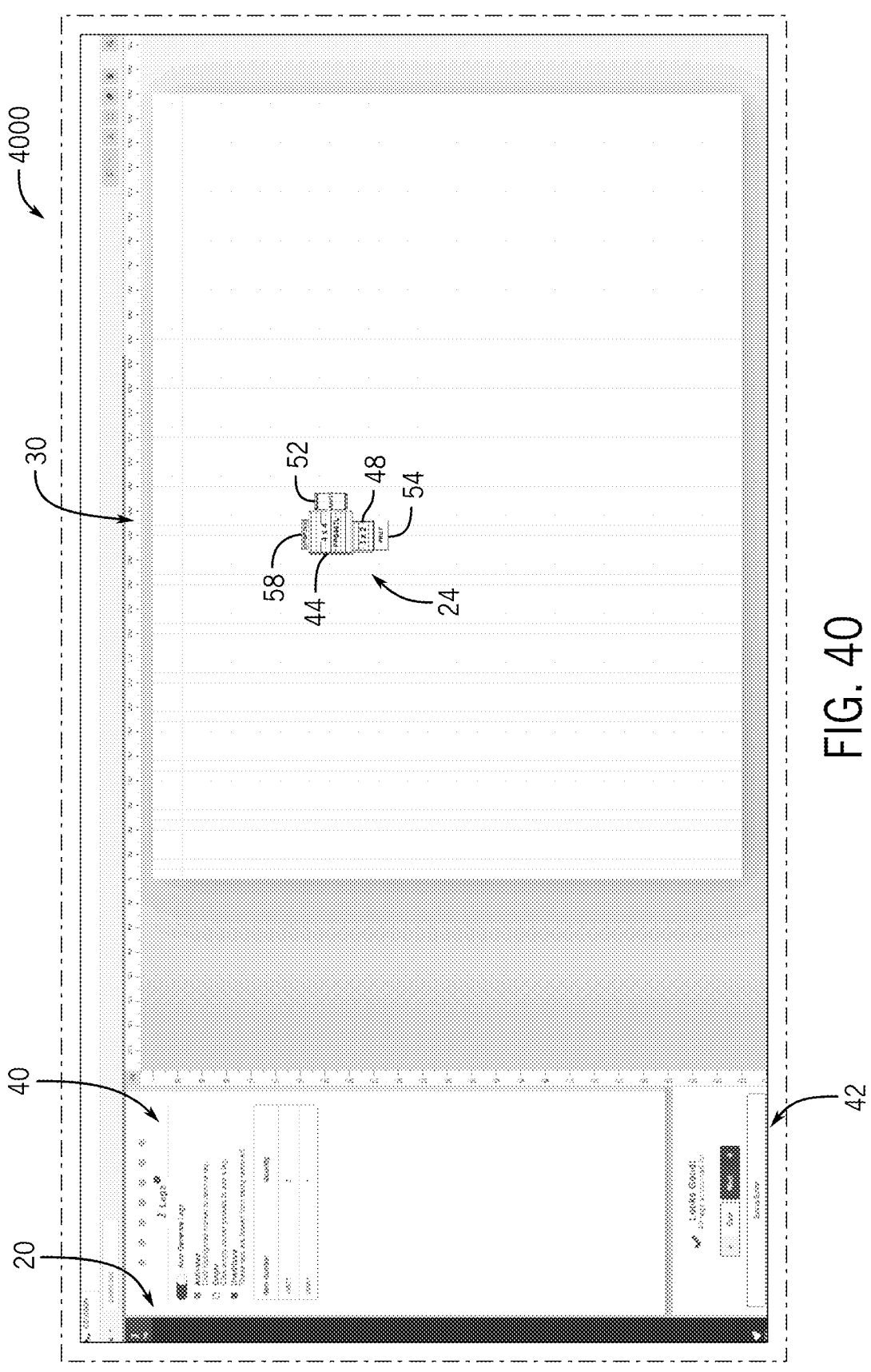

Referring to the exemplary screen shot 4000 of FIG. 40, after running the connections module 202, the client application 102 may run a legs module 206 (see FIG. 2 and the "I Legs" menu item displayed at the top of the first side container window 20) to optionally add support legs beneath components of the accessibility system (i.e., vertical supports extending between a bottom surface of a component and a ground surface). In one exemplary embodiment, the legs module 206 automatically adds legs to the components of the system where needed and provides an option to remove and/or modify some or all the legs.

For instance, in the second side container window 40, the various legs automatically added to the system may be categorized as: (1) activated, where the leg may be removed by clicking a corresponding highlighted marker (or the like) on the stencil design displayed on the canvas; (2) empty, where no leg is added to the system but can be added by clicking on an empty corner pocket indicator (or the like); and (3), uneditable, of which legs added to the system are locked from being removed because they are necessary to support the system. Beneath this legs categorization displayed in the second side container window 40, the part identifier (e.g., number, name, and/or short description) of the system and the corresponding number of legs may be displayed for reference.

Figure 53:
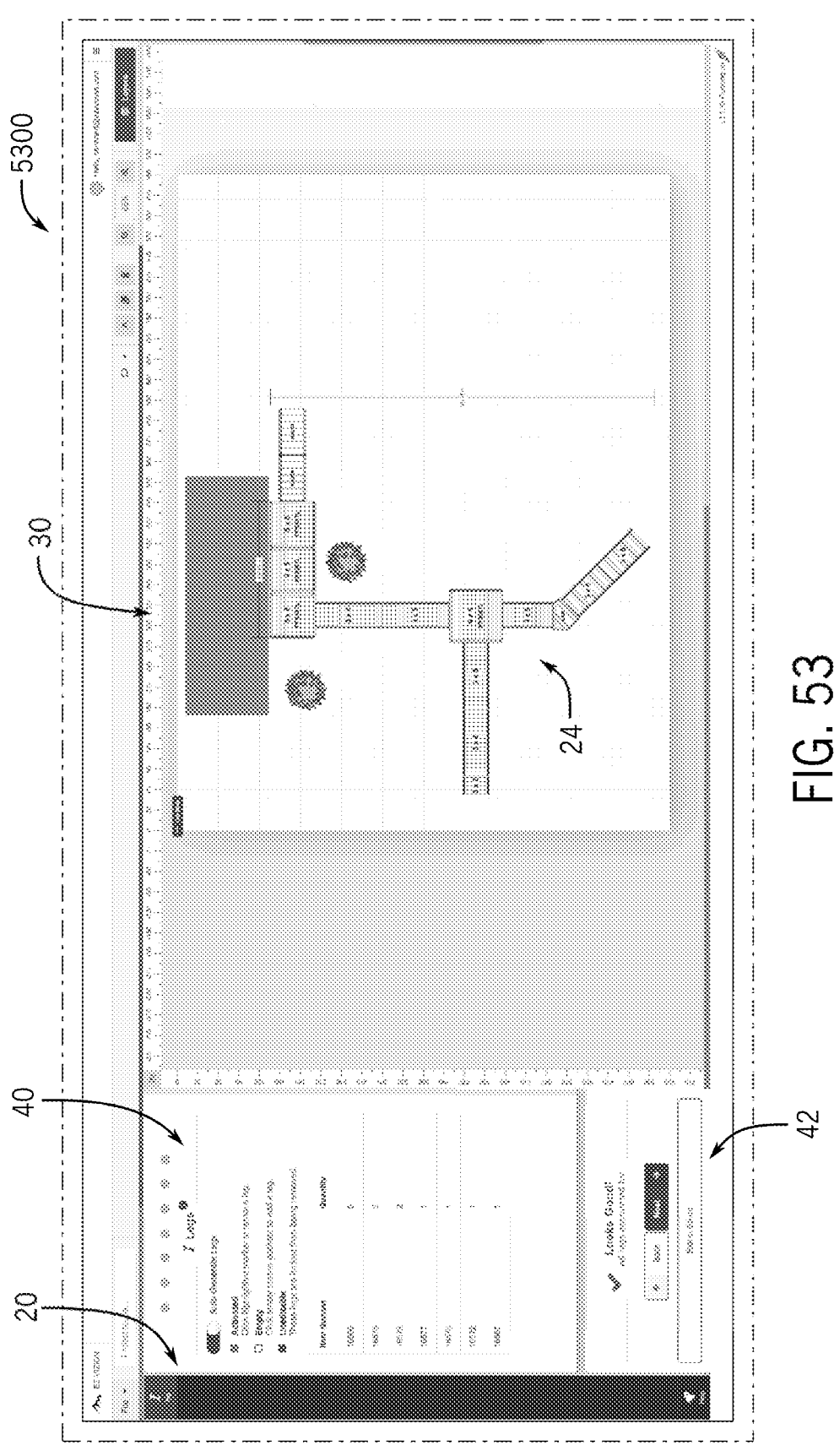

The legs module 206 may provide the option to disable auto-generation of legs for the system, for instance, by clicking on a toggle button within the second side container window 40. FIG. 53 also displays an exemplary screenshot 5300 of a GUI display showing a stencil design having legs added to the components by the legs module 206.

Figure 62:
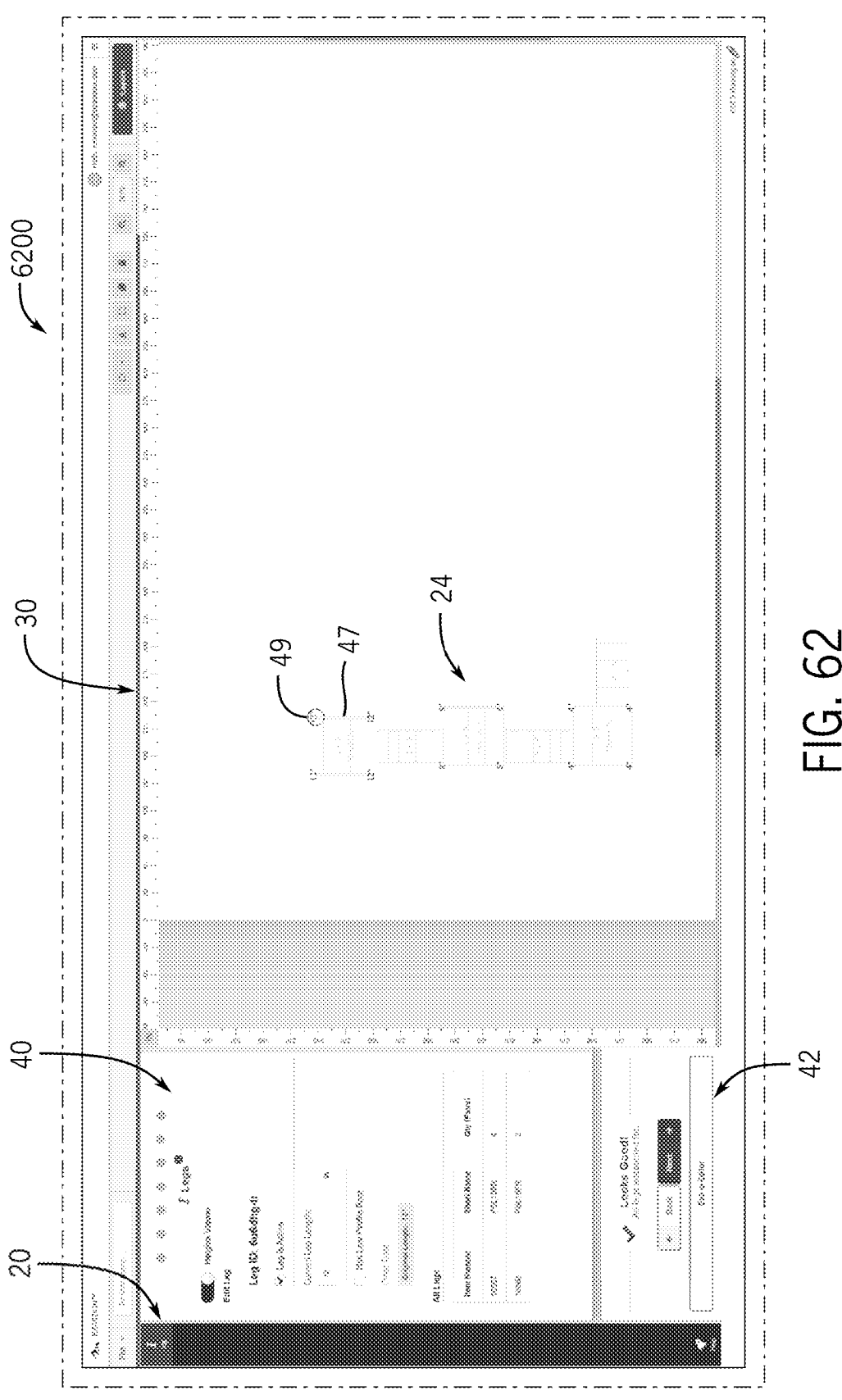

In another exemplary screen shot 6200 shown in FIG. 62, the legs module 206 may display the height of the legs added to the stencil design 24 with a heights viewer application, which can be toggled on or off in the second side container window 40. When toggled on, the heights viewer application displays the length of the legs added to the stencil design 24 on the canvas, such as with an indicator 49 having a notation of 12" or the like for component 47. At the same time, the length for a selected leg is shown in a drop-down menu in the second side container window 40, with the ability to select a different height for that selected leg. Other data, such as a previous height of the selected leg, may also be displayed.

Figure 41:
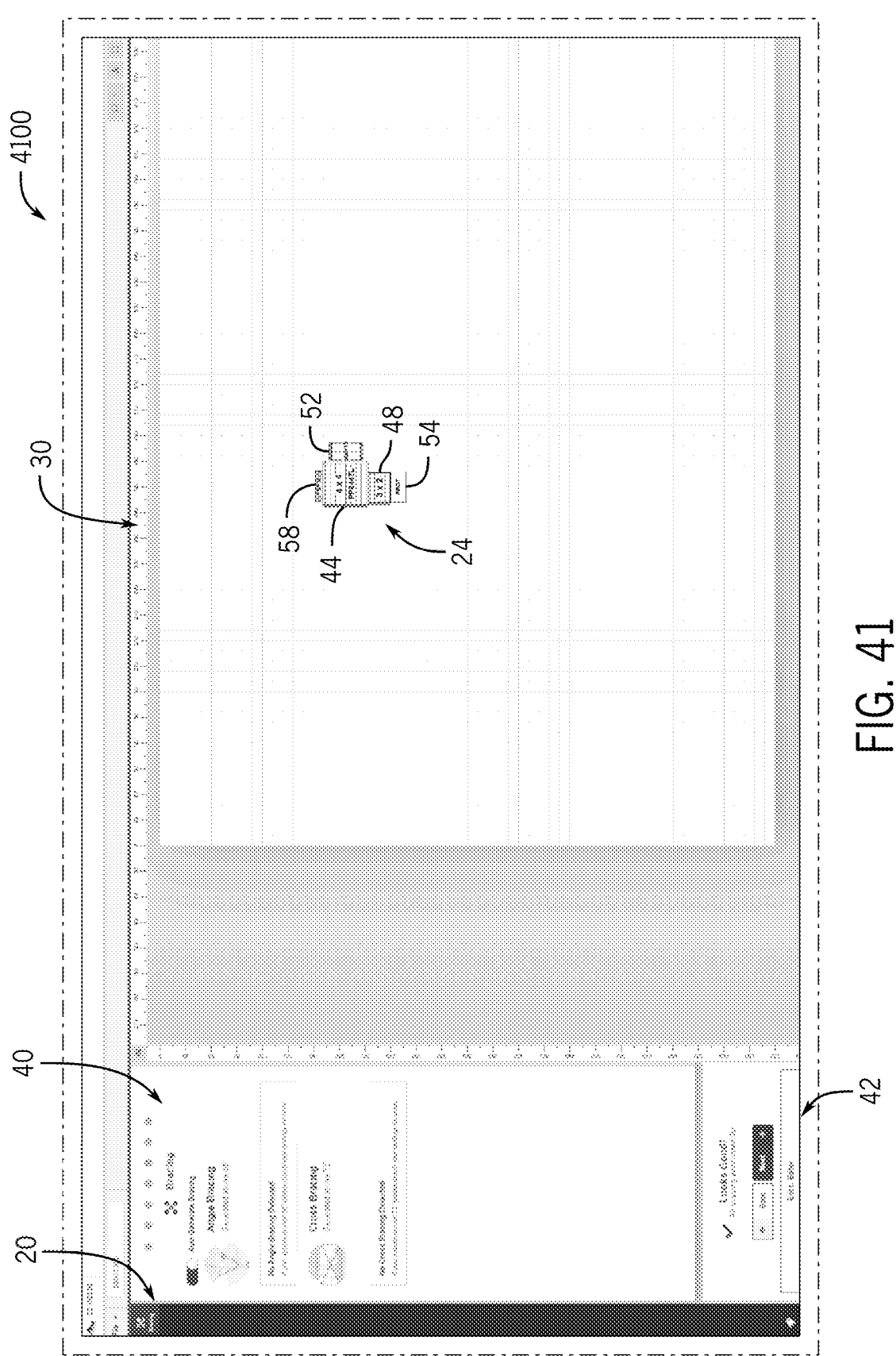

Referring to the exemplary screen shot 4100 of FIG. 41, in a next step, the client application 102 may run a bracing module 210 (see FIG. 2 and the "Bracing" menu item displayed at the top of the first side container window 20) to optionally add bracing beneath components of the accessibility system (i.e., angle or cross bracing extending between a bottom surface of a component and a leg, a ground surface, and/or another component). In one exemplary aspect, the bracing module 210 automatically adds bracing to the components of the system where needed and provides an option to remove and/or modify some or all the bracing. For instance, bracing may be automatically added at component heights of thirty-six inches and seventy-two inches with the option to remove and/or modify some or all the bracing.

For instance, in the second side container window 40, the angle bracing is automatically added to the system for components more than thirty-six inches above another surface, and cross bracing is automatically added to the system for components more than seventy-two inches above another surface. For each type of bracing, the bracing may be removed by clicking a corresponding highlighted marker (or the like) on the system stencil displayed on the canvas. In some embodiments, certain bracing structure may be uneditable, meaning the bracing added to the system is locked from being removed because it is necessary to support the system. Beneath this bracing categorization displayed in the second side container window 40, the corresponding number of angle or cross bracings used may be displayed for reference.

Figure 54:
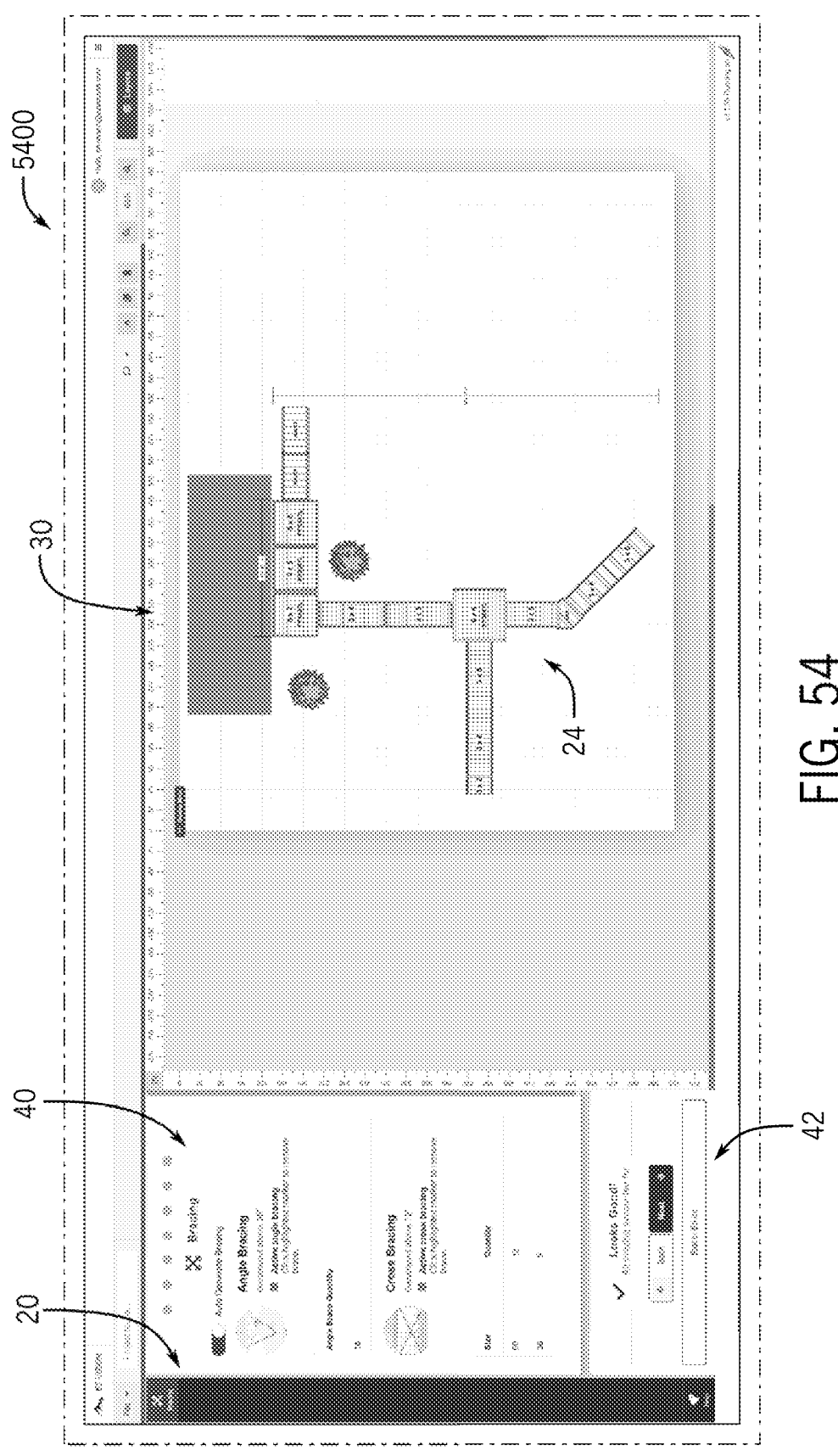

The bracing module 210 may provide the option to disable auto-generation of bracing for the system, for instance, by clicking on a toggle button within the second side container window 40. FIG. 54 also displays an exemplary screenshot 5400 of a GUI display showing a stencil design having bracing added by the bracing module 210.

Figure 42:
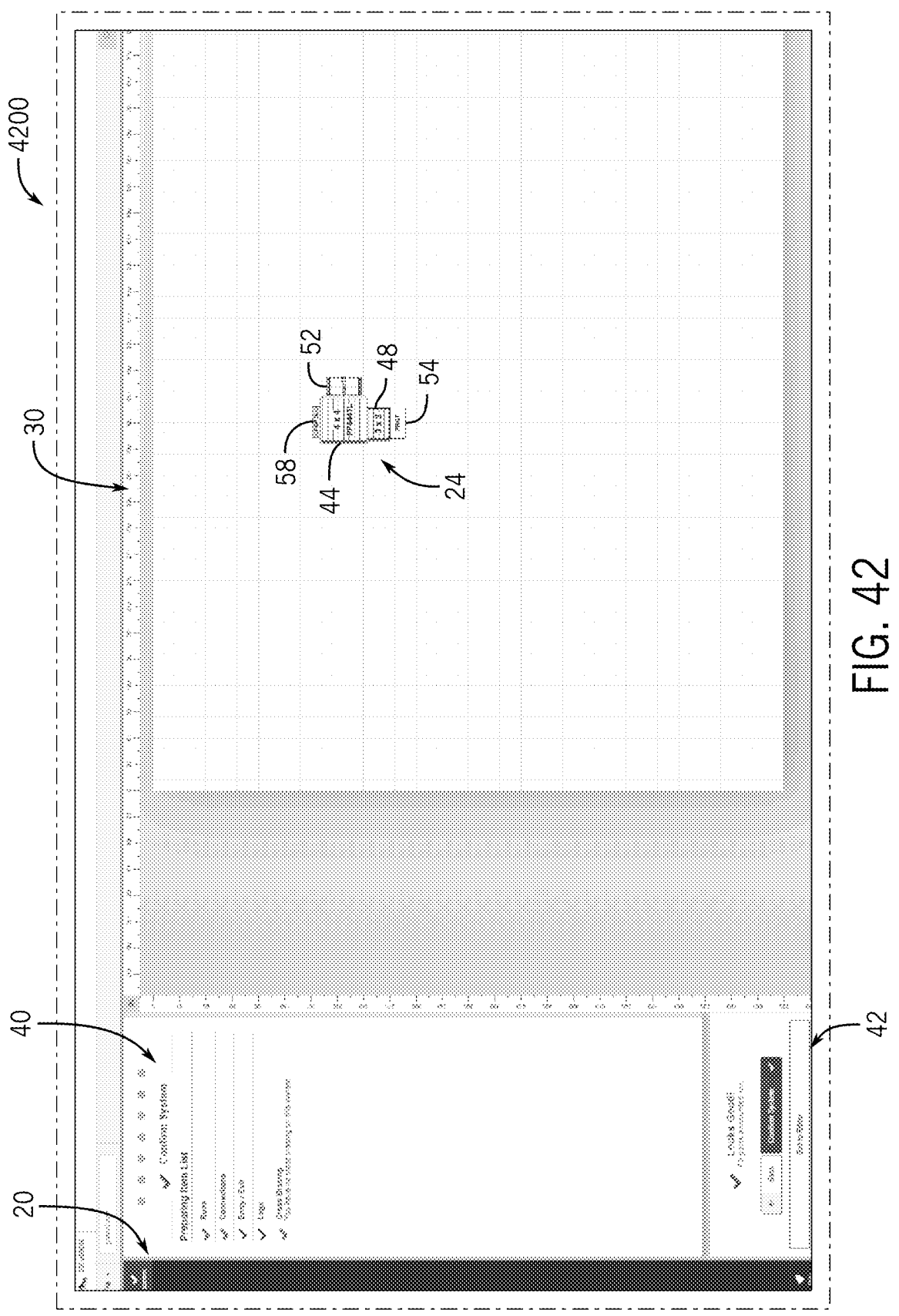

Referring to the exemplary screen shot 4200 of FIG. 42, in a next step, the client application 102 may run a final system checkup module 214 (see FIG. 2 and the "Confirm" menu item displayed at the top of the first side container window 20) to determine whether the stencil design has all the recommended components. In that regard, the final system checkup module 214 may re-run or access the various different modules of the client application 102 to assess the feasibility of the system.

Specifically, the final system checkup module 214 may re-run the run builder module 198, the connections module 202, the legs module 206, and/or the bracing module 210. Upon re-running some or all these modules, an item checklist of the recommended components for the accessibility system may be displayed in the second side container window 40. For instance, in the exemplary screen shot 4200 of FIG. 42, the item checklist includes runs, connections, entry/exit, legs, and cross bracing, wherein the cross bracing has been indicated as missing from the system. In the third side container window 42, the final system checkup module 214 provides the option of going back to make changes to the stencil design, or confirming the system as currently designed.

Figure 43:
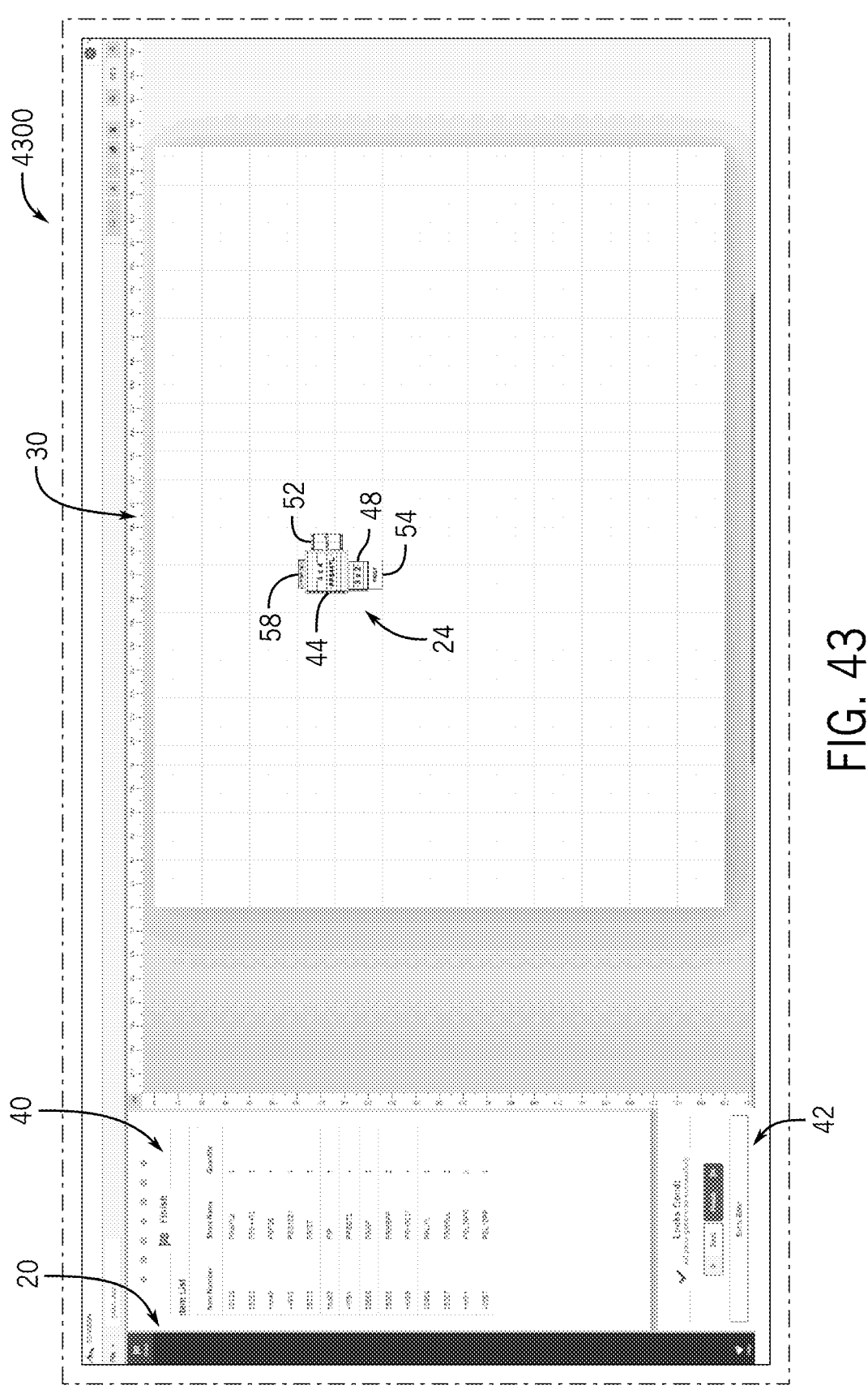

Referring to the exemplary screen shot 4300 of FIG. 43, in a next step, if the system is confirmed, the final system checkup module 214 may generate a list of all the parts in the system (including, for instance, a part identifier (e.g., number, name, and/or short description) and quantity) and display the list in the second side container window 40. In the third side container window 42, the final system checkup module 214 provides the option of going back to make changes to the stencil design or finishing the system design (e.g., click "Finish") and proceeding to building a quote, etc.

In that regard, in a next step, the client application 102 may run a quote building module 216 (see FIG. 2) configured to facilitate the process of building a quote for an accessibility system represented by the stencil design. In the exemplary embodiment depicted in FIG. 44, the quote building module 216 closes the client application browser tab and creates an electronic document or file showing a graphical depiction of the accessibility system corresponding to the stencil design 24 created by the client application 102.

When closing the browser tab, the quote building module 216 may navigate back to a dealer portal (or another third-party website or computer system) to the send/accept the quote. For instance, the quote building module 216 may automatically generate a file or upload a file on a computer system of a dealer or another third party for processing the quote.

The electronic document may be used to facilitate a physical build of the accessibility system. More specifically, the electronic document may be used to order the necessary parts for the accessibility system. Once the parts are ordered and on site, the electronic document may act as a blueprint, design plan, technical drawing, etc. for building the accessibility system.

It should be appreciated that the warnings, results, etc. ("feedback"), produced by the modules of the client application 102 may instead be generated in any other suitable manner. For instance, instead of displaying feedback in the second side container window, feedback may instead be displayed in one or more of the other container windows. Other forms of visual feedback may alternatively or additionally be used. For example, one or more of the components of the system may flash red or otherwise be highlighted to the user as having a warning. Further, instead of visual feedback, other forms of feedback may alternatively or additionally be used, such as audible warnings (e.g., a sound when a warning pops up) or tactile warnings (e.g., a vibration of the computing device or input device). Thus, it should be appreciated that feedback may be provided to the user in any suitable manner. Moreover, as noted above, some or all the modules of the client application 102 may be run in parallel and/or in the background of any other module being used, and any necessary warnings may be displayed in one or more of the side container windows or in the main container window of the screen shot currently displayed.

Screen Shots of Exemplary GUI Displays

FIGS. 3-54 show screen shots of exemplary GUI displays of the computer system 100 for use with the systems and methods described herein. It should be appreciated that various aspects of the exemplary GUI displays are ornamental in nature. In that regard, FIGS. 3-54 are screen shots of exemplary GUI displays showing new ornamental designs.

The screen shots of exemplary GUI displays shown in FIGS. 3-54 may be considered two-dimensional images shown on an article of manufacture, such as a computer screen, monitor, other display panel, or a portion thereof, such as the computer system 100. In that regard, a broken or dashed outline of a computer screen, monitor, other display panel, or a portion thereof may be shown in the drawings to represent an article of manufacture showing the ornamental design for the GUI display.

The ornamental designs include any and all parts, portions, elements, and/or combinations thereof of the exemplary GUI displays shown in the FIGS. The designs may also include any part, portion, element, and/or combination thereof of the disclosed designs, including a design that replaces any solid line with a broken line to disclaim any part, portion, element and/or combination thereof of the disclosed design, or to replace any broken line with a solid line to claim any part, portion, element and/or combination thereof of the disclosed designs.

Any thin solid lines that are now shown in the FIGS. or later added may represent contours only and will not necessarily illustrate an ornamentation of decoration on the surface of an article.

Exemplary Method for Building a Graphical Depiction of an Accessibility System

FIG. 63 illustrates an example method 6301 for building a graphical depiction of an accessibility system, which may be carried out by one or more modules of the client application 102. FIGS. 3-62, discussed in detail above, show exemplary screen shots of GUI displays of the computer system 100 that may be used to carry out aspects of the example method 6301.

According to some embodiments, the method includes receiving an input to build a run having a desired ratio at block 6302. For example, the processor 105 illustrated in FIG. 1 may receive an input to build a run having a desired ratio of the accessibility system. The selection of the run having a desired ratio may be made through a drop-down menu selection or an input of custom information, as shown in the exemplary screenshot 300 of FIG. 3. According to some embodiments, the method includes building a run having the desired ratio using input that includes a first height of the run and a second height of the run.

According to some embodiments, the method includes receiving a selection of one or more components of an accessibility system at block 6304. For example, the processor 105 illustrated in FIG. 1 may receive a selection of one or more components of an accessibility system, such as platform(s), ramp(s), stair(s), etc. The selection of the one or more components may be made by clicking on or dragging a selected part from the second side container window into the main container window, as shown in the exemplary screenshot 500 of FIG. 5.

According to some embodiments, the method includes generating feedback data indicating whether the one or more components of the accessibility system create a run having the desired ratio at block 6306. For example, the processor 105 illustrated in FIG. 1 may generate feedback data indicate whether the one or more components of the accessibility system create the run having the desired ratio. According to some embodiments, the method includes generating additional feedback data indicating an actual ratio compared to a desired ratio. The feedback data may be displayed in the second side container window or another container window, for example, as shown in the exemplary screenshot 2600 of FIG. 26, or in the exemplary screenshots 5700, 5800, and 5900 of FIGS. 57, 58, and 59, respectively.

According to some embodiments, the method includes generating additional feedback data indicating whether the selection of the one or more components form a complete accessibility system at block 6310. For example, the processor 105 illustrated in FIG. 1 may generate additional feedback data indicating whether the selection of the one or more components form a complete accessibility system. According to some embodiments, the method includes generating a list of one or more components required to form a complete accessibility system at block 6316, such as at least one of a first transition piece for use between a ramp and a first surface (e.g., the ground) and a second transition piece for use between a second raised surface and the ramp. For example, the processor 105 illustrated in FIG. 1 may generate a list of one or more components required to form a complete accessibility system. The additional feedback data/list generated at blocks 6310 and 6316 may be displayed in a pop-up window or a container window, for example, as shown in the exemplary screenshot 1500 of FIG. 15. The method may include generating any other additional feedback data described herein.

According to some embodiments, the method includes generating additional feedback data if one of the one or more components is incompatible with the other of the one or more components in the run at block 6320. In that regard, the processor 105 illustrated in FIG. 1 may generate additional feedback data if one of the one or more components is incompatible with the other of the one or more components in the run. For example, the method may include receiving a location placement selection of a component of the accessibility system relative to a location of at least one other component and generating feedback data indicating whether the component can be placed in the selected location relative to the at least one other component at block 6324. For example, the processor 105 illustrated in FIG. 1 may receive a location placement selection of a component of the accessibility system relative to a location of at least one other component and generate feedback data indicating whether the component can be placed in the selected location relative to the at least one other component. The additional feedback data generated at blocks 6320 and 6324 may be displayed in a pop-up window or a container window, for example, as shown in the exemplary screenshot 5000 of FIG. 50 or the exemplary screenshot 5200 of FIG. 52. As another example, the exemplary screenshot 6000 of FIG. 60 shows an error message 6074 displayed at the top right-hand corner of a screenshot 6000 indicating that components 6047 and 6057 cannot connect because stairs (component 6057) are not allowed in the primary run if a ramp is part of the system. The method may include generating any other additional feedback data described herein.

According to some embodiments, the method includes displaying a first indicator between components indicative of a proper connection and a second indicator between components indicative of an improper connection at block 6328. For example, the processor 105 illustrated in FIG. 1 may cause a first indicator to be displayed between components having a proper connection and a second indicator between components having an improper connection.

According to some embodiments, the method includes displaying a first graphical icon on a first component and a second graphical icon on a second component, the first and second graphical icons overlapping and defining a darkened area indicative of a proper connection between the first and second components. For example, in the exemplary screenshot 3700 depicted in FIG. 37, a first graphical icon 59 is displayed on a first component 44 and a second graphical icon 60 is displayed on a second component 48, and the first and second graphical icons 59 and 60 overlap and define a darkened area indicative of a proper connection between the first and second components 44 and 48.

According to some embodiments, the method includes displaying a first graphical icon on a first component and a second graphical icon on a second component, the first and second graphical icons overlapping and defining an open area indicative of an improper connection between the first and second components. For example, in the exemplary screenshot 5200 depicted in FIG. 52, a first graphical icon 59 is displayed on a first component 61 and a second graphical icon 60 is displayed on a second component 49, and the first and second graphical icons 59 and 60 overlap and define an open area indicative of an improper connection between the first and second components 44 and 48.

According to some embodiments, the method includes generating additional feedback data regarding improper order of the one or more components in the run at block 6332. For example, the processor 105 illustrated in FIG. 1 may generate additional feedback data regarding improper order of the one or more components in the run, such as a run starting with an intermediate or bottom component rather than a top component. As specific examples, the method includes generating feedback data indicating that a 45-degree platform cannot start a run, a starter ramp must be at the end of a run (such as for a commercial run), or similar.

According to some embodiments, the method includes receiving a handrail position selection of a component of the accessibility system and generating feedback data indicating whether the handrail position is compatible with the component at block 6336. The method may also include generating feedback data indicating whether a component is missing a recommended handrail at block 6336. For example, the processor 105 illustrated in FIG. 1 may receive a handrail position selection of a component of the accessibility system and generate feedback data indicating whether the handrail position is compatible with the component, as shown in the exemplary screenshot 1900 of FIG. 19. The processor 105 illustrated in FIG. 1 may also generate feedback data indicating whether a component is missing a recommended handrail, as shown in the exemplary screenshot 1800 of FIG. 18. The processor 105 illustrated in FIG. 1 may also generate feedback data indicating whether a component should be closed off for safety, such as in the exemplary screen shot 6100 of FIG. 61.

According to some embodiments, the method may include (optionally automatically) selecting at least one of legs and bracing for each component of the accessibility system at block 6340. The method may include selecting at least one of legs and bracing for each component of a predetermined height. For instance, bracing may be automatically added at component heights of 36 inches and 72 inches with the option to remove and/or modify some or all the bracing.

In that regard, the processor 105 illustrated in FIG. 1 may select at least one of legs and bracing for each component of the accessibility system, as shown in the exemplary screenshots 4000 and 4100 respectively of corresponding FIGS. 40 and 41. In a further example shown in the exemplary screen shot 6200 of FIG. 62, the processor 105 illustrated in FIG. 1 may display the height of the legs for each component. The method may also include selecting at least one of legs and bracing for each component of the accessibility system to accommodate variation in topography.

According to some embodiments, the method includes receiving at least one entry selection and at least one exit selection for the run of the accessibility system and generating feedback data indicating whether the at least one entry selection and the at least one exit selection can be used with the run at block 6344. For example, the processor 105 illustrated in FIG. 1 may receive at least one entry selection and at least one exit selection for the run of the accessibility system and generate feedback data indicating whether the at least one entry selection and the at least one exit selection can be used with the run. The exemplary screenshot 3700 depicted in FIG. 37 shows a successful entrance marked by an entrance indicator 70 defined on the stencil design 24, and the exemplary screenshot 3900 depicted in FIG. 39 shows a successful exit marked by an exit indicator 74 defined on the stencil design 24.

Figure 44:
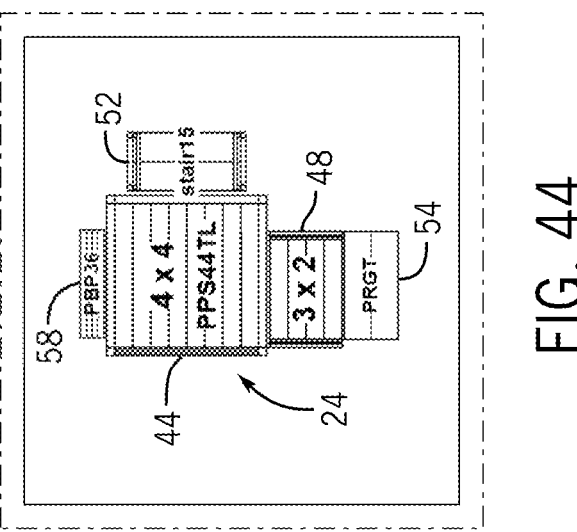

According to some embodiments, the method includes generating a list of part names for the one or more components selected for the accessibility system and/or an electronic document that graphically depicts the accessibility system at block 6348. For example, the processor 105 illustrated in FIG. 1 may generate a list of part names for the one or more components selected for the accessibility system and/or an electronic document that graphically depicts the accessibility system. The exemplary screenshot 4300 depicted in FIG. 43 shows a generated parts list in the second side container window 40, and FIG. 44 represents an electronic document generated by the processor 105 that graphically depicts the accessibility system.

In some examples, the methods described herein (e.g., method 6301, and/or other methods and process described herein) may be performed by a computing device or apparatus, such as the computer system 100.

The computing device can include any suitable device, such as a mobile device (e.g., a mobile phone), a desktop computing device, a tablet computing device, an extended reality (XR) device or system (e.g., a VR headset, an AR headset, AR glasses, or other XR device or system), a wearable device (e.g., a network-connected watch or smartwatch, or other wearable device), a server computer or system, a vehicle or computing device of a vehicle (e.g., an autonomous vehicle), a robotic device, a television, and/or any other computing device with the resource capabilities to perform the processes described herein, including the method 6301. In some cases, the computing device or apparatus may include various components, such as one or more input devices, one or more output devices, one or more processors, one or more microprocessors, one or more microcomputers, one or more cameras, one or more sensors, and/or other component(s) that are configured to carry out the steps of processes described herein. In some examples, the computing device may include a display, a network interface configured to communicate and/or receive the data, any combination thereof, and/or other component(s). The network interface may be configured to communicate and/or receive Internet Protocol (IP) based data or other type of data.

The components of the computing device can be implemented in circuitry. For example, the components can include and/or can be implemented using electronic circuits or other electronic hardware, which can include one or more programmable electronic circuits (e.g., microprocessors, graphics processing units (GPUs), digital signal processors (DSPs), central processing units (CPUs), and/or other suitable electronic circuits), and/or can include and/or be implemented using computer software, firmware, or any combination thereof, to perform the various operations described herein.

The method 6301 is illustrated as a logical flow diagram, the operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes. Further, some of the described operations can be omitted from the method 6301.

Additionally, the method 6301 and/or other methods or processes described herein may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory.

Although the example method 6301 depicts a particular sequence of operations, the sequence may be altered without departing from the scope of the present disclosure. For example, some of the operations depicted may be performed in parallel or in a different sequence that does not materially affect the function of the method 6301. Further, as noted above, some of the described operations can be omitted from the method 6301. In other examples, different components of an example device or system that implements the method 6301 may perform functions at substantially the same time or in a specific sequence.

AI Platforms

Aspects of the systems and methods described herein may use certain artificial intelligence (AI) platforms to process data, which may be carried out on one or more (cloud-based) computing devices, such as one or more of the servers 155 shown in FIG. 1. For instance, an artificial neural network may be used to analyze aspects of the accessibility system created and generate feedback data regarding the analysis conducted.

An artificial neural network attempts to replicate, using computer technology, logical reasoning performed by the biological neural networks that constitute animal brains. Deep neural networks, such as convolutional neural networks, are widely used for numerous applications, such as object detection, object classification, object tracking, big data analysis, among others.

Figure 64:
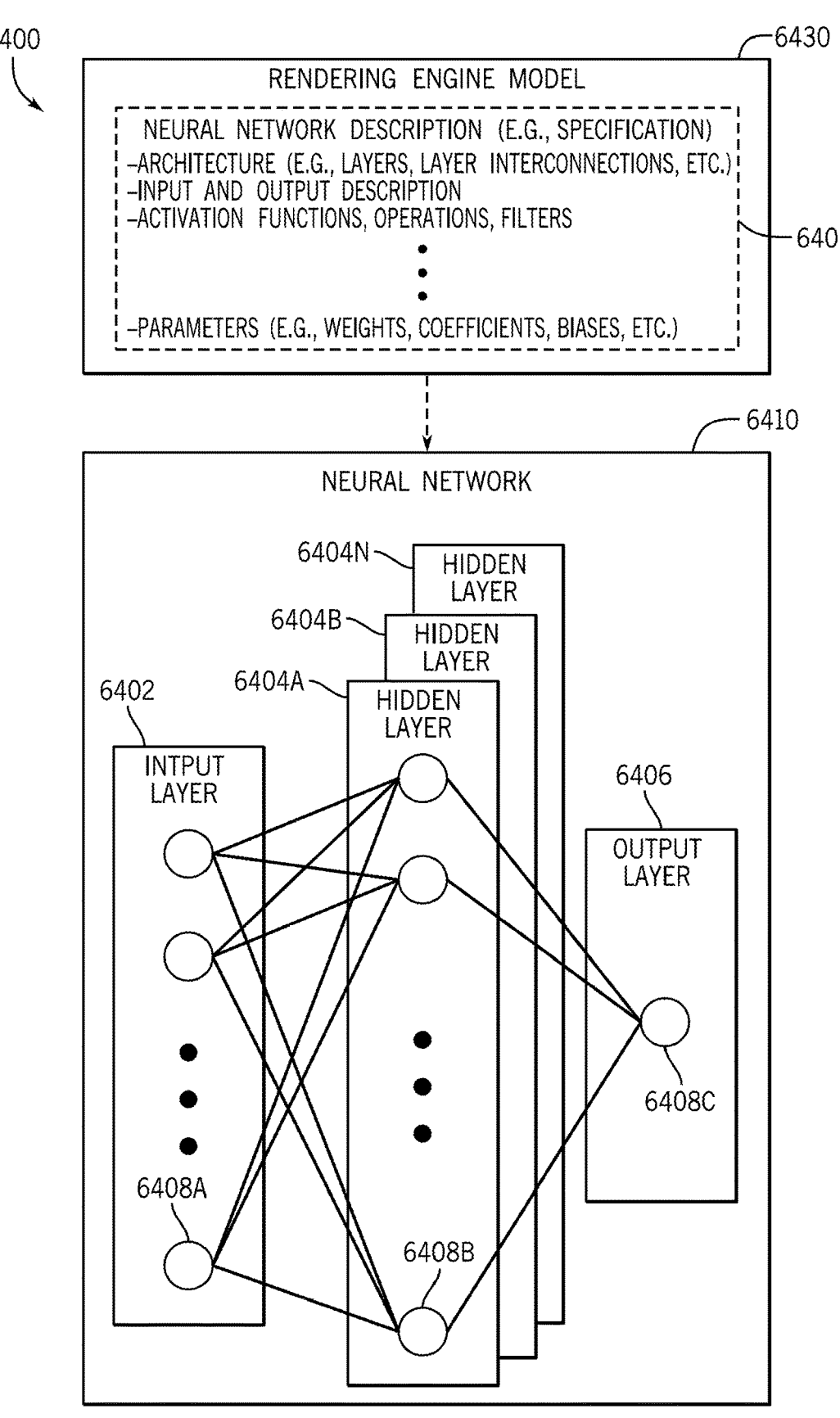
FIG. 64 illustrates an example neural network architecture, according to an example of the instant disclosure.

FIG. 64 illustrates an example neural network architecture for use with the various computing devices and applications described herein. Architecture 6400 includes a neural network 6410 defined by an example neural network description 6401 in rendering engine model (neural controller) 6430. The neural network 6410 can represent a neural network implementation of a rendering engine for rendering media data. The neural network description 6401 can include a full specification of the neural network 6410, including the neural network architecture 6400. For example, the neural network description 6401 can include a description or specification of the architecture 6400 of the neural network 6410 (e.g., the layers, layer interconnections, number of nodes in each layer, etc.); an input and output description which indicates how the input and output are formed or processed; an indication of the activation functions in the neural network, the operations or filters in the neural network, etc.; neural network parameters such as weights, biases, etc.; and so forth.

The neural network 6410 reflects the architecture 6400 defined in the neural network description 6401. In this example, the neural network 6410 includes an input layer 6402, which may include a desired slope ratio of the accessibility system, a predefined footprint of the accessibility system, etc. In one illustrative example, the input layer 6402 can include data representing a portion of input media data such as a patch of data or pixels (e.g., a 128×128 patch of data) in an image corresponding to the input media data. The input media data may include a digital image of the area (e.g., a building and its exterior leading up to an entrance) in which the accessibility system will be used.

The neural network 6410 includes hidden layers 6404A through 6404N (collectively "6404" hereinafter). The hidden layers 6404 can include n number of hidden layers, where n is an integer greater than or equal to one. The number of hidden layers can include as many layers as needed for a desired processing outcome and/or rendering intent. The neural network 6410 further includes an output layer 6406 that provides an output (e.g., feedback) resulting from the processing performed by the hidden layers 6404. In one illustrative example, the output layer 6406 can provide feedback regarding a recommended part or combination of parts that may be used for the accessibility system (as defined in the input layer 6402, such as a desired slope ratio of the accessibility system, a predefined footprint of the accessibility system, a digital image of the area, etc.)

The neural network 6410 in this example is a multi-layer neural network of interconnected nodes. Each node can represent a piece of information. Information associated with the nodes is shared among the different layers and each layer retains information as information is processed. In some cases, the neural network 6410 can include a feed-forward neural network, in which case there are no feedback connections where outputs of the neural network are fed back into itself. In other cases, the neural network 6410 can include a recurrent neural network, which can have loops that allow information to be carried across nodes while reading in input.

Information can be exchanged between nodes through node-to-node interconnections between the various layers. Nodes of the input layer 6402 can activate a set of nodes in the first hidden layer 6404A. For example, as shown, each of the input nodes of the input layer 6402 is connected to each of the nodes of the first hidden layer 6404A. The nodes of the hidden layer 6404A can transform the information of each input node by applying activation functions to the information. The information derived from the transformation can then be passed to and can activate the nodes of the next hidden layer (e.g., 6404B), which can perform their own designated functions. Example functions include convolutional, up-sampling, data transformation, pooling, and/or any other suitable functions. The output of the hidden layer (e.g., 6404B) can then activate nodes of the next hidden layer (e.g., 6404N), and so on. The output of the last hidden layer can activate one or more nodes of the output layer 6406, at which point an output is provided. In some cases, while nodes (e.g., nodes 6408A, 6408B, 6408C) in the neural network 6410 are shown as having multiple output lines, a node has a single output and all lines shown as being output from a node represent the same output value.

In some cases, each node or interconnection between nodes can have a weight that is a set of parameters derived from training the neural network 6410. For example, an interconnection between nodes can represent a piece of information learned about the interconnected nodes. The interconnection can have a numeric weight that can be tuned (e.g., based on a training dataset), allowing the neural network 6410 to be adaptive to inputs and able to learn as more data is processed.

The neural network 6410 can be pre-trained to process the features from the data in the input layer 6402 using the different hidden layers 6404 in order to provide the output through the output layer 6406. In an example in which the neural network 6410 is used to provide a recommended part(s) for the accessibility system, the neural network 6410 can be trained using training data that includes example images and object features of real world environments. For instance, training images can be input into the neural network 6410, which can be processed by the neural network 6410 to generate outputs which can be used to tune one or more aspects of the neural network 6410, such as weights, biases, etc.

In some cases, the neural network 6410 can adjust weights of nodes using a training process called backpropagation. Backpropagation can include a forward pass, a loss function, a backward pass, and a weight update. The forward pass, loss function, backward pass, and parameter update is performed for one training iteration. The process can be repeated for a certain number of iterations for each set of training media data until the weights of the layers are accurately tuned.

For a first training iteration for the neural network 6410, the output can include values that do not give preference to any particular class due to the weights being randomly selected at initialization. For example, if the output is a vector with probabilities that the object includes different features, the probability value for each of the different object features may be equal or at least very similar (e.g., for ten possible object features, each class may have a probability value of 0.1). With the initial weights, the neural network 6410 is unable to determine low level features and thus cannot make an accurate determination of what the classification of the object might be. A loss function can be used to analyze errors in the output. Any suitable loss function definition can be used.

The loss (or error) can be high for the first training dataset (e.g., images) since the actual values will be different than the predicted output. The goal of training is to minimize the amount of loss so that the predicted output comports with a target or ideal output. The neural network 6410 can perform a backward pass by determining which inputs (weights) most contributed to the loss of the neural network 6410, and can adjust the weights so that the loss decreases and is eventually minimized.

A derivative of the loss with respect to the weights can be computed to determine the weights that contributed most to the loss of the neural network 6410. After the derivative is computed, a weight update can be performed by updating the weights of the filters. For example, the weights can be updated so that they change in the opposite direction of the gradient. A learning rate can be set to any suitable value, with a high learning rate including larger weight updates and a lower value indicating smaller weight updates.

The neural network 6410 can include any suitable neural or deep learning network. One example includes a convolutional neural network (CNN), which includes an input layer and an output layer, with multiple hidden layers between the input and out layers. The hidden layers of a CNN include a series of convolutional, nonlinear, pooling (for downsampling), and fully connected layers. In other examples, the neural network 6410 can represent any other neural or deep learning network, such as an autoencoder, a deep belief nets (DBNs), a recurrent neural networks (RNNs), etc.

In some embodiments, an initial dataset will be built using the neural network architecture 6400, and further data from system usage is fed back into the corresponding models by using practical secure aggregation. As such, the models can be encrypted in such a way that a (cloud) server responsible for aggregating the models will be unable to decrypt the learnings of each model.

In one example, a data lake is used to receive data from an application of a network device. Sensitive data will be anonymized, reprocessed, or aggregated before being sent to the data lake. All the data can be stored on the data lake as is. Accordingly, the system can return to original data after applying a data transformation. In another example, a data versioning system is used. The data versioning system (e.g., Pachyderm) stores and versions data in a format that is directly consumable by the AI tools and pipelines. The data versioning system can also version the artifacts (models and code) that are produced by the pipelines and that should be sent in an update procedure. Note that the data acquired will be encrypted while in transit and will be stored fully disconnected from any network devices (e.g., the computer system 100) to ensure the data is properly isolated.

It should be appreciated that any other suitable AI platforms and AI models now known or later developed may be used to accomplish the systems and methods described herein.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an exemplary embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

As described herein, the system and method for building a graphical depiction of an accessibility system may include a software platform on a computing device that allows a user to select components for the desired accessibility system and generate feedback data regarding whether the selected components can be used to effectively and/or safely build the desired accessibility system. Various forms of "feedback data" are described herein. It should be appreciated that any other suitable forms of feedback data may instead be used, such as audible feedback data, tactile feedback data, other forms of visual feedback data, a combination of various types of feedback data, etc. Accordingly, the descriptions and illustrations provided herein should not be seen as limiting.

The present disclosure provides exemplary embodiments of a system and method for building a graphical depiction of an accessibility system. The term "graphical depiction" may refer to a computer-aided drawing (CAD) and/or model of a layout of an accessibility system, which may graphically display all the components necessary to quote and build a complete accessibility system. Language such as "computer-aided drawing (CAD)"; "model of an accessibility system", "graphical depiction of an accessibility system", "accessibility system", "system layout", "stencil design", "run", "system", etc., may be used interchangeably and should not be seen as limiting.

Language such as "up", "down", "left", "right", "first", "second", etc., in the present disclosure is meant to provide orientation for the reader with reference to the drawings and is not intended to be the required orientation of the components or graphical images or to impart orientation limitations into the claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative FIGS. Additionally, the inclusion of a structural or method feature in a particular FIG. is not meant to imply that such feature is required in all embodiments and, in some embodiments, it may not be included or may be combined with other features.

As used herein, the terms "about", "approximately," etc., in reference to a number, is used herein to include numbers that fall within a range of 10%, 5%, or 1% in either direction (greater than or less than) the number unless otherwise stated or otherwise evident from the context (except where such number would exceed 100% of a possible value).

Where electronic or software components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" refers to any component that is physically connected to another component either directly or indirectly, and/or any component that is in communication with another component (e.g., connected to the other component over a wired or wireless connection, and/or other suitable communication interface) either directly or indirectly.

Headings of sections provided in this patent application and the title of this patent application are for convenience only and are not to be taken as limiting the disclosure in any way.

While preferred embodiments of the present invention have been shown and described herein, it will be apparent to those skilled in the art that such embodiments are provided by way of example only. Numerous variations, changes, and substitutions will now occur to those skilled in the art without departing from the invention. Various alternatives to the embodiments of the invention described herein may be employed in practicing the invention. It is intended that the following claims define the scope of the invention and that methods and structures within the scope of these claims and their equivalents be covered thereby.

What is claimed is:

1. A method for implementing a graphical user interface (GUI) configured to facilitate building a graphical depiction of an accessibility system, the method performed by one or more processors configured to interact with non-transitory memory configured to perform operations of the method, the method comprising:

receiving, via the GUI, an input to build a run of an accessibility system having a desired ratio;

receiving, via the GUI, a selection of a plurality of components of the accessibility system;

generating, and displaying via the GUI, feedback data indicating whether the plurality of components of the accessibility system create the run having the desired ratio;

receiving, via the GUI, a location placement selection of at least one component of the plurality of components relative to a location of at least one other component of the plurality of components; and displaying, via the GUI in response to the location placement selection, a first graphical icon on a first component of the plurality of components and a second graphical icon on a second component of the plurality of components, the first and second graphical icons overlapping and defining a visual indication of a propriety of a connection between the first and second components.

2. The method of claim 1, further comprising building the run having the desired ratio using input via the GUI that includes a first height of the run and a second height of the run.

3. The method of claim 2, further comprising generating, and displaying via the GUI, additional feedback data indicating an actual ratio compared to a desired ratio.

4. The method of claim 1, further comprising generating, and displaying via the GUI, additional feedback data indicating whether the selection of the one or more components form a complete accessibility system.

5. The method of claim 4, further comprising generating, and displaying via the GUI, a list of one or more components in addition to the plurality of components, the list of one or more components required to form a complete accessibility system, including at least one of a first transition piece for use between a ramp and a first surface and a second transition piece for use between a raised surface and a platform.

6. The method of claim 1, further comprising generating, and displaying via the GUI, additional feedback data if one of the plurality of components is incompatible with one of the other of the plurality of components in the run.

7. The method of claim 1, further comprising generating, and displaying via the GUI, additional feedback data regarding improper order of the plurality of components in the run.

8. The method of claim 1, further comprising generating, and displaying via the GUI, feedback data indicating a connection error between a component and a handrail.

9. The method of claim 1, further comprising automatically selecting at least one of legs and bracing for components of the accessibility system having a predefined height.

10. The method of claim 1, further comprising receiving, via the GUI, at least one entry selection and at least one exit selection for the run of the accessibility system and generating, and displaying via the GUI, feedback data indicating whether the at least one entry selection and the at least one exit selection can be used with the run.

11. The method of claim 1, further comprising generating, and displaying via the GUI, a list of part identifiers for the one or more components selected for the accessibility system.

12. The method of claim 1, further comprising generating an electronic document that graphically depicts the accessibility system, the electronic document used to facilitate a physical build of the accessibility system.

13. The method of claim 1, further comprising using an artificial intelligence platform trained to generate one or more outputs, the artificial intelligence platform configured to process inputs received from the one or more processors.

14. The method of claim 13, wherein the one or more inputs include at least one of a desired slope ratio of the accessibility system, a predefined footprint of the accessibility system, and a digital image of an area in which the accessibility system will be built.

15. The method of claim 14, wherein the one or more outputs include at least one of a recommended part, a combination of parts, and feedback data that may be used for building the graphical depiction of the accessibility system.

16. A method for implementing a graphical user interface (GUI) configured to facilitate building a graphical depiction of an accessibility system, the method performed by one or more processors configured to interact with non-transitory memory configured to perform operations of the method, the method comprising:

receiving, via the GUI, an input to build a run of an accessibility system;

receiving, via the GUI, a selection of a plurality of components of the accessibility system;

generating, and displaying via the GUI, feedback data indicating whether the selection of the plurality of components form a complete accessibility system;

receiving, via the GUI, a location placement selection of at least one component of the plurality of components relative to a location of at least one other component of the plurality of components; and displaying, via the GUI in response to the location placement selection, a first graphical icon on a first component of the plurality of components and a second graphical icon on a second component of the plurality of components, the first and second graphical icons overlapping and defining a visual indication of a propriety of a connection between the first and second components.

17. The method of claim 16, wherein the step of generating, and displaying via the GUI, feedback data indicating whether the selection of the plurality of components form a complete accessibility system includes at least one of generating, and displaying via the GUI, at least one of: a list of one or more components required to form a complete accessibility system, indicating if one of the plurality of components is incompatible with one of the other of the plurality of components, indicating improper order of the plurality of components in the run, and indicating whether the plurality of components create the run having a desired ratio.

18. A computing device having storage and one or more processors coupled to the storage configured to execute instructions that cause the computing device to implement a graphical user interface (GUI) configured to perform steps including:

receiving, via the GUI, an input to build a run of an accessibility system;

receiving, via the GUI, a selection of a plurality of components of the accessibility system;

receiving, via the GUI, a location placement selection of at least one component of the plurality of components relative to a location of at least one other component of the plurality of components; and displaying, via the GUI in response to the location placement selection, a first graphical icon on a first component of the plurality of components and a second graphical icon on a second component of the plurality of components, the first and second graphical icons overlapping and defining a visual indication of a propriety of a connection between the first and second components; and generating, and displaying via the GUI, feedback data indicating whether the selection of the plurality of components form a complete accessibility system, including at least one of:

generating a list of one or more components in addition to the plurality of components required to form a complete accessibility system;

indicating if one of the plurality of components is incompatible with one of the other of the plurality of components in the run;

indicating improper order of one or more components of the plurality of components in the run; and indicating whether the plurality of components create the run having a desired ratio.

\* \* \* \* \*